US010224487B2

(12) United States Patent
Choi et al.

(10) Patent No.: US 10,224,487 B2
(45) Date of Patent: *Mar. 5, 2019

(54) ORGANIC LIGHT-EMITTING DEVICE

(71) Applicant: SAMSUNG DISPLAY CO., LTD., Yongin, Gyeonggi-do (KR)

(72) Inventors: Jong-Won Choi, Yongin (KR); Yoon-Hyun Kwak, Yongin (KR); Bum-Woo Park, Yongin (KR); Sun-Young Lee, Yongin (KR); Wha-Il Choi, Yongin (KR); So-Yeon Kim, Yongin (KR); Ji-Youn Lee, Yongin (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 1084 days.

This patent is subject to a terminal disclaimer.

(21) Appl. No.: 14/273,530

(22) Filed: May 8, 2014

(65) Prior Publication Data

US 2015/0076459 A1 Mar. 19, 2015

(30) Foreign Application Priority Data

Sep. 17, 2013 (KR) ........................ 10-2013-0112061

(51) Int. Cl.
| | | |
|---|---|---|
| *H01L 51/54* | (2006.01) | |
| *H01L 51/00* | (2006.01) | |
| *H01L 51/50* | (2006.01) | |
| *C09K 11/06* | (2006.01) | |

(52) U.S. Cl.
CPC .......... *H01L 51/0067* (2013.01); *C09K 11/06* (2013.01); *H01L 51/0072* (2013.01); *H01L 51/0073* (2013.01); *H01L 51/0074* (2013.01); *H01L 51/0087* (2013.01); *H01L 51/50* (2013.01); *C09K 2211/185* (2013.01); *H01L 51/5016* (2013.01)

(58) Field of Classification Search
None
See application file for complete search history.

(56) References Cited

U.S. PATENT DOCUMENTS

| | | | |
|---|---|---|---|
| 5,635,308 A | 6/1997 | Inoue et al. | |
| 5,645,948 A | 7/1997 | Shi et al. | |
| 5,972,247 A | 10/1999 | Shi et al. | |
| 6,465,115 B2 | 10/2002 | Shi et al. | |
| 6,596,415 B2 | 7/2003 | Shi et al. | |
| 7,329,898 B2 | 2/2008 | Igarashi | |
| 7,915,414 B2 | 3/2011 | Chi et al. | |
| 8,999,528 B2 * | 4/2015 | Kim et al. | H01L 51/0072 257/40 |
| 9,118,021 B2 * | 8/2015 | Lee et al. | H05B 33/14 |
| 2001/0019782 A1 | 9/2001 | Igarashi et al. | |
| 2002/0134984 A1 * | 9/2002 | Igarashi | C09K 11/06 257/79 |
| 2005/0221124 A1 | 10/2005 | Hwang et al. | |
| 2008/0001530 A1 * | 1/2008 | Ise et al. | C09K 11/06 313/504 |
| 2009/0171087 A1 | 7/2009 | Chi et al. | |
| 2011/0210318 A1 | 9/2011 | Bae et al. | |
| 2014/0034913 A1 * | 2/2014 | Kim et al. | H01L 51/0072 257/40 |
| 2014/0103300 A1 * | 4/2014 | Lee et al. | H05B 33/14 257/40 |

FOREIGN PATENT DOCUMENTS

| | | |
|---|---|---|
| JP | 8-12600 A | 1/1996 |
| JP | 2000-003782 | 1/2000 |
| KR | 10-0573137 B1 | 4/2006 |
| KR | 10-2010-0023783 A | 3/2010 |
| KR | 10-2010-0064712 A | 6/2010 |
| KR | 10-2010-0108924 A | 10/2010 |
| KR | 10-2011-0127784 A | 11/2011 |
| KR | 10-2012-0104067 A * | 9/2012 |

(Continued)

OTHER PUBLICATIONS

Partial machine translation of KR 10-2012-0104067 A (Sep. 2012).*

(Continued)

*Primary Examiner* — Marie R. Yamnitzky
(74) *Attorney, Agent, or Firm* — Lewis Roca Rothgerber Christie LLP

(57) ABSTRACT

An organic light-emitting device includes an emission layer including a dopant comprising a first compound represented by Formula 1 and a host comprising a second compound represented by Formula 100

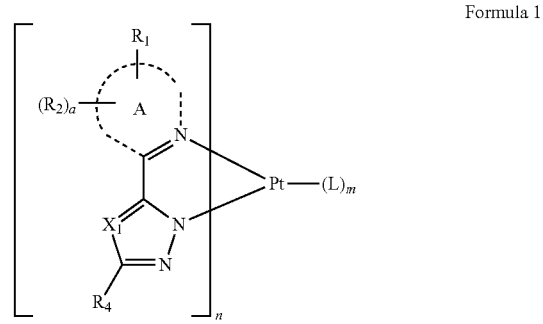

Formula 1

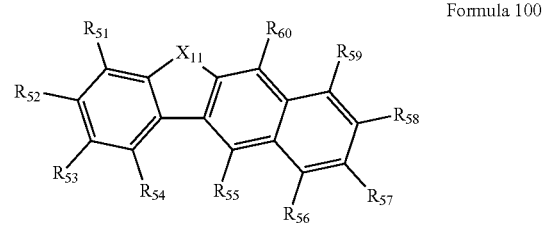

Formula 100 wherein in Formulae 1 and 100, $X_1$, $X_{11}$, $R_1$, $R_2$, $R_4$, $R_{51}$ to $R_{60}$, L, a, n and m are the same as defined in the present application.

13 Claims, 1 Drawing Sheet

(56) References Cited

FOREIGN PATENT DOCUMENTS

| KR | 10-2012-0116879 | 10/2012 |
|----|----|----|
| KR | 10-2012-0116881 | 10/2012 |
| WO | WO 2010/064871 A1 | 6/2010 |
| WO | WO 2010/114264 A2 | 10/2010 |
| WO | WO 2011/145876 A2 | 11/2011 |

OTHER PUBLICATIONS

Adachi, Chihaya et al., High-efficiency organic electrophosphorescent devices with tris(2-phenylpyridine)iridium doped into electron-transporting materials, Appl. Phys. Lett., Aug. 7, 2000, 4 pages, vol. 77, No. 6, 2000 American Institute of Physics, pp. 904-906.

Baldo, M.A. et al., Highly efficient phosphorescent emission from organic electroluminescent devices, Nature, Sep. 10, 1998, 4 pages, vol. 395, Macmillan Publishers Ltd. 1998, 151-154.

Baldo, M.A. et al., Very high-efficiency green organic light-emitting devices based on electrophosphorescence, Appl. Phys. Lett., Jul. 5, 1999, 4 pages, vol. 75, No. 1, 1999 American Institute of Physics, pp. 4-6.

Chi, Yun et al., Light Emitting Materials for Organic Electronics, Mar. 26, 2008, 6 pages, vol. 21, No. 3, Journal of Photopolymer Science and Technology, pp. 357-362.

Hsieh, Hsi-Ying et al., Platinum(II) complexes with spatially encumbered chelates; syntheses, structure and photophysics, Inorganica Chimica Acta, 2009, 6 pages, 2009 Elsevier B.V., 4734-4739.

Kwong, Raymond C. et al., High operational stability of electrophosphorescent devices, Appl. Phys. Lett; Jul. 1, 2002, vol. 81, No. 1, 4 pages, 2002 American Institute of Physics, 162-164.

Lamansky, Sergey et al., Synthesis and Characterization of Phosphorescent Cyclometalated Iridium Complexes, Inorg. Chem., Mar. 1, 2001, vol. 40, No. 7, 8 pages, 2001 American Chemical Society, pp. 1704-1711.

Lamansky, Sergey et al., Highly Phosphorescent Bis-Cyclometalated Iridium Complexes: Synthesis, Photophysical Characterization, and Use in Organic Light Emitting Diodes, J. Am. Chem. Soc., Apr. 13, 2001, vol. 123, No. 18, 9 pages, 2001 American Chemical Society, pp. 4304-4312.

U.S. Office Action dated Feb. 26, 2016, issued in U.S. Appl. No. 14/027,178 (12 pages).

U.S. Final Office Action dated Jun. 1, 2017, issued in U.S. Appl. No. 14/027,178 (10 pages).

* cited by examiner

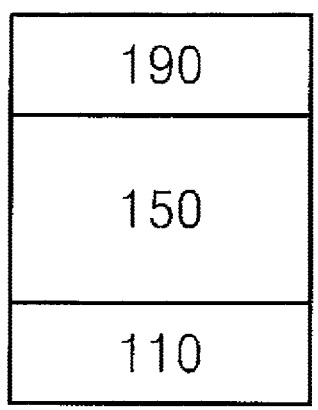

ORGANIC LIGHT-EMITTING DEVICE

CROSS REFERENCE TO RELATED APPLICATION

This application claims priority to and the benefit of Korean Patent Application No. 10-2013-0112061, filed on Sep. 17, 2013, in the Korean Intellectual Property Office, the disclosure of which is incorporated herein in its entirety by reference.

BACKGROUND

1. Field

One or more embodiments of the present invention relate to an organic light-emitting device.

2. Description of the Related Art

Organic light-emitting devices (OLEDs) are self-emitting devices that have advantages such as wide viewing angles, excellent contrast, quick response, high brightness, low driving voltage characteristics, and can provide full color images.

The organic light-emitting device may include a first electrode disposed on a substrate, and a hole transport region, an emission layer, an electron transport region, and a second electrode, which are sequentially disposed on the first electrode. Electron holes provided from the first electrode may move toward the emission layer through the hole transport region, and electrons provided from the second electrode may move toward the emission layer through the electron transport region. Carriers, such as holes and electrons, are recombined in the emission layer to produce excitons. These excitons change from an excited state to a ground state, thereby generating light.

SUMMARY

One or more aspects of embodiments of the present invention provide an organic light-emitting device.

According to an aspect of the present invention, an organic light-emitting device includes: a substrate; a first electrode; a second electrode facing the first electrode; and an organic layer disposed between the first electrode and the second electrode and including an emission layer, wherein the emission layer includes a dopant and a host, wherein the dopant includes a first compound represented by Formula 1 below, and the host includes a second compound represented by Formula 100:

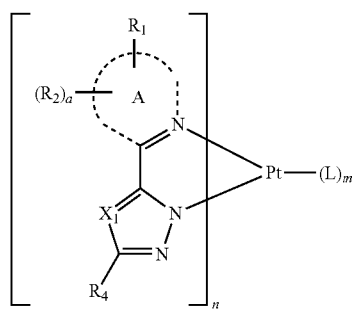

Formula 1

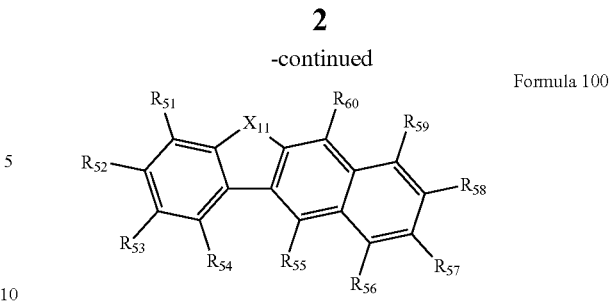

Formula 100 wherein in Formula 1, ring A may be a 6-membered ring containing at least one N, a 6-membered ring to which at least one 5-membered ring is condensed and which contains at least one N, or a 6-membered ring to which at least one 6-membered ring is condensed and which contains at least one N;

$X_1$ is N or $C(R_3)$;

$R_1$ to $R_4$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic hetero-condensed polycyclic group, —$N(Q_1)(Q_2)$, —$Si(Q_3)(Q_4)(Q_6)$, or —$C(=O)(Q_6)$ (herein $Q_1$ to $Q_6$ are each independently selected from a hydrogen, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group or a substituted or unsubstituted monovalent non-aromatic hetero-condensed polycyclic group), or a site that links to a neighboring ligand through a single bond or a divalent linking group, and $R_3$ and $R_4$ optionally bond to each other to form a substituted or unsubstituted $C_3$-$C_{60}$ cyclic moiety, or a substituted or unsubstituted $C_2$-$C_{60}$ heterocyclic moiety;

a is an integer of 0 to 10, and when a is 2 or more, a plurality of $R_2$ may be identical or different;

n is 1 or 2; and when n is 2, two

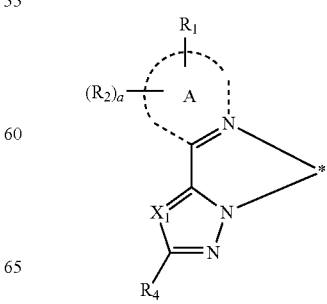

may be identical or different;

L is an organic ligand;

m is an integer of 0 to 2; and wherein in Formula 100, $X_{11}$ may be O or S;

i) $R_{56}$ and $R_{57}$ bond to each other to form a substituted or unsubstituted $C_3$-$C_{60}$ cyclic moiety, or a substituted or unsubstituted $C_2$-$C_{60}$ heterocyclic moiety, $R_{51}$ to $R_{55}$ and $R_{58}$ to $R_{60}$ are each independently a substituent represented by —$(Ar_{51})_q$—$(Ar_{61})$; or ii) $R_{58}$ and $R_{59}$ bond to each other to form a substituted or unsubstituted $C_3$-$C_{60}$ cyclic moiety or a substituted or unsubstituted $C_2$-$C_{60}$ heterocyclic moiety, and $R_{51}$ to $R_{57}$ and $R_{60}$ are each independently a substituent represented by —$(Ar_{51})_q$—$(Ar_{61})$;

$A_{51}$ is selected from a substituted or unsubstituted $C_3$-$C_{10}$ cycloalkylene group, a substituted or unsubstituted $C_3$-$C_{10}$ heterocycloalkylene group, a substituted or unsubstituted $C_3$-$C_{10}$ cycloalkenylene group, a substituted or unsubstituted $C_3$-$C_{10}$ heterocycloalkenylene group, a substituted or unsubstituted $C_6$-$C_{60}$ arylene group, a substituted or unsubstituted $C_2$-$C_{60}$ heteroarylene group, a substituted or unsubstituted divalent non-aromatic condensed polycyclic group, or a substituted or unsubstituted divalent non-aromatic hetero-condensed polycyclic group;

$A_{61}$ is selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic hetero-condensed polycyclic group, —$N(Q_{41})(Q_{42})$, —$Si(Q_{43})(Q_{44})(Q_{45})$, or —$B(Q_{46})(Q_{47})$;

q is an integer from 0 to 5;

at least one substituent of the substituted $C_3$-$C_{10}$ cycloalkylene group, the substituted $C_3$-$C_{10}$ heterocycloalkylene group, the substituted $C_3$-$C_{10}$ cycloalkenylene group, the substituted $C_3$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_3$-$C_{10}$ heterocycloalkyl group, the substituted $C_3$-$C_{10}$ cycloalkenyl group, the substituted $C_3$-$C_{10}$ heterocycloalkenyl group, the substituted $C_6$-$C_{60}$ aryl group, the substituted $C_6$-$C_{60}$ aryloxy, the substituted $C_6$-$C_{60}$ arylthio group, the substituted $C_2$-$C_{60}$ heteroaryl group, the substituted monovalent non-aromatic condensed polycyclic group, the substituted monovalent non-aromatic hetero-condensed polycyclic group, the substituted $C_3$-$C_{60}$ cyclic moiety, or the substituted $C_2$-$C_{60}$ heterocyclic moiety may be selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy, a $C_6$-$C_{60}$ arylthio, a $C_2$-$C_{60}$ heteroaryl group, a monovalent non-aromatic condensed polycyclic group, a monovalent non-aromatic hetero-condensed polycyclic group, —$N(Q_{11})(Q_{12})$, —$Si(Q_{13})(Q_{14})(Q_{15})$, or —$B(Q_{16})(Q_{17})$;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —$N(Q_{21})(Q_{22})$, —$Si(Q_{23})(Q_{24})(Q_{25})$, or —$B(Q_{26})(Q_{27})$; or —$N(Q_{31})(Q_{32})$, —$Si(Q_{33})(Q_{34})(Q_{35})$, or —$B(Q_{36})(Q_{37})$; and $Q_{11}$ to $Q_{17}$, $Q_{21}$ to $Q_{27}$, $Q_{31}$ to $Q_{37}$, and $Q_{41}$ to $Q_{47}$ are each independently selected from a hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent non-aromatic condensed polycyclic group, or a monovalent non-aromatic hetero-condensed polycyclic group

BRIEF DESCRIPTION OF THE DRAWINGS

These and/or other aspects will become apparent and more readily appreciated from the following description of the embodiments, taken in conjunction with the drawing which is a schematic view of an organic light-emitting device according to an embodiment of the present invention.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list. Further, the use of "may" when describing embodiments of the present invention refers to "one or more embodiments of the present invention." The drawing is a schematic view of an organic light-emitting device 10 according to an embodiment of the present invention. Hereinafter, the structure of an organic light-emitting device according to an embodiment of the present invention and a method of manufacturing an organic light-emitting device according to an embodiment of the present invention will be described in connection with the drawing.

In the drawing, a substrate may be additionally disposed under the first electrode 110 or above the second electrode 190. The substrate may be a glass substrate or transparent plastic substrate, each with excellent mechanical strength, thermal stability, transparency, surface smoothness, ease of handling, and water repellency.

The first electrode 110 may be formed by depositing or sputtering a material for forming the first electrode on the substrate. When the first electrode 110 is an anode, the material for the first electrode 110 may be selected from materials with a high work function to make holes be easily injected. The first electrode 110 may be a reflective electrode or a transmissive electrode. The material for the first electrode 120 may be a transparent and highly conductive material, and non-limiting examples of such material are indium tin oxide (ITO), indium zinc oxide (IZO), tin oxide ($SnO_2$), and zinc oxide (ZnO). When the first electrode 110 is a semi-transmissive electrode or a reflective electrode, at least one of magnesium (Mg), aluminum (Al), aluminum-lithium (Al—Li), calcium (Ca), magnesium-indium (Mg—In), magnesium-silver (Mg—Ag) may be used as a material for forming the first electrode.

The first electrode 110 may have a single-layer structure, or a multi-layer structure including two or more layers. For example, the first electrode 110 may have a three-layered structure of ITO/Ag/ITO, but the structure of the first electrode 110 is not limited thereto.

An organic layer 150 is disposed on the first electrode 110. The organic layer 150 may include an emission layer.

The organic layer 150 may further include a hole transport region disposed between the first electrode and the emission layer, and an electron transport region disposed between the emission layer and the second electrode.

The hole transport region may include at least one selected from a hole injection layer (HIL), a hole transport layer (HTL), a buffer layer, or an electron blocking layer (EBL), and the electron transport region may include at least one selected from a hole blocking layer (HBL), an electron transport layer (ETL), or an electron injection layer (EIL), but the hole transport region and the electron transport region are not limited thereto.

The hole transport region may have a single-layered structure formed of a single material, a single-layered structure formed of a plurality of different materials, or a multi-layered structure having a plurality of layers formed of a plurality of different materials.

In some embodiments, the hole transport region may have a single-layered structure formed of a plurality of different materials, or a multi-layered structure such as a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein layers of each structure are sequentially stacked on the first electrode 110 in this stated order, but are not limited thereto.

When the hole transport region includes a hole injection layer, the hole injection layer may be formed on the first electrode 110 by using various methods, such as vacuum deposition, spin coating casting, a Langmuir-Blodgett (LB) method, ink-jet printing, laser-printing, or laser-induced thermal imaging.

When the hole injection layer is formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec depending on a compound for the hole injection layer to be deposited, and the structure of the hole injection layer to be formed.

When the hole injection layer is formed by spin coating, the spin coating may be performed at a coating rate of about 2000 rpm to about 5000 rpm, and at a temperature of about 80° C. to 200° C. depending on a compound for the hole injection layer to be deposited, and the structure of the hole injection layer to be formed.

When the hole transport region includes a hole transport layer, the hole transport layer may be formed on the first electrode 110 or the hole injection layer by using various methods, such as vacuum deposition, spin coating, casting, a LB method, ink-jet printing, laser-printing, or laser-induced thermal imaging. When the hole transport layer is formed by vacuum deposition or spin coating, deposition and coating conditions for the hole transport layer may be determined by referring to the deposition and coating conditions for the hole injection layer, but are not limited thereto.

The hole transport region may include at least one selected from m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), (polyaniline)/poly(4-styrenesulfonate) (PANI/PSS), a compound represented by Formula 201 below, or a compound represented by Formula 202 below:

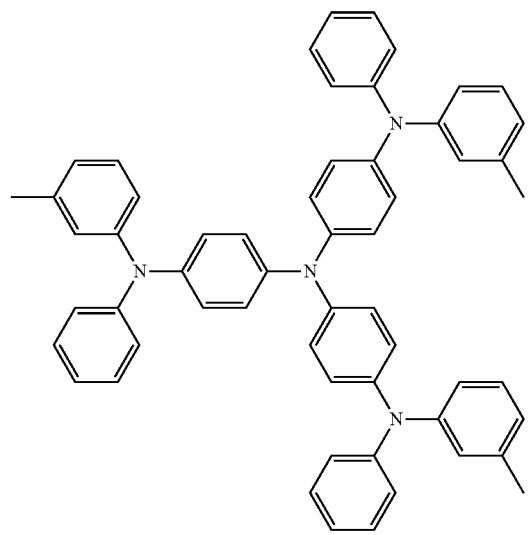

m-MTDATA

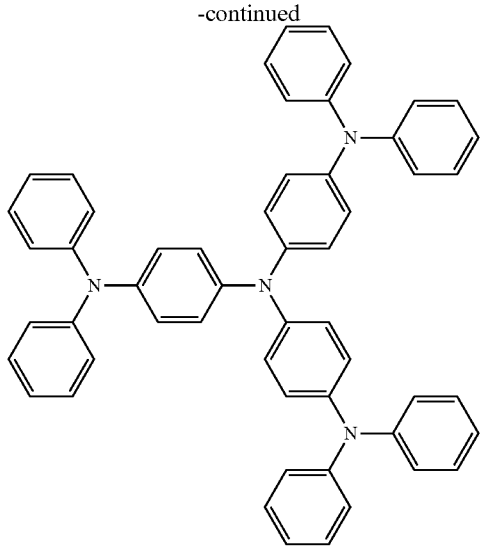
TDATA
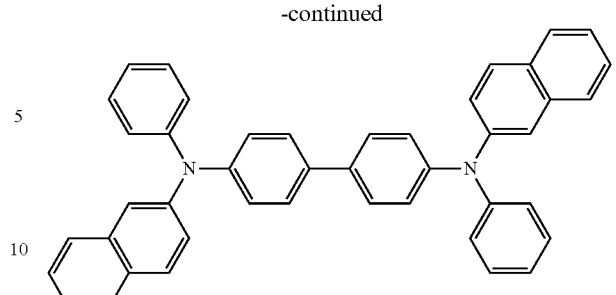
β-NPB
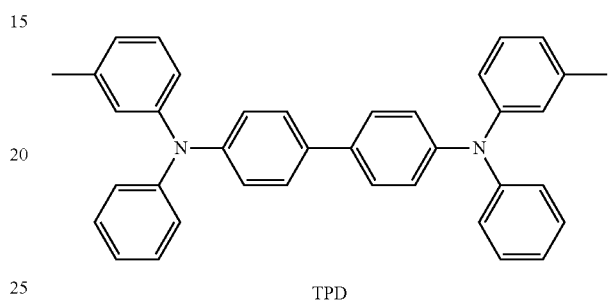
TPD
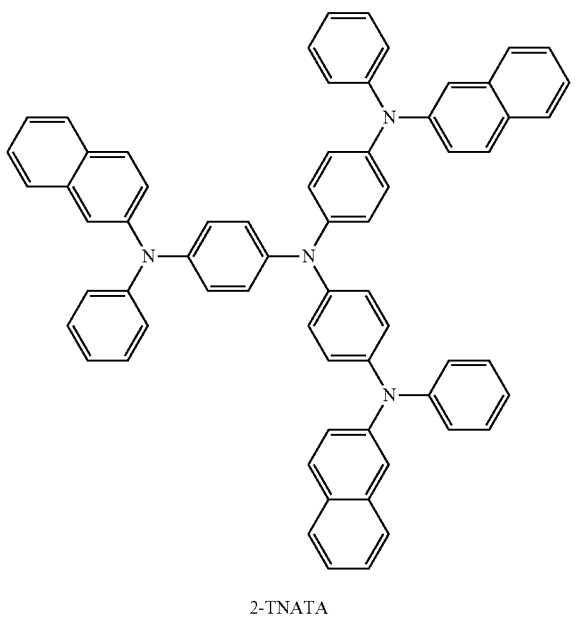
2-TNATA
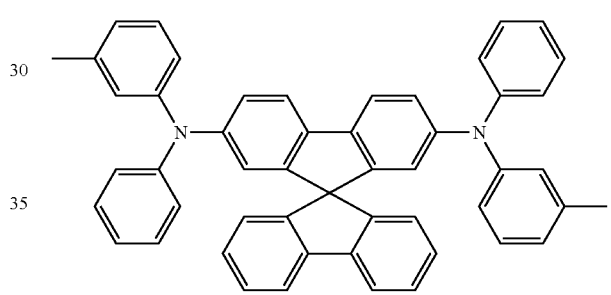
Spiro-TPD
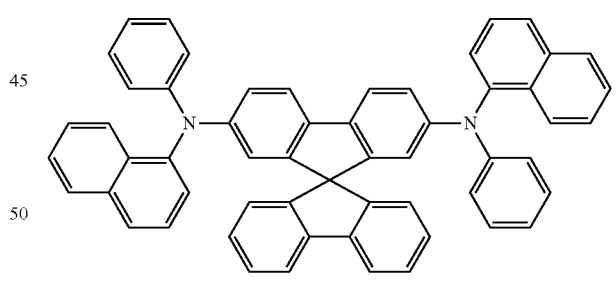
Spiro-NPB
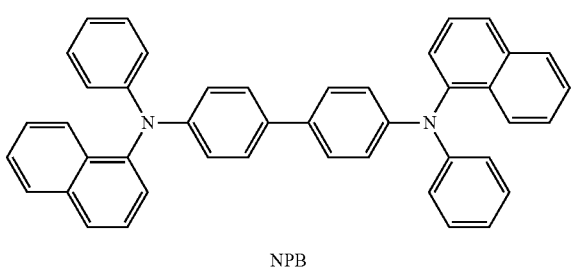
NPB
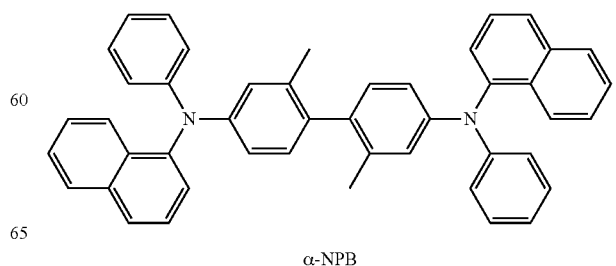
α-NPB -continued

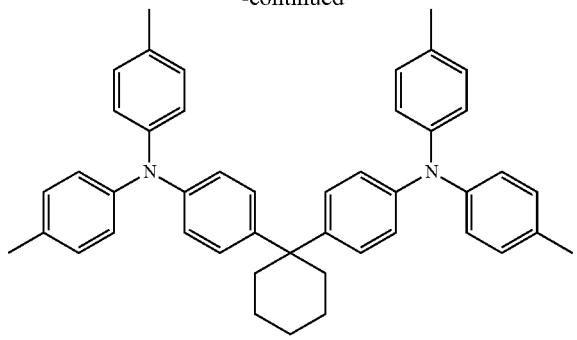

TAPC

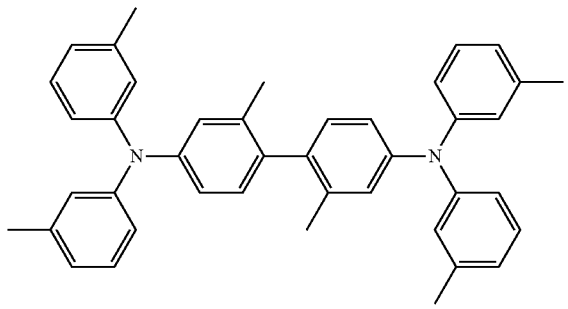

HMTPD

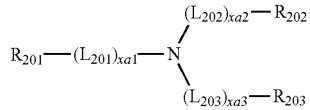

Formula 201

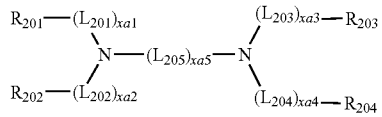

Formula 202 wherein in Formulae 201 and 202, $L_{201}$ to $L_{204}$ may be understood by referring to the description provided herein in connection with $Ar_{51}$;

xa1 to xa4 may be each independently selected from 0, 1, 2, or 3;

xa5 may be selected from 1, 2, 3, 4, or 5; and $R_{201}$ to $R_{204}$ may be understood by referring to the description provided herein in connection with $Ar_{61}$;

In Formulae 201 and 202, $L_{201}$ to $L_{205}$ may be each independently selected from a phenylene group, a naphthylene group, a fluorenylene group, a spiro-fluorenylene group, a benzofluoene group, a dibenzofluoene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, or a triazinylene; or a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, or a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_1$ alkyl group, a $C_1$-$C_1$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, or a triazinyl group;

xa1 to xa4 may be each independently 0, 1, or 2;

xa5 may be 1, 2, or 3;

$R_{201}$ to $R_{204}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, but embodiments of the invention are not limited thereto.

The compound represented by Formula 201 may be represented by Formula 201A:

Formula 201A

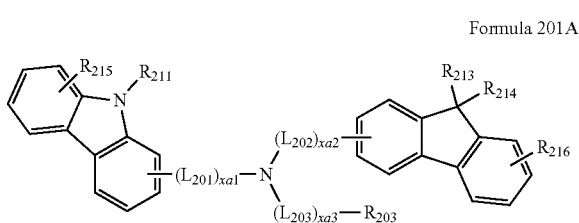

In some embodiments, the compound represented by Formula 201 may be represented by Formula 201A-1 below, but is not limited thereto:

Formula 201A-1

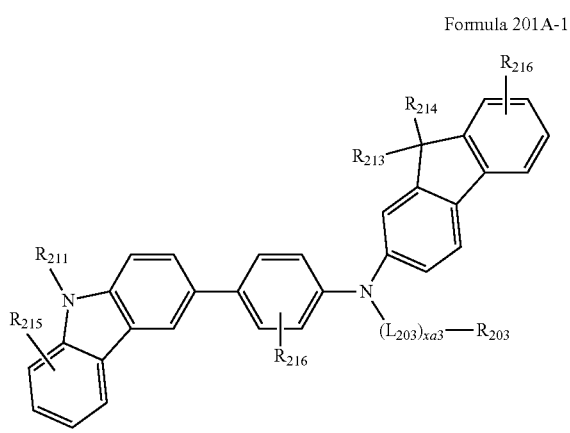

The compound represented by Formula 202 may be represented by Formula 202A below, but is not limited thereto:

Formula 202A

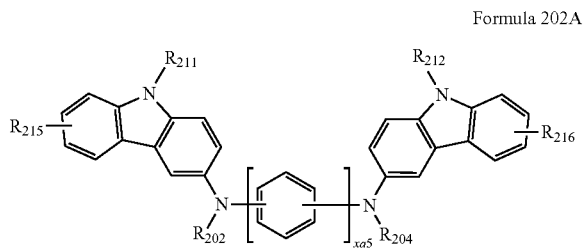

$L_{201}$ to $L_{203}$, xa1 to xa3, xa5, and $R_{202}$ to $R_{204}$ in Formulae 201A, 201A-1, and 202A are the same as described herein in connection with Formulae 201 and 202, $R_{211}$ can be understood by referring to the description provided in connection with $R_{203}$, and $R_{213}$ to $R_{216}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{50}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or a non-aromatic condensed polycyclic group.

In some embodiments, in Formulae 201A, 201A-1, and 202A, $L_{201}$ to $L_{203}$ may be each independently selected from a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, or a triazinylene group; or a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, or a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

xa1 to xa3 may be each independently 0 or 1;

$R_{203}$, $R_{211}$, and $R_{212}$ are each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

$R_{213}$ and $R_{214}$ may be each independently selected from a $C_1$-$C_{20}$ alkyl group or a $C_1$-$C_{20}$ alkoxy group;

a $C_1$-$C_{20}$ alkyl group or a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

$R_{215}$ and $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group or a $C_1$-$C_{20}$ alkoxy group;

a $C_1$-$C_{20}$ alkyl group or a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; and xa5 is 1 or 2.

$R_{213}$ and $R_{214}$ in Formulae 201A, and 201A-1 may bind to each other to form a saturated or unsaturated ring.

The compound represented by Formula 201, and the compound represented by Formula 202 may include compounds HT1 to HT20 illustrated below, but are not limited thereto.

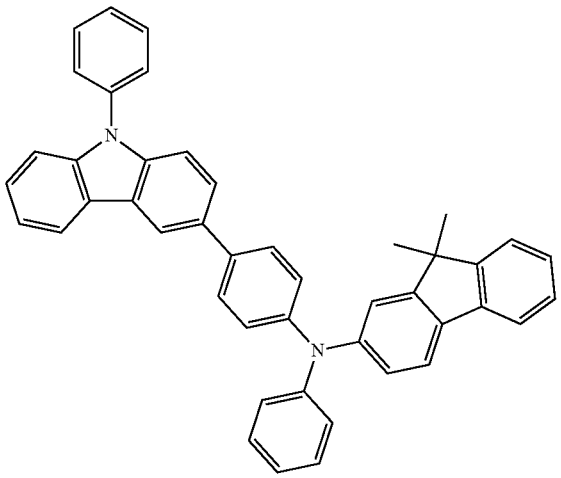

HT1

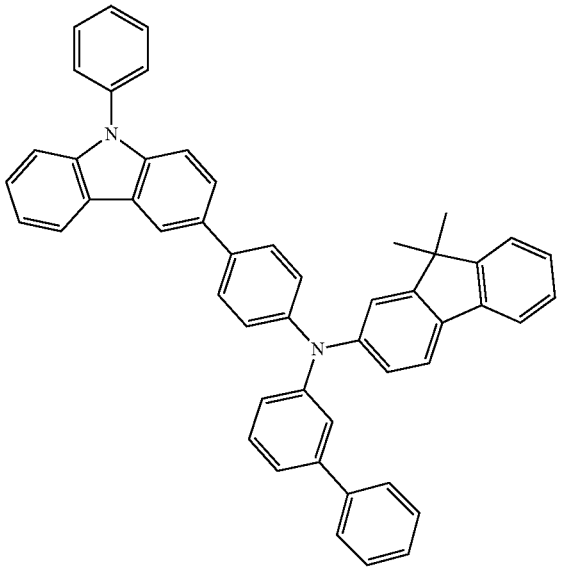

HT2

HT3
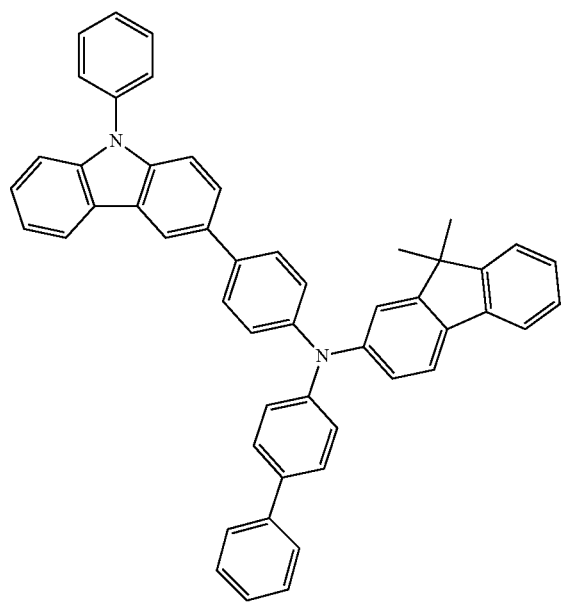
HT5
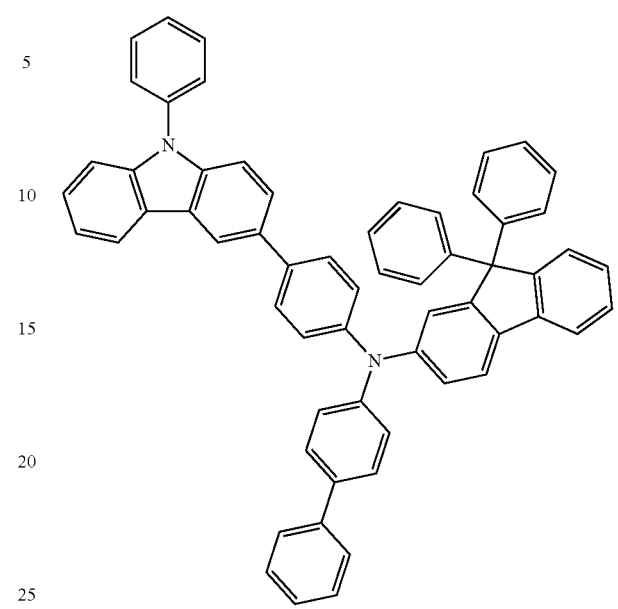
HT4
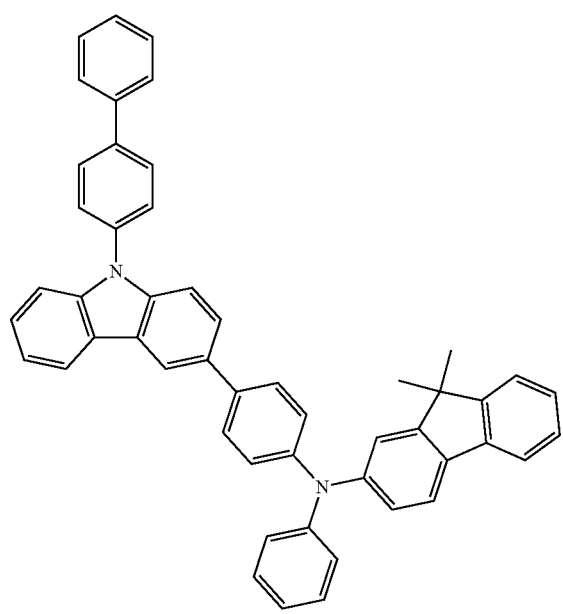
HT6
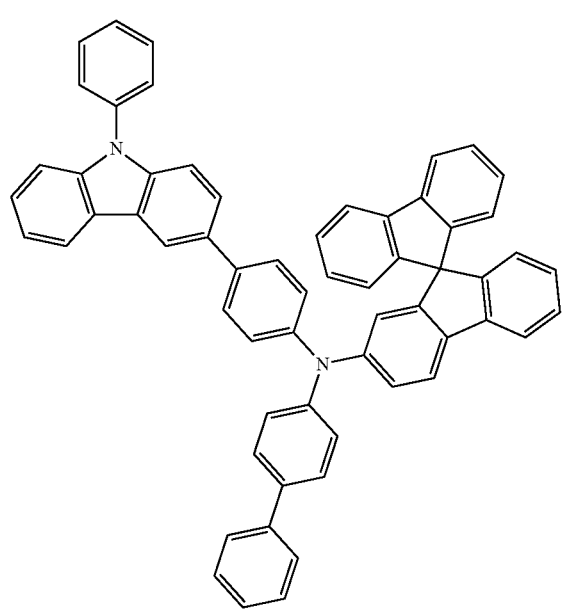

HT7
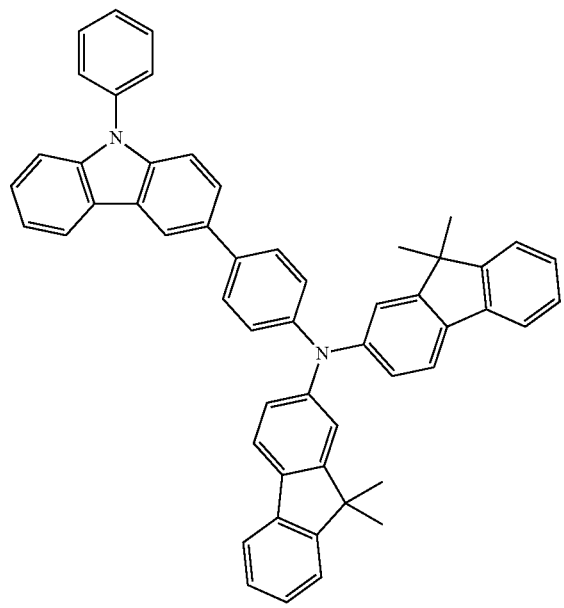
HT8
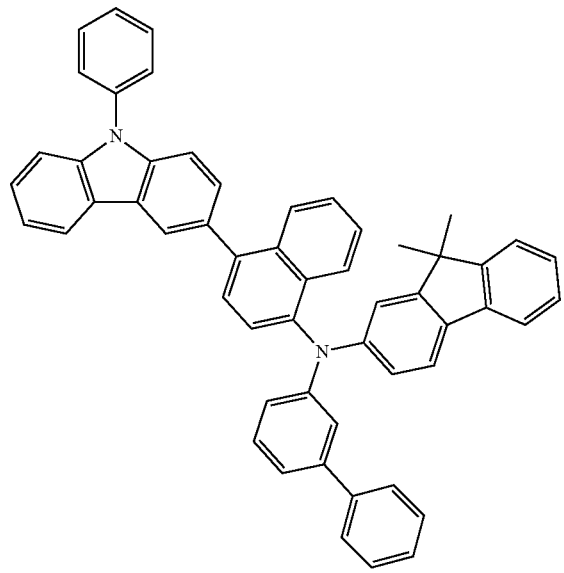
HT9
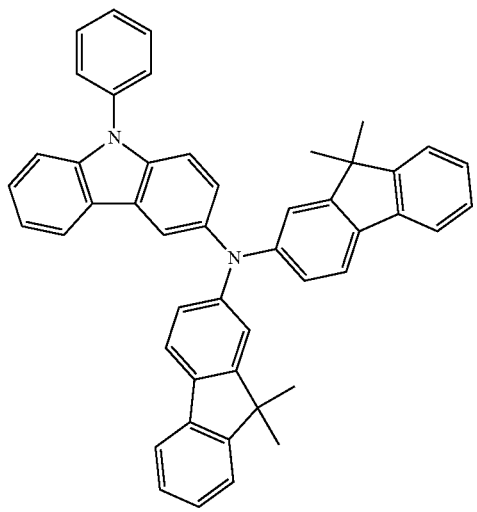
HT10
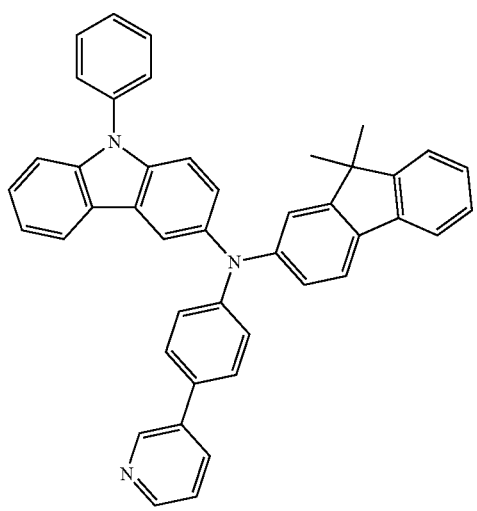
HT11
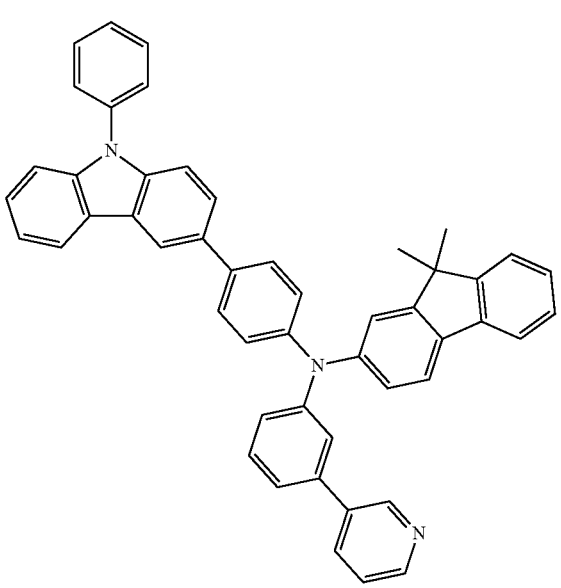

HT12
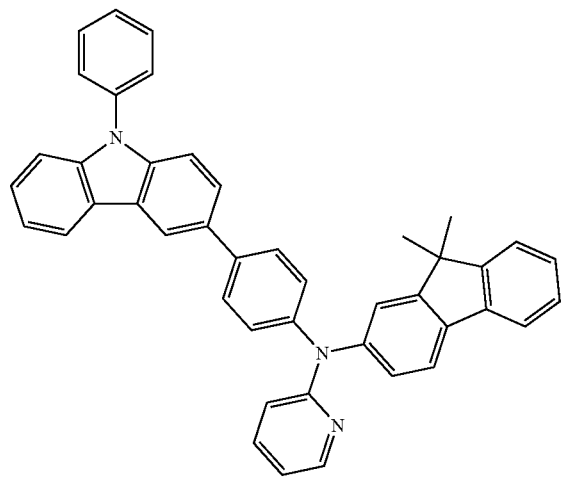
HT13
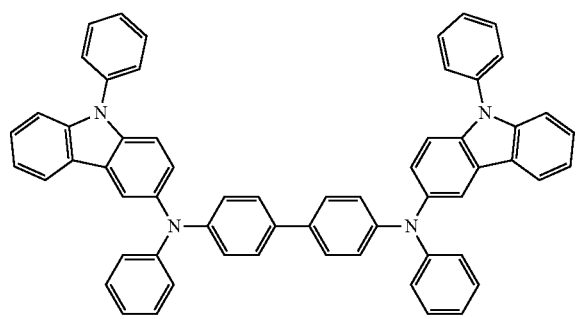
HT14
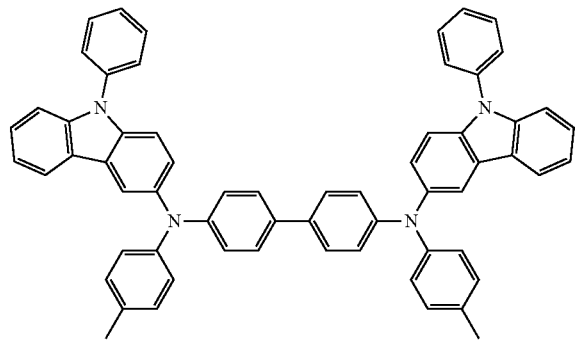
HT15
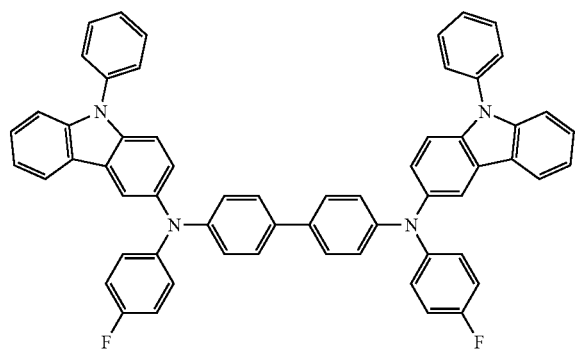
HT16
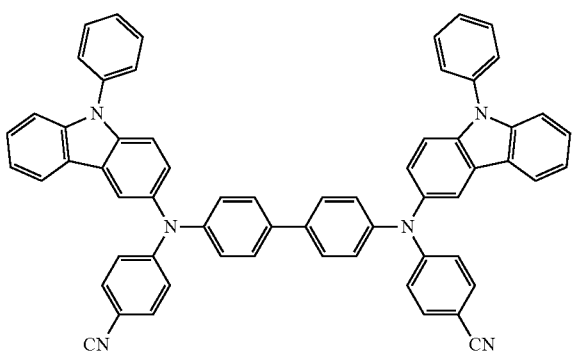
HT17
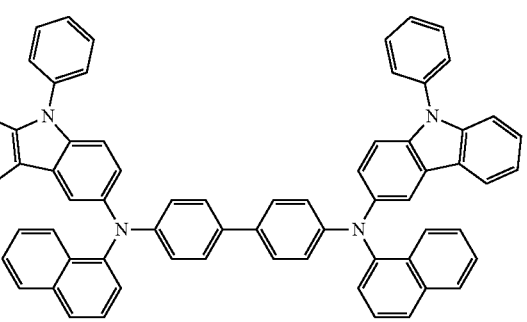
HT18
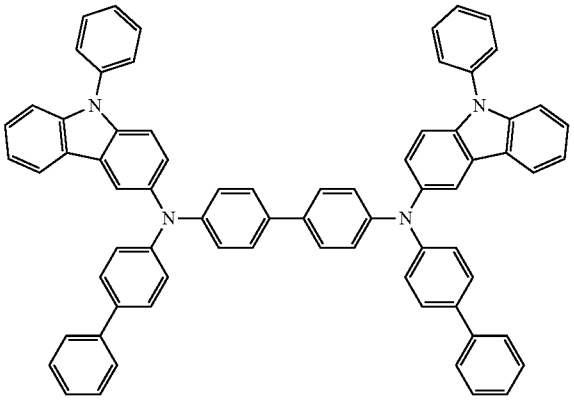
HT19
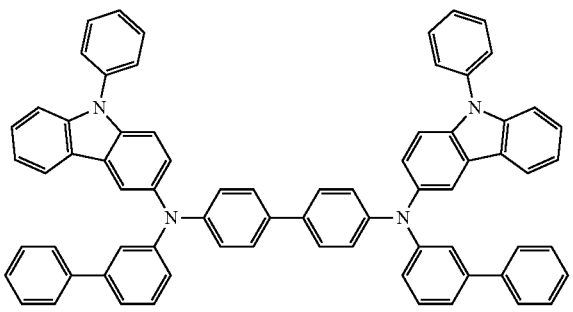

-continued

HT20

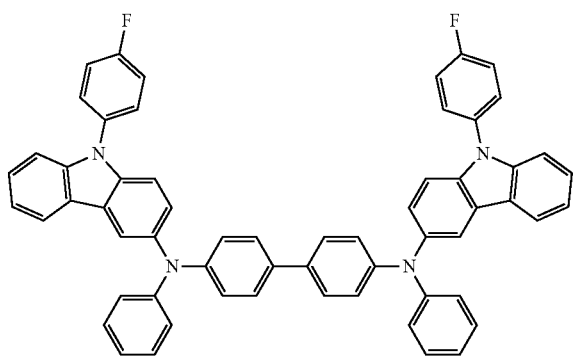

A thickness of the hole transport region may be in a range of about 100 Å to about 10,000 Å, and in some embodiments, of about 100 Å to about 1000 Å. When the hole transport region includes both a hole injection layer and a hole transport layer, a thickness of the hole injection layer may be in a range of about 100 Å to about 10000 Å, and in some embodiments, of about 100 Å to about 1000 Å, and a thickness of the hole transport layer may be in a range of about 50 Å to about 2000 Å, and in some embodiments, of about 100 Å to about 1500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one of a quinone derivative, a metal oxide, or a cyano group-containing compound, but is not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide, and Compound HT-D1 illustrated below, but are not limited thereto.

Compound HT-D1

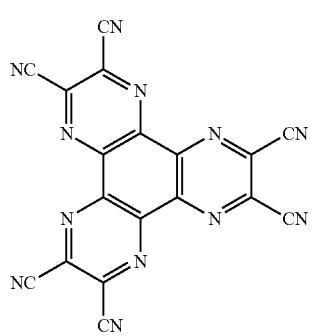

F4-TCNQ

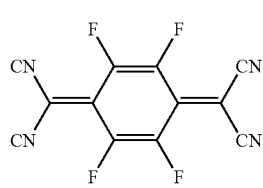

The hole transport region may further include, in addition to the hole injection layer and the hole transport layer, at least one of a buffer layer or an electron blocking layer. The buffer layer may compensate for an optical resonance distance according to a wavelength of light emitted from the emission layer, and light-emission efficiency of a formed organic light-emitting device may be improved. Any of the materials included in the hole transport region may be used as a material included in the buffer layer. The electron blocking layer prevents injection of electrons from the electron transport region.

An emission layer is formed on the first electrode 110 or the hole transport region by using various methods, such as vacuum deposition, spin coating, casting, a LB method, ink-jet printing, laser-printing, or laser-induced thermal imaging. When the emission layer is formed by vacuum deposition or spin coating, deposition and coating conditions for the emission layer may be determined by referring to the deposition and coating conditions for the hole injection layer.

When the organic light-emitting device 10 is a full color organic light-emitting device, the emission layer may be patterned into a red emission layer, a green emission layer, and a blue emission layer, according to a sub pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light.

The emission layer may include a host and a dopant.

The dopant may include a first compound represented by Formula 1 below:

Formula 1

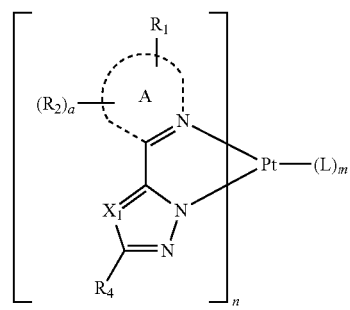

Ring A in Formula 1 may be a 6-membered ring containing at least one N, a 6-membered ring to which at least one 5-membered ring is condensed and which contains at least one N, or a 6-membered ring to which at least one 6-membered ring is condensed and which contains at least one N. The ring A may include, as a substituent, $R_1$ and/or $R_2$, which are identifiable in Formula 1, and these substituents will be described in detail later.

Ring A in Formula 1 may be a pyridine group, a pyrazine group, a pyrimidine group, a pyridazine group, a purine group, an isoquinoline group, a quinoline group, a phthalazine group, a 1,8-naphthyridine group, a quinoxalaine group, a quinazoline group, a cinnoline group, a phenanthridine group, a 1,7-phenanthrioline group, or a pyrrolopyrimidine group, but is not limited thereto.

For example, the ring A may be a pyridine group, a pyrimidine group, an isoquinoline or a quinazoline group, but is not limited thereto.

In Formula 1, $X_1$ may be N or $C(R_3)$, and $R_1$ to $R_4$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic hetero-condensed polycyclic group, —$N(Q_1)(Q_2)$, —$Si(Q_3)(Q_4)(Q_5)$, or —$C(=O)(Q_6)$ (herein $Q_1$ to $Q_6$ are each independently selected from a hydrogen, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group or a substituted or unsubstituted monovalent non-aromatic hetero-condensed polycyclic group), or a site that links to a neighboring ligand via a single bond or a divalent linking group, and $R_3$ and $R_4$ optionally bond to each other to form a substituted or unsubstituted $C_3$-$C_{60}$ cyclic moiety, or a substituted or unsubstituted $C_2$-$C_{60}$ heterocyclic moiety.

$R_1$ may be a substituted or unsubstituted linear or branched $C_2$-$C_{60}$ alkyl group. For example, $R_1$ may be a substituted or unsubstituted linear or branched $C_2$-$C_{10}$ alkyl group.

According to an embodiment of the present invention, $R_1$ may be selected from an ethyl group, an n-propyl group, an i-propyl group, an n-butyl group, an i-butyl group, a t-butyl group, a pentyl group, a hexyl group, a heptyl group, an octyl group, a nonyl group, or a decyl group; or an ethyl group, an n-propyl group, an i-propyl group, an n-butyl group, an i-butyl group, a t-butyl group, a pentyl group, a hexyl group, a heptyl group, an octyl group, a nonyl group, or a decyl group, each substituted with at least one selected from a deuterium, —F, a hydroxyl group, a cyano group, a nitro group, or an amino group, but is not limited thereto.

In Formula 1, a indicates the number of $R_2$ and may be an integer of 0 to 10. When a is 0, the ring A in Formula 1 may not have $R_2$. When a is 2 or more, a plurality of $R_2$ may be identical or different.

In some embodiments, a in Formula 1 may be an integer selected from 1 to 10, and at least one of a plurality of $R_2$ may be a substituted or unsubstituted linear or branched $C_1$-$C_{60}$ alkyl group. For example, a in Formula 1 may be an integer of 1 to 10, and at least one of a plurality of $R_2$ may be one selected from a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group, each substituted with at least one selected from a deuterium, —F, a hydroxyl group, a cyano group, a nitro group or an amino group, but is not limited thereto.

According to an embodiment of the present invention, in Formula 1, $X_1$ is $C(R_3)$, and $R_1$ to $R_4$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group, each substituted with at least one selected from a deuterium, —F, a hydroxyl group, a cyano group, a nitro group, or an amino group; and $R_3$ and $R_4$ may optionally bond to each other to form a substituted or unsubstituted $C_3$-$C_{60}$ cyclic moiety or a substituted or unsubstituted $C_2$-$C_{60}$ heterocyclic moiety.

In some embodiments, $R_3$ and $R_4$ may optionally bond to each other to form one selected from a cyclopropane, a cyclobutane, a cyclopentane, a cyclohexane, a cycloheptane, a cyclooctane, a cyclopentene, a cyclopentadiene, a cyclohexadiene, a cycloheptadiene, a bicyclo-heptane, a bicyclo-octane, a benzene, a pentalene, an indene, a naphtalene, an azulene, a heptalene, an indacene, an acenaphthylene, a fluorene, a spiro-fluorene, phenalene, a phenanthrene, an anthracene, a fluoranthene, a triphenylene, a pyrene, or a chrysene; or a cyclopropane, a cyclobutane, a cyclopentane, a cyclohexane, a cycloheptane, a cyclooctane, a cyclopentene, a cyclopentadiene, a cyclohexadiene, a cycloheptadiene, a bicyclo-heptane, a bicyclo-octane, a benzene, a pentalene, an indene, a naphtalene, an azulene, a heptalene, an indacene, an acenaphthylene, a fluorene, a spiro-fluorene, phenalene, a phenanthrene, an anthracene, a fluoranthene, a triphenylene, a pyrene, or a chrysene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, or a $C_1$-$C_{60}$ alkyl group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —$N(Q_{31})(Q_{32})$, or —$Si(Q_{33})(Q_{34})(Q_{35})$ (wherein $Q_{31}$ to $Q_{35}$ are each independently selected from a hydrogen, a $C_1$-$C_{10}$ alkyl group, a $C_1$-$C_{10}$ alkoxy group, a $C_6$-$C_{20}$ aryl group, a $C_2$-$C_{20}$ heteroaryl group, a monovalent non-aromatic condensed polycyclic group or a monovalent non-aromatic hetero-condensed polycyclic group), but a compound formed by the bond of $R_3$ and $R_4$ is not limited thereto.

n in Formula 1 indicates the number of ligands represented by

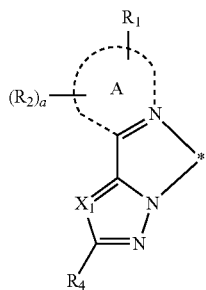

and may be 1 or 2. When n is 2, two

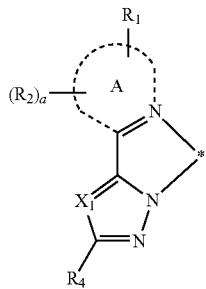

may be identical or different.

L may be an organic ligand, and may act as an auxiliary ligand with respect to a ligand represented by

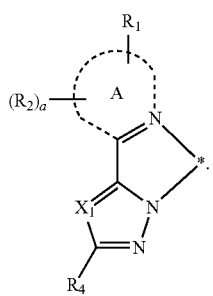

m indicates the number of L, and m may be an integer of 0 to 2.

L may include a ligand represented by one of Formulae 2A to 2F below:

Formula 2A

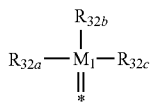

Formula 2B

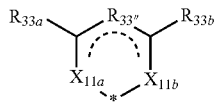

Formula 2C

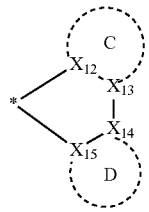

Formula 2D

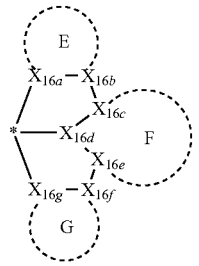

Formula 2E

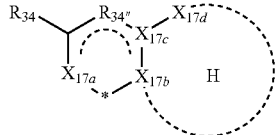

Formula 2F in Formulae 2A to 2F, $M_1$ may be P or As;

$X_{11a}$, $X_{11b}$, $X_{12}$, $X_{13}$, $X_{14}$, $X_{15}$, $X_{16a}$, $X_{16b}$, $X_{16c}$, $X_{16d}$, $X_{16e}$, $X_{16f}$, $X_{16g}$, $X_{17a}$, $X_{17b}$, $X_{17c}$, and $X_{17d}$ may be each independently selected from C, N, O, $N(R_{35})$, $P(R_{36})(R_{37})$, or $As(R_{38})(R_{39})$;

$R_{33''}$ and $R_{34''}$ are each independently selected from a single bond, a double bond (i.e. atoms adjacent to $R_{33''}$ and $R_{34''}$ in Formulae 2C and 2F respectively, may be connected to each other via a single or a double bond), a substituted or unsubstituted $C_1$-$C_5$ alkylene group, or a substituted or unsubstituted $C_2$-$C_5$ alkenylene group;

$R_{31}$, $R_{32a}$, $R_{32b}$, $R_{32c}$, $R_{33a}$, $R_{33b}$, $R_{34}$, $R_{35}$, $R_{36}$, $R_{37}$, $R_{38}$, and $R_{39}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_2$-$C_{60}$ heteroaryl group, a monovalent non-aromatic condensed polycyclic group, or a monovalent non-aromatic hetero-condensed polycyclic group; and ring C, ring D, ring E, ring F, ring G and ring H are each independently a 5-membered to 20-membered saturated ring or a 5-membered to 20-membered unsaturated ring; and * indicates a bonding site to Pt in Formula 1.

In some embodiments, $R_{31}$, $R_{32a}$, $R_{32b}$, $R_{32c}$, $R_{33a}$, $R_{33b}$, $R_{34}$, $R_{35}$, $R_{36}$, $R_{37}$, $R_{38}$, and $R_{39}$ in Formulae 2A to 2F are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one selected from a deuterium, —F, —Cl, —Br, —I, a hydroxyl group, a cyano group, a nitro group or an amino group;

a phenyl group, a naphthyl group, an anthracenyl group, a fluorenyl group, a carbazolyl group, a pyridinyl group, a pyrimidinyl group, or a triazinyl group; or a phenyl group, a naphthyl group, an anthracenyl group, a fluorenyl group, a carbazolyl group, a pyridinyl group, a pyrimidinyl group, or a triazinyl group, each substituted with at least one selected from a deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, or a triazinyl group.

According to an embodiment of the present invention, L includes a ligand represented by Formula 2B, and in Formula 2B, $M_1$ is P, and $R_{32a}$, $R_{32b}$ and $R_{32c}$ are each independently selected from a $C_1$-$C_{20}$ alkyl group; a $C_1$-$C_{20}$ alkyl group substituted with at least one selected from a deuterium, —F, —Cl, —Br, —I, a hydroxyl group, a cyano group, a nitro group or an amino group; a phenyl group, a naphthyl group, an anthracenyl group, a fluorenyl group, a carbazolyl group, a pyridinyl group, a pyrimidinyl group, or a triazinyl group; or a phenyl group, a naphthyl group, an anthracenyl group, a fluorenyl group, a carbazolyl group, a pyridinyl group, a pyrimidinyl group, or a triazinyl group, each substituted with at least one selected from a deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, or a triazinyl group.

In other embodiments, L includes a ligand represented by Formula 2C, and in Formula 2C, $X_{11a}$ and $X_{11b}$ may be $P(R_{36})(R_{37})$, $R_{33''}$ may be a double bond, a $C_1$-$C_5$ alkylene group or a $C_2$-$C_5$ alkenylene group, $R_{36}$ and $R_{37}$ are each independently selected from a $C_1$-$C_{20}$ alkyl group; a $C_1$-$C_{20}$ alkyl group substituted with at least one selected from a deuterium, —F, —Cl, —Br, —I, a hydroxyl group, a cyano group, a nitro group or an amino group; a phenyl group, a naphthyl group, an anthracenyl group, a fluorenyl group, a carbazolyl group, a pyridinyl group, a pyrimidinyl group, or a triazinyl group; or a phenyl group, a naphthyl group, an anthracenyl group, a fluorenyl group, a carbazolyl group, a pyridinyl group, a pyrimidinyl group, or a triazinyl group, each substituted with at least one selected from a deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, or a triazinyl group.

In other embodiments, in Formula 2C, $X_{11a}$ and $X_{11b}$ may be O, $R_{33''}$ may be a double bond, a $C_1$-$C_5$ alkylene group; a $C_2$-$C_5$ alkenylene group; a $C_1$-$C_5$ alkylene group substituted with at least one selected from a deuterium, —F, —Cl, —Br, —I, a hydroxyl group, a cyano group, a nitro group, an amino group, a $C_1$-$C_{10}$ alkyl group, or a $C_1$-$C_{10}$ alkoxy group; or a $C_2$-$C_5$ alkenylene group substituted with at least one selected from a deuterium, —F, —Cl, —Br, —I, a hydroxyl group, a cyano group, a nitro group, an amino group, a $C_1$-$C_{10}$ alkyl group, or a $C_1$-$C_{10}$ alkoxy group, but is not limited thereto.

In Formula 1, n may be 1 or 2 and m may be 0, 1, or 2, but is not limited thereto. In some embodiments, in Formula 1, n is 2 and m is 0, or n is 1 and m is 1.

The organometallic compound of Formula 1 may be represented by Formula 1(1) below:

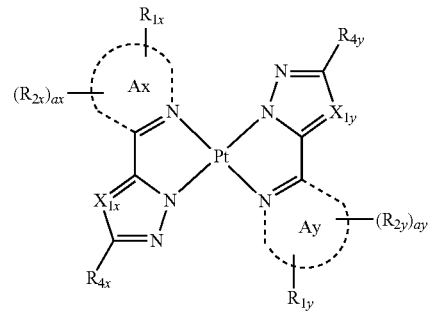

Formula 1(1)

ring Ax and ring Ay in Formula 1(1) may be understood by referring to the description provided in connection with the ring A.

In Formula 1(1), $X_{1x}$ may be N or $C(R_{3x})$, and $X_{1y}$ may be N or $C(R_{3y})$.

$R_{1x}$ to $R_{4x}$ and $R_{1y}$ to $R_{4y}$ in Formula 1(1) may be understood by referring to the description provided in connection with $R_2$ of Formula 1.

In some embodiments, $R_{1x}$ and $R_{1y}$ in Formula 1(1) may be each independently selected from a substituted or unsubstituted linear or branched $C_2$-$C_{60}$ alkyl group. For example, $R_{1x}$ and $R_{1y}$ in Formula 1(1) may be each independently selected from an ethyl group, an n-propyl group, an i-propyl group, an n-butyl group, an i-butyl group, a t-butyl group, a pentyl group, a hexyl group, a heptyl group, an octyl group, a nonyl group, or a decyl group; or an ethyl group, an n-propyl group, an i-propyl group, an n-butyl group, an i-butyl group, a t-butyl group, a pentyl group, a hexyl group, a heptyl group, an octyl group, a nonyl group, or a decyl group, each substituted with at least one selected from a deuterium, —F, a hydroxyl group, a cyano group, a nitro group, or an amino group.

In some embodiments, $a_x$ and $a_y$ in Formula 1(1) may be each independently an integer of 1 to 10, at least one of a plurality of $R_{2x}$ may be a substituted or unsubstituted linear or branched $C_1$-$C_{60}$ alkyl group, and at least one of a plurality of $R_{2y}$ may be a substituted or unsubstituted linear or branched $C_1$-$C_{60}$ alkyl group.

$a_x$ and $a_y$ in Formula 1(1) may be each independently an integer of 0 to 10. $a_x$ and $a_y$ may be understood by referring to the description provided in connection with a of Formula 1.

The organometallic compound represented by Formula 1 may be represented by one of Formulae 1A to 1R below, but is not limited thereto:
Formula 1A
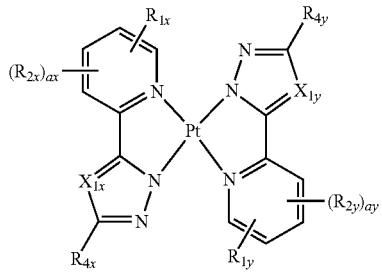
Formula 1B
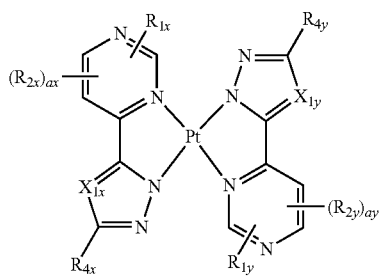
Formula 1C
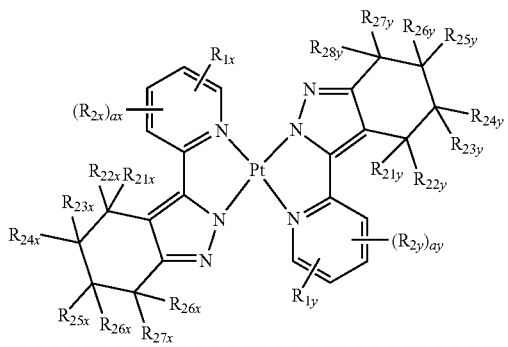
Formula 1D
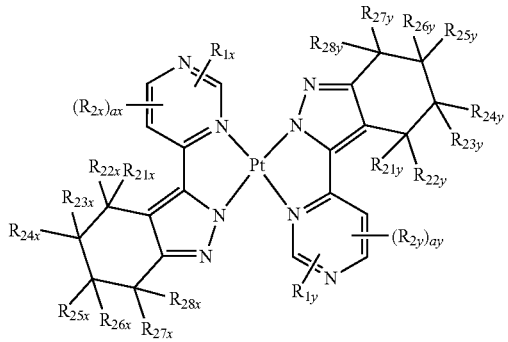
Formula 1E
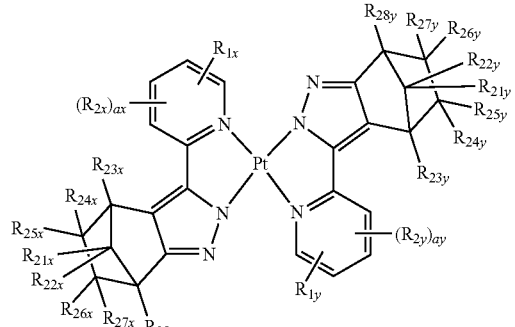
Formula 1F
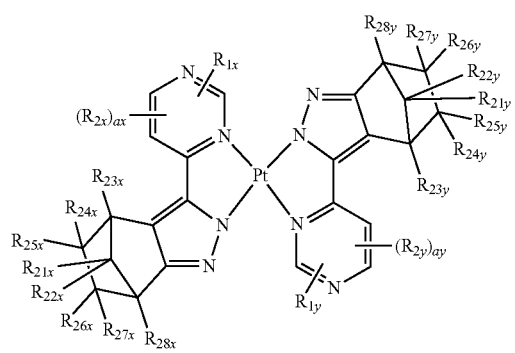
Formula 1G
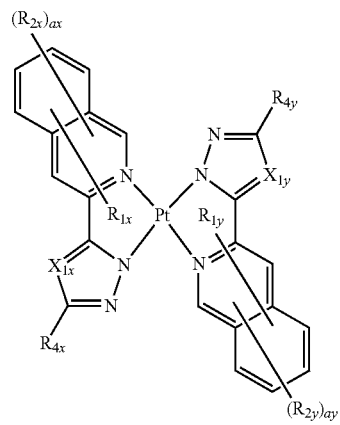
Formula 1H
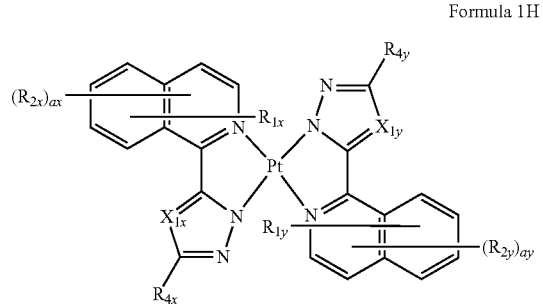

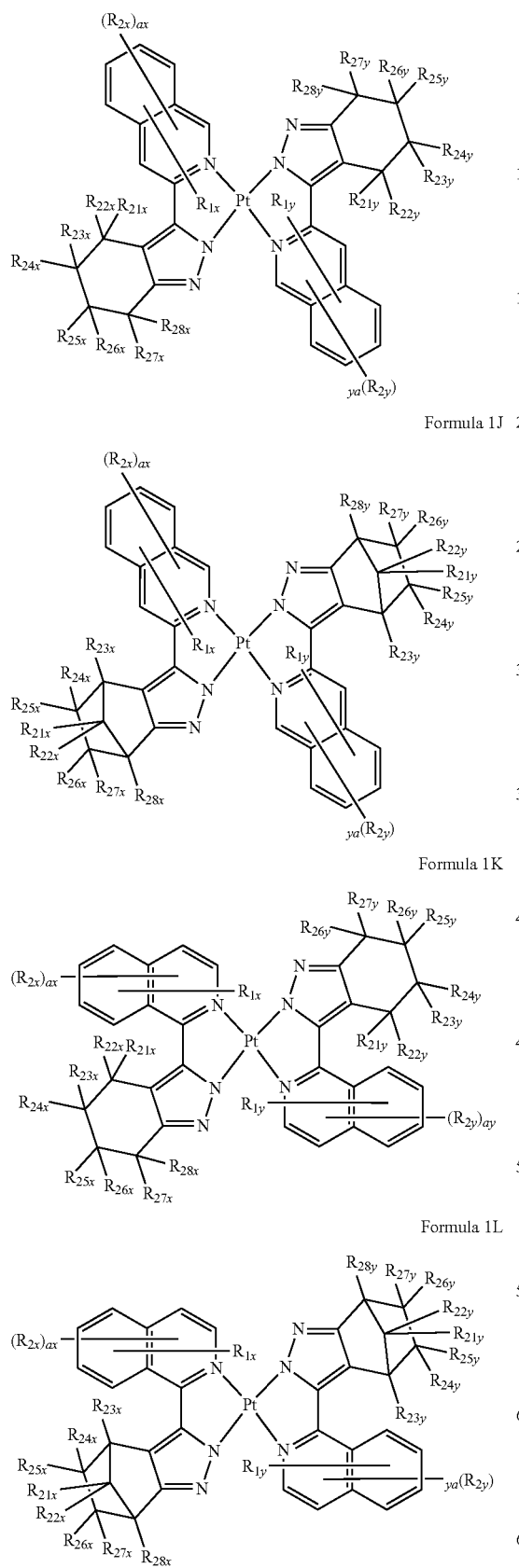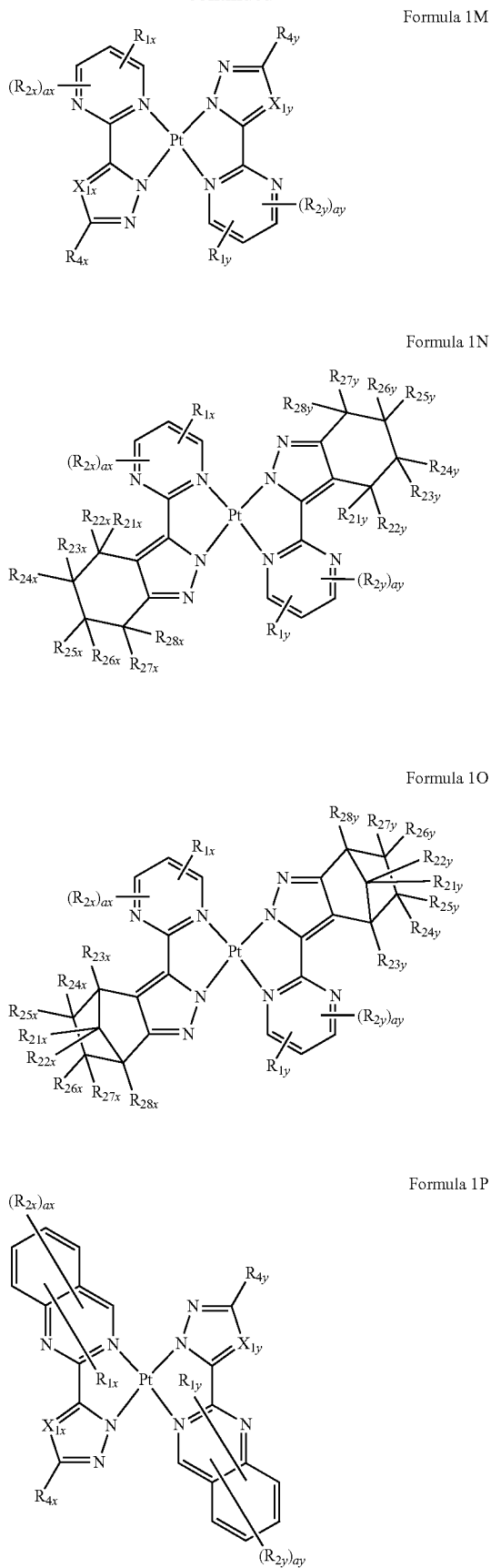

-continued

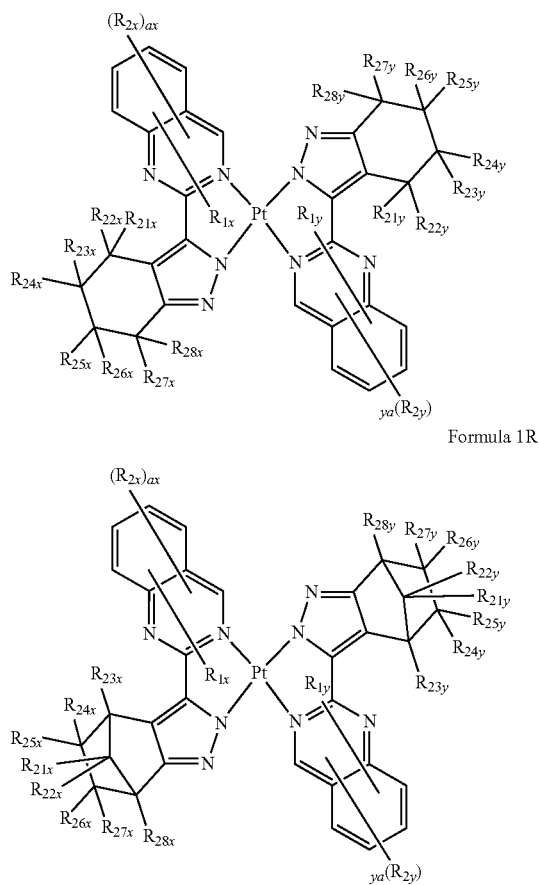

Formula 1Q

Formula 1R

Substituents of Formulae 1A to 1R may be understood by corresponding descriptions provided herein.

For example, in Formulae 1A to 1R, $X_{1x}$ is N or $C(R_{3x})$ and $X_{1y}$ is N or $C(R_{3y})$; and $R_{1x}$ and $R_{1y}$ are each independently selected from an ethyl group, an n-propyl group, an i-propyl group, an n-butyl group, an i-butyl group, a t-butyl group, a pentyl group, a hexyl group, a heptyl group, an octyl group, a nonyl group, or a decyl; or an ethyl group, an n-propyl group, an i-propyl group, an n-butyl group, an i-butyl group, an t-butyl group, a pentyl group, a hexyl group, a heptyl group, an octyl group, a nonyl group, or a decyl group, each substituted with at least one selected from a deuterium, —F, a hydroxyl group, a cyano group, a nitro group, or an amino group, $R_{2x}$ to $R_{4x}$, $R_{21x}$ to $R_{28x}$, $R_{2y}$ to $R_{4y}$, and $R_{21y}$ to $R_{28y}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy, a butoxy group, or a pentoxy group, each substituted with at least one selected from a deuterium, —F, a hydroxyl group, a cyano group, a nitro group or an amino group; and ax and ay may be each independently an integer of 1 to 3, but are not limited thereto.

In Formula 1, n is 2 and m is 0, or n is 1 and m is 1.

If n in Formula 1 is 2, two ligands each represented by

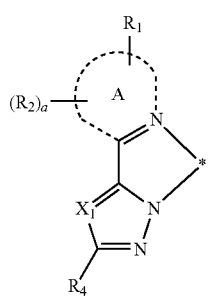

are identical, and the first compound may be a trans compound.

For example, in Formulae 1A to 1R, two ligands in the respective Formulae may be identical.

For example, the organometallic compound may be represented by Formulae 1A(1), 1A(2), 1A(3), 1B(1), 1C(1), 1D(1), 1D(2), 1E(1), 1F(1), 1G(1), 1H(1), 1J(1), 1M(1), 1M(2), 1N(1), 1N(2), 1O(1), 1P(1), or 1S(1) below, but is not limited thereto, Formula 1A(1)

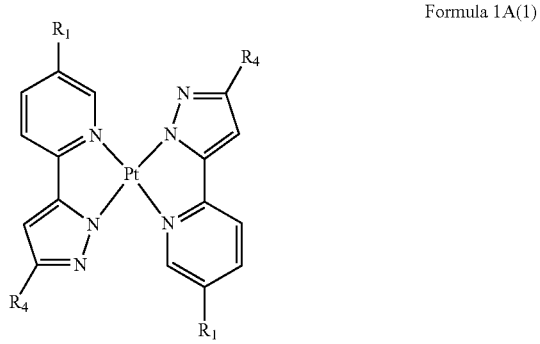

Formula 1A(2)

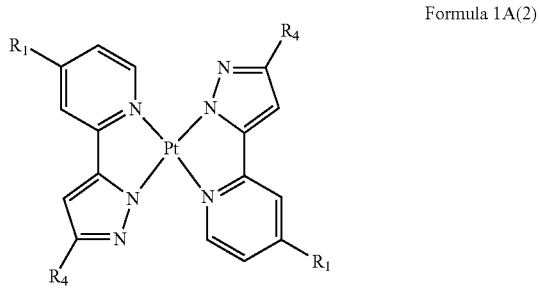

Formula 1A(3)
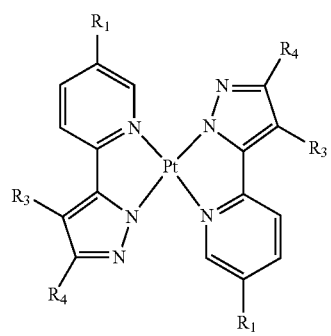
Formula 1B(1)
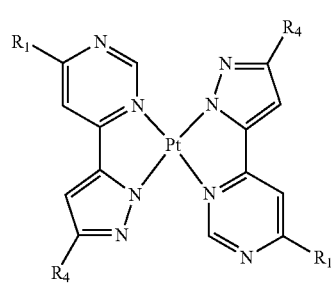
Formula 1C(1)
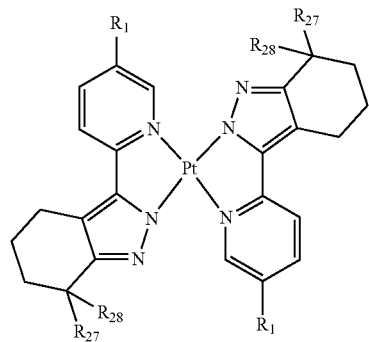
Formula 1D(1)
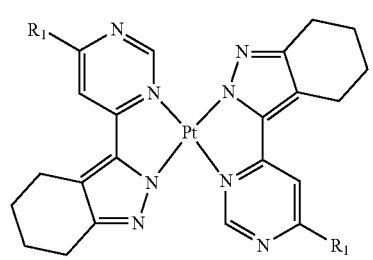
Formula 1D(2)
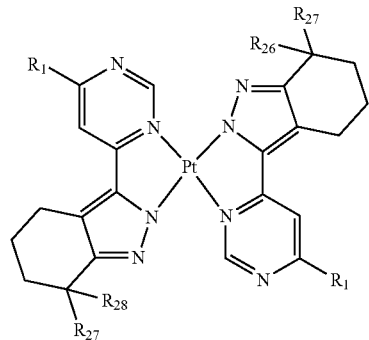
Formula 1E(1)
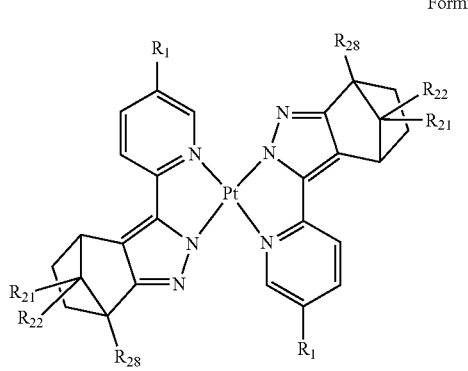
Formula 1F(1)
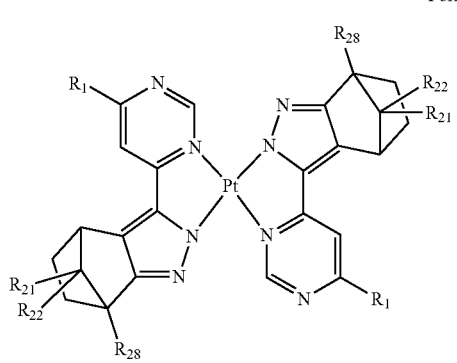
Formula 1G(1)
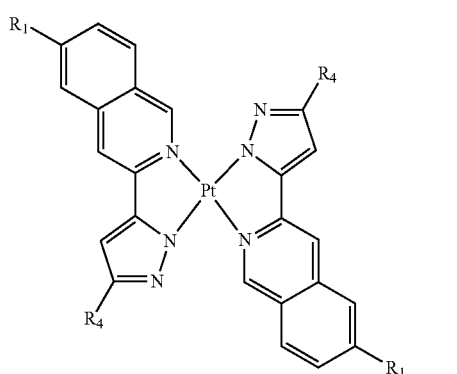
Formula 1H(1)
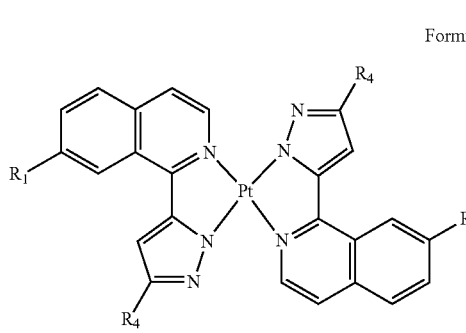

Formula 1J(1)
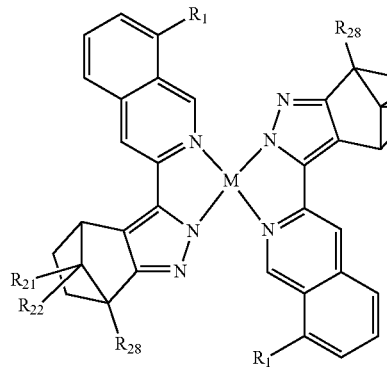
Formula 1M(1)
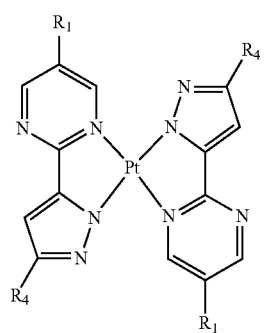
Formula 1M(2)
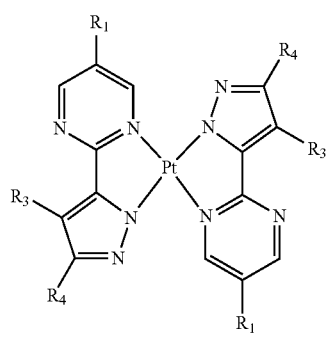
Formula 1N(1)
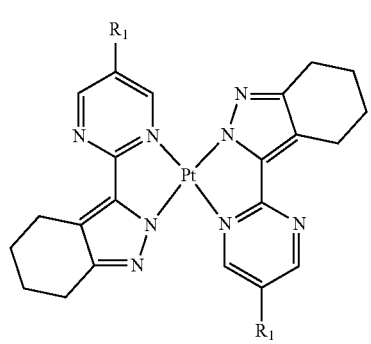
Formula 1N(2)
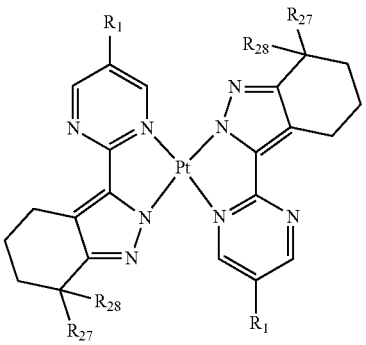
Formula 1O(1)
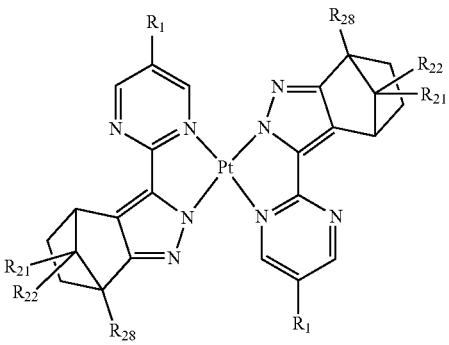
Formula 1P(1)
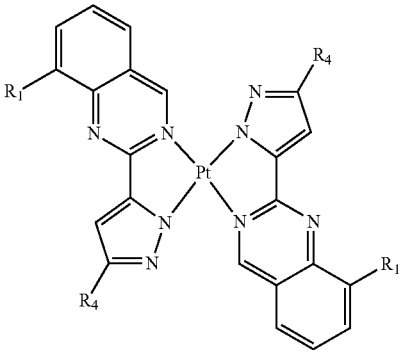
Formula 1S(1)
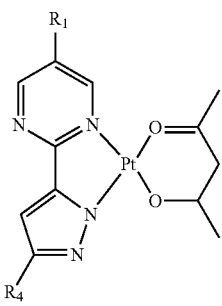
$R_1$, $R_3$, $R_4$, $R_{21}$, $R_{22}$, $R_{27}$, and $R_{28}$ in Formulae 1A(1), 1A(2), 1A(3), 1B(1), 1C(1), 1D(1), 1D(2), 1E(1), 1F(1), 1G(1), 1H(1), 1J(1), 1M(1), 1M(2), 1N(1), 1N(2), 1O(1), 1P(1), and 1S(1) may be understood by referring to descriptions provided herein.
For example, in Formulae 1A(1), 1A(2), 1A(3), 1B(1), 1C(1), 1D(1), 1D(2), 1E(1), 1F(1), 1G(1), 1H(1), 1J(1), 1M(1), 1M(2), 1N(1), 1N(2), 1O(1), 1P(1), and 1S(1), $R_1$ may be selected from an ethyl group, an n-propyl group, an i-propyl group, an n-butyl group, an i-butyl group, a t-butyl group, a pentyl group, a hexyl group, a heptyl group, an octyl group, a nonyl group, or a decyl group; or an ethyl group, an n-propyl group, an i-propyl group, an n-butyl group, an i-butyl group, an t-butyl group, a pentyl group, a hexyl group, a heptyl group, an octyl group, a nonyl group, or a decyl group, each substituted with at least one selected from a deuterium, —F, a hydroxyl group, a cyano group, a nitro group, or an amino group;

$R_3$, $R_4$, $R_{21}$, $R_{22}$, $R_{27}$, and $R_{28}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, a octyl group, a nonyl group, a decyl group, a methoxy group, an ethoxy group, a propoxy group, a butoxy group, or a pentoxy group, each substituted with at least one selected from a deuterium, —F, a hydroxyl group, a cyano group, a nitro group, or an amino group, but is not limited thereto.

The first compound represented by Formula 1 may be one of Compounds D1 to D35 below, but is not limited thereto:

D1

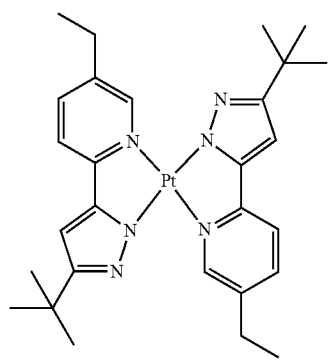

D2

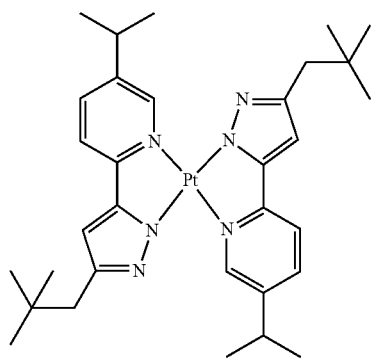

D3

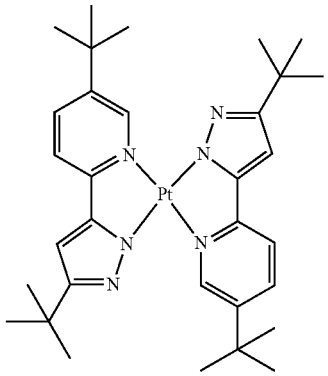

D4

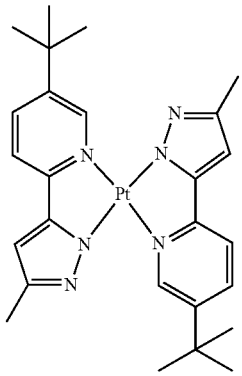

D5

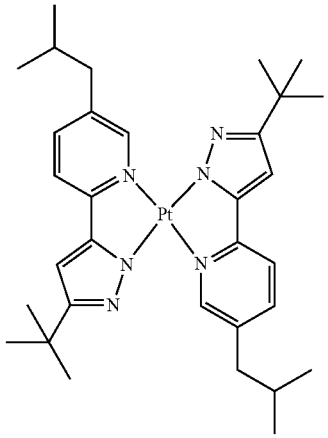

D6

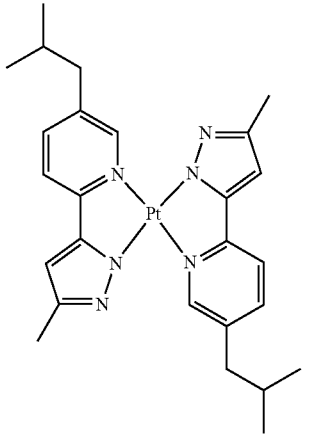

D7
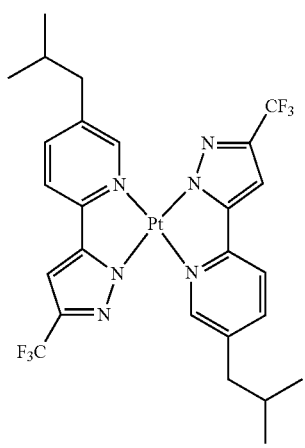
D8
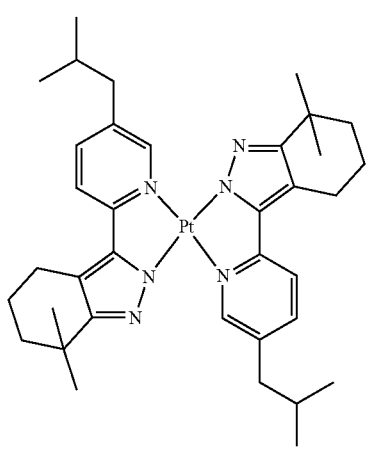
D9
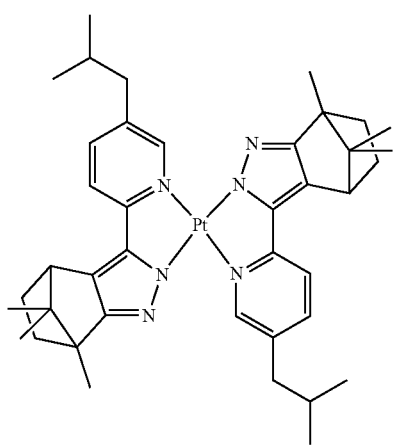
D10
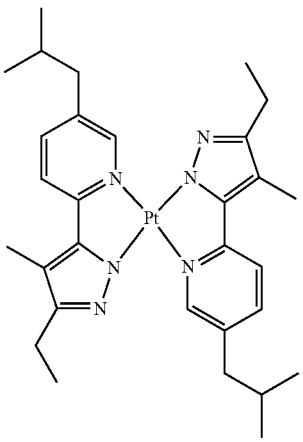
D11
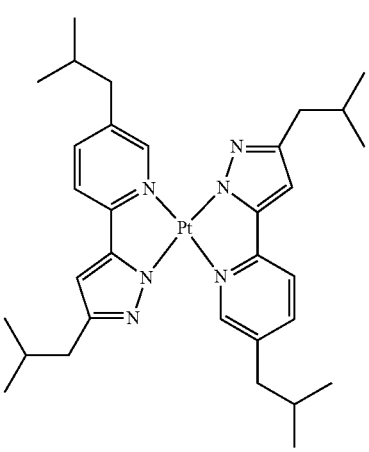
D12
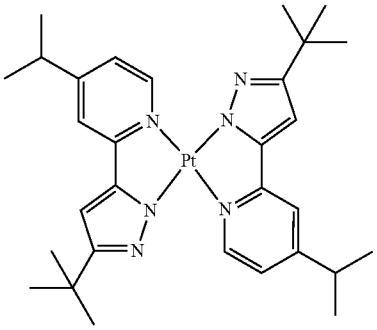
D13
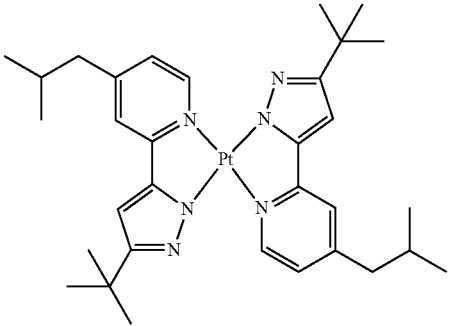

D14
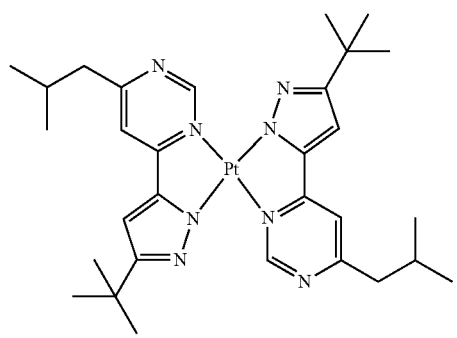
D15
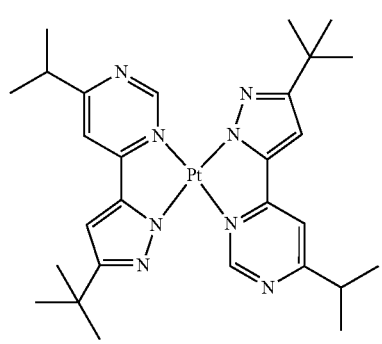
D16
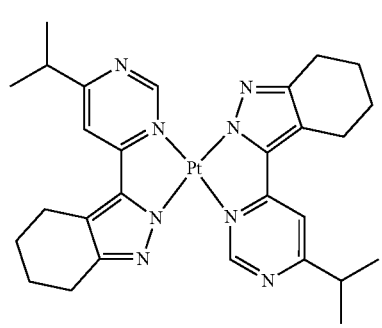
D17
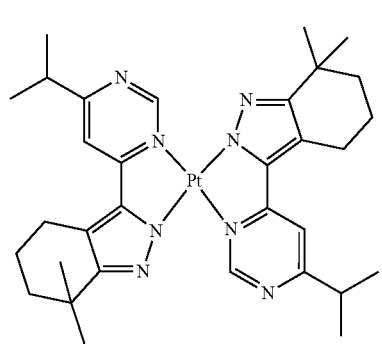
D18
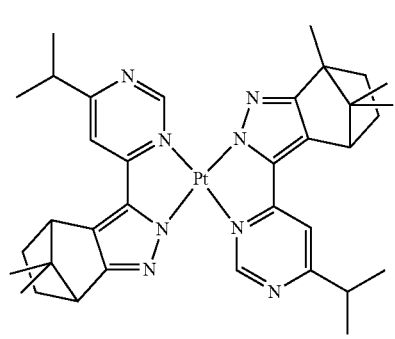
D19
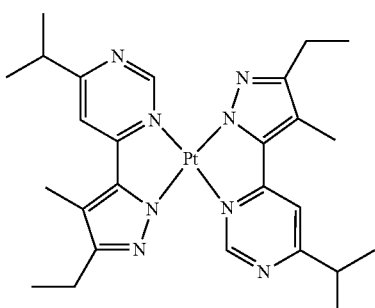
D20
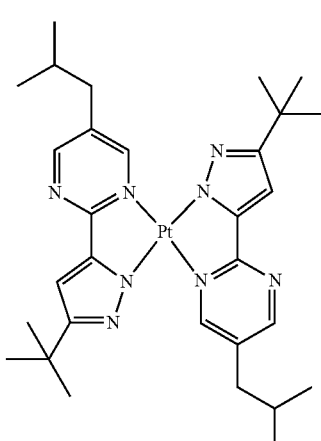
D21
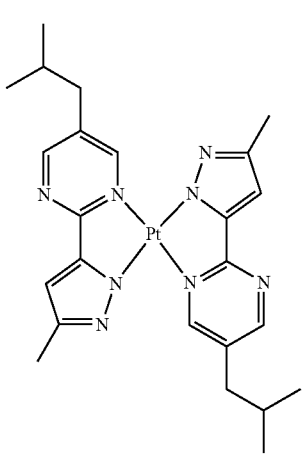
D22
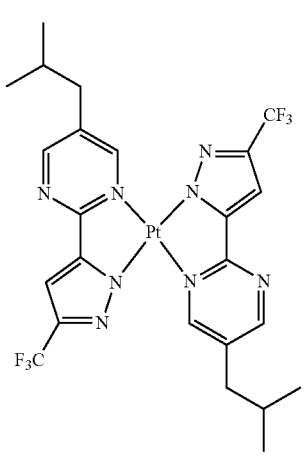

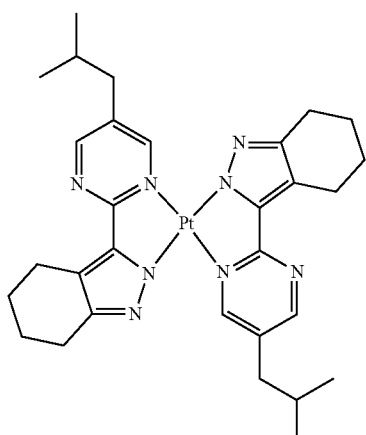
D23
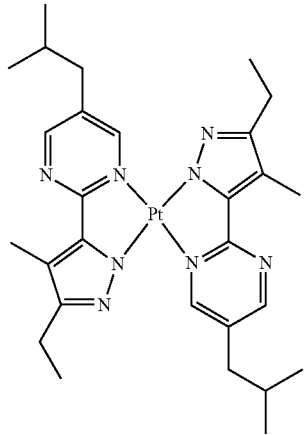
D26
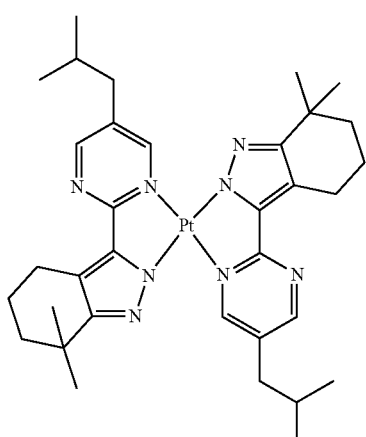
D24
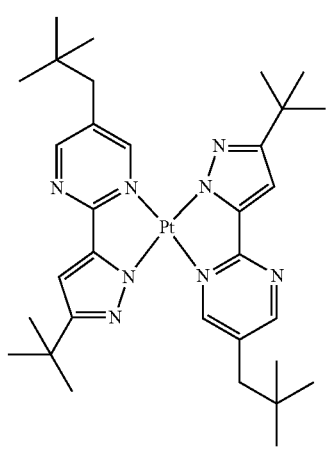
D27
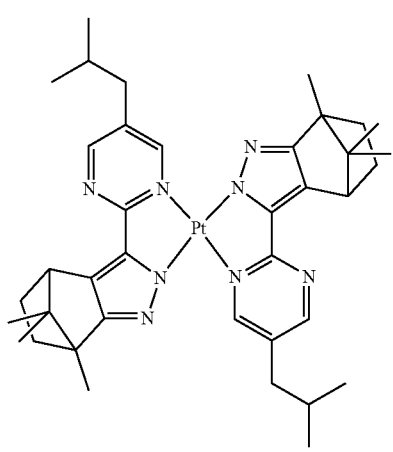
D25
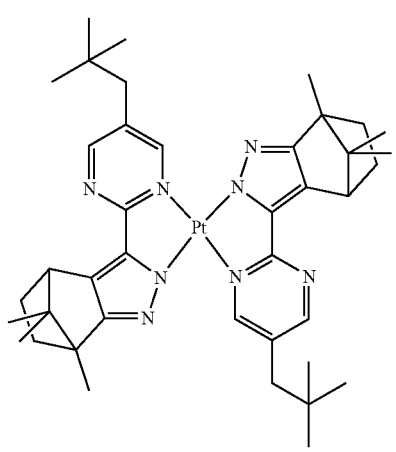
D28

D29
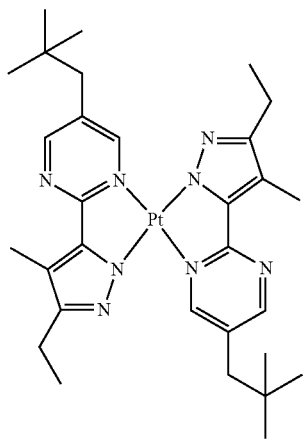

D30
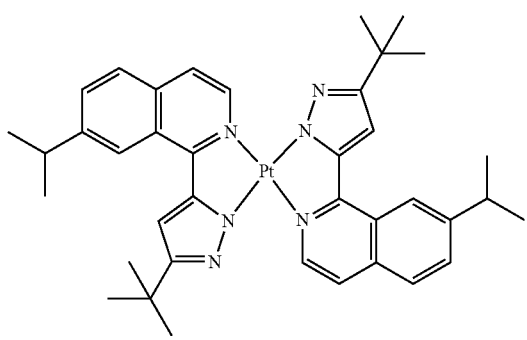

D31
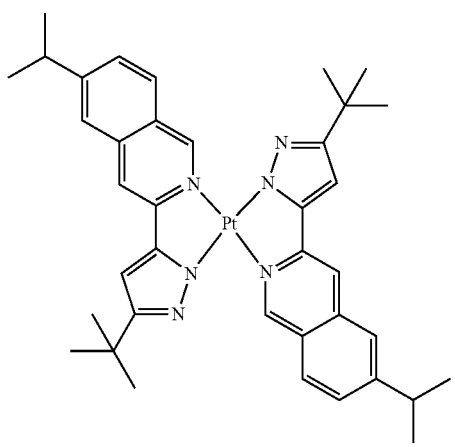

D32
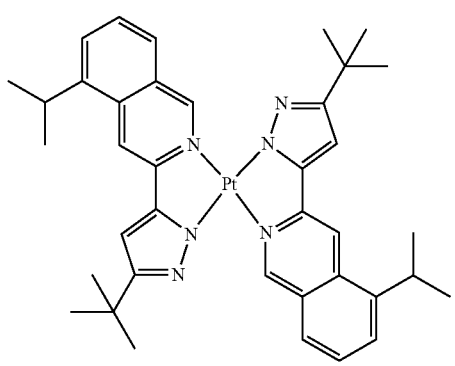

D33
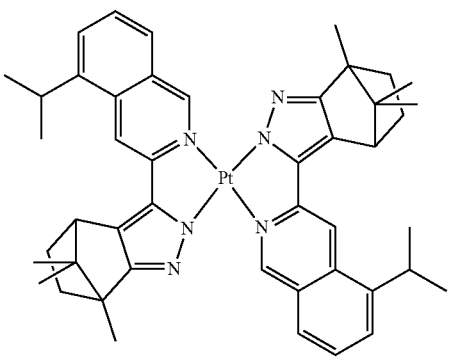

D34
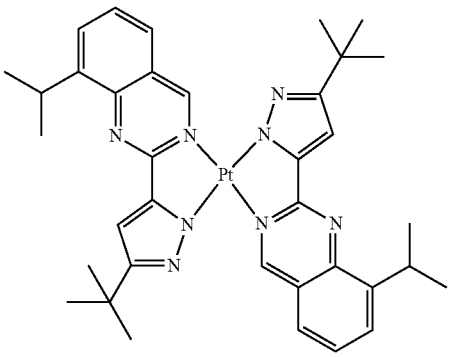

D35
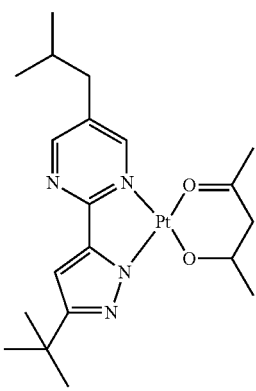

The first compound represented by Formula 1 may provide high luminescent efficiency due to phosphorescent emission mechanism. Also, when $R_1$ of the first compound represented by Formula 1 is a substituted or unsubstituted linear or branched $C_2$-$C_{60}$ alkyl group (that is, an alkyl group containing two or more carbon atoms), intermolecular aggregation of the first compound may be minimized or substantially prevented. Accordingly, an organic light-emitting device including the first compound represented by Formula 1 as a dopant may provide very high luminescent efficiency.

Also, the host in the emission layer may be a second compound represented by Formula 100 below.

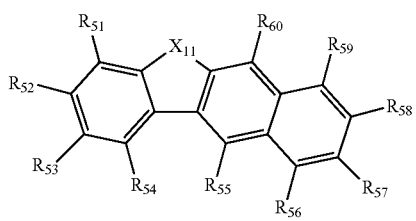

Formula 100

$X_{11}$ in Formula 100 may be O or S.

wherein in Formula 100, i) $R_{56}$ and $R_{57}$ bond to each other to form a substituted or unsubstituted $C_3$-$C_{60}$ cyclic moiety, or a substituted or unsubstituted $C_2$-$C_{60}$ heterocyclic moiety, $R_{51}$ to $R_{55}$ and $R_{58}$ to $R_{60}$ are each independently a substituent represented by —$(Ar_{51})_q$—$(Ar_{61})$: or ii) $R_{58}$ and $R_{59}$ bond to each other to form a substituted or unsubstituted $C_3$-$C_{60}$ cyclic moiety or a substituted or unsubstituted $C_2$-$C_{60}$ heterocyclic moiety, and $R_{51}$ to $R_{57}$ and $R_{60}$ are each independently a substituent represented by —$(Ar_{51})_q$—$(Ar_{61})$.

According to an embodiment of the present invention, the second compound may be represented by Formulae 100A or 100B below:

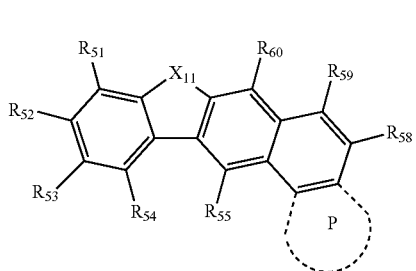

Formula 100A

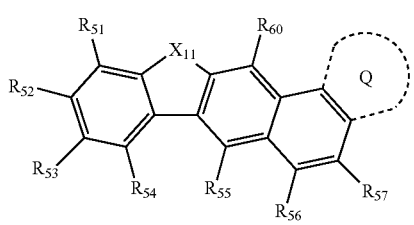

Formula 100B $X_{11}$, and $R_{51}$ to $R_{60}$ in Formulae 100A and 100B may be the same as described in the present specification.

ring P and ring Q in Formulae 100A and 100B may be each independently selected from a cyclopropane, a cyclobutane, a cyclopentane, a cyclohexane, a cycloheptane, a cyclooxane, a cyclopentene, a cyclopentadiene, a cyclohexene, a cyclohexadiene, a cycloheptadiene, a pyrrole, a pyrazole, a benzene, a furan, a thiophene, a pyridine, a pyrazine, a pyrimidine, a pyridazine, a naphtalene, a anthracene, a fluorene, a pyrrolizine, an indolizine, an isoindole, an indole, an indazole, a purine, a quinolizine, an isoquinoline, a quinoline, a phthalazine, a naphthyridine, a quinoxalaine, a quinazoline, a cinnoline, a carbazole, a phenanthridine, an acridine, a phenazine, a benzofuran, a benzothiophene, a dibenzofuran, or a dibenzothiophene; or a cyclopropane, a cyclobutane, a cyclopentane, a cyclohexane, a cycloheptane, a cyclooxane, a cyclopentene, a cyclopentadiene, a cyclohexene, a cyclohexadiene, a cycloheptadiene, a pyrrole, a pyrazole, a benzene, a furan, a thiophene, a pyridine, a pyrazine, a pyrimidine, a pyridazine, a naphtalene, an anthracene, a fluorene, a pyrrolizine, an indolizine, an isoindole, an indole, an indazole, a purine, a quinolizine, an isoquinoline, a quinoline, a phthalazine, a naphthyridine, a quinoxalaine, a quinazoline, a cinnoline, a carbazole, a phenanthridine, an acridine, a phenazine, a benzofuran, a benzothiophene, a dibenzofuran, or a dibenzothiophene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

a $C_1$-$C_{20}$ alkyl group or a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof or a phosphoric acid or a salt thereof;

a $C_6$-$C_{20}$ aryl group, a $C_6$-$C_{20}$ aryloxy group, a $C_6$-$C_{20}$ arylthio group, a $C_2$-$C_{20}$ heteroaryl group, a monovalent non-aromatic condensed polycyclic group, or a monovalent non-aromatic hetero-condensed polycyclic group;

a $C_6$-$C_{20}$ aryl group, a $C_6$-$C_{20}$ aryloxy group, a $C_6$-$C_{20}$ arylthio group, a $C_2$-$C_{20}$ heteroaryl group, a monovalent non-aromatic condensed polycyclic group, or a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethyl fluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or —$N(Q_{51})(Q_{52})$ or —$Si(Q_{53})(Q_{54})(Q_{55})$ (wherein $Q_{51}$ to $Q_{55}$ are each independently selected from a $C_1$-$C_{60}$ alkyl group, a $C_1$-$C_{60}$ alkoxy group, a $C_6$-$C_{20}$ aryl group, a $C_2$-$C_{20}$ heteroaryl group, a monovalent non-aromatic condensed polycyclic group, or a monovalent non-aromatic hetero-condensed polycyclic group).

In some embodiments, ring P and ring Q may be each independently selected from a benzene, a naphtalene, a fluorene, a carbazole, a dibenzofuran, or a dibenzothiophene; or a benzene, a naphtalene, a fluorene, a carbazole, a dibenzofuran, or a dibenzothiophene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group or a $C_1$-$C_{20}$ alkoxy group;

a $C_1$-$C_{20}$ alkyl group or a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group or an isoquinolinyl group;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group; or —$N(Q_{51})(Q_{52})$ or —$Si(Q_{53})(Q_{54})(Q_{55})$ (wherein $Q_{51}$ to $Q_{55}$ may be each independently selected from a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group).

According to an embodiment of the present invention, $R_{51}$ and $R_{54}$ in Formulae 100A and 100B may both be hydrogen.

According to an embodiment of the present invention, $R_{51}$ to $R_{55}$, and $R_{60}$ in Formulae 100A and 100B may be hydrogen.

According to another embodiment of the present invention, the second compound may be represented by one of Formulae 100A-1 to 100A-8 or 100B-1 to 100B-8, but is not limited thereto:

Formula 100A-1

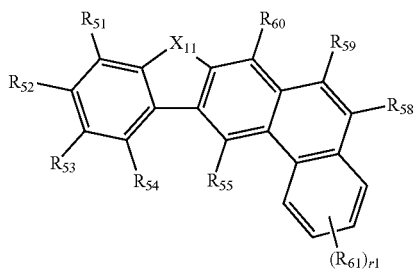

Formula 100A-2

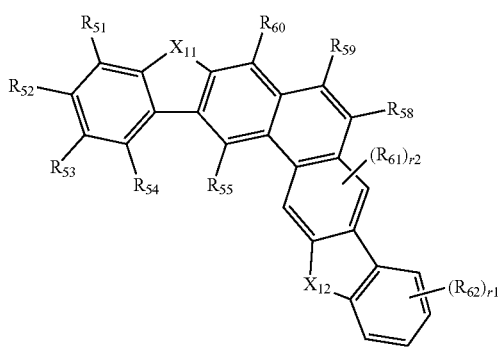

Formula 100A-3

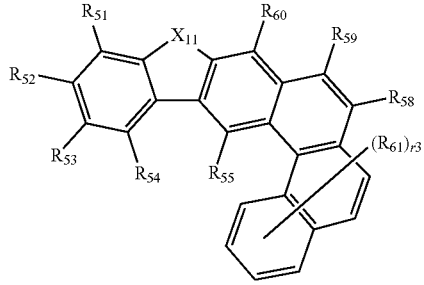

Formula 100A-4

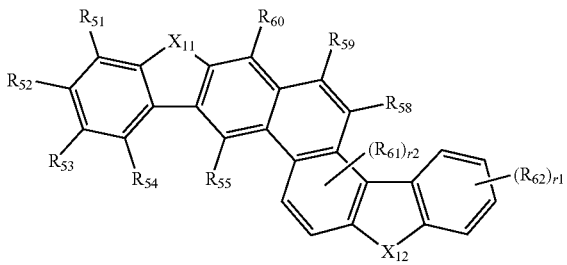

Formula 100A-5

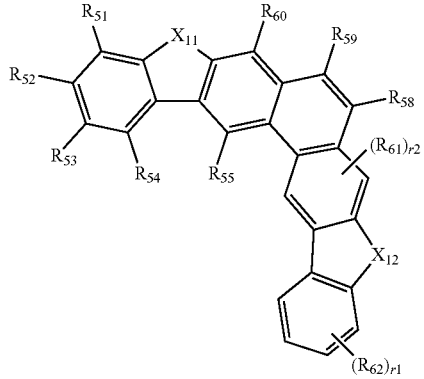

Formula 100A-6

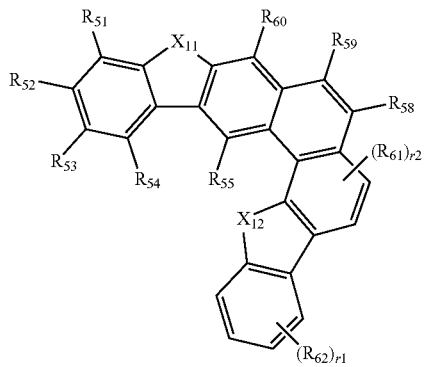

Formula 100A-7
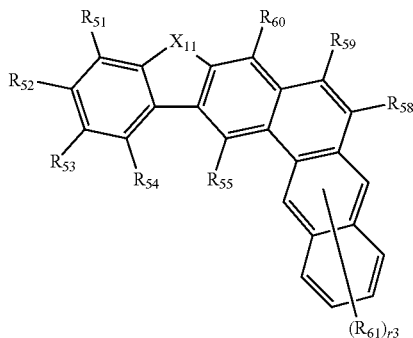

Formula 100A-8
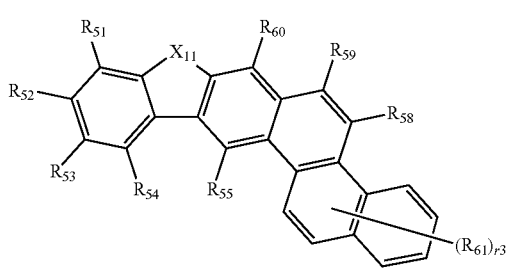

Formula 100B-1
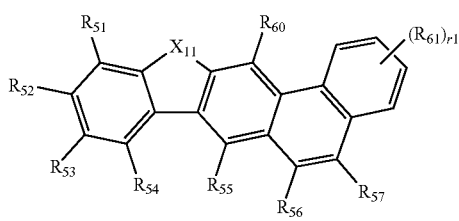

Formula 100B-2
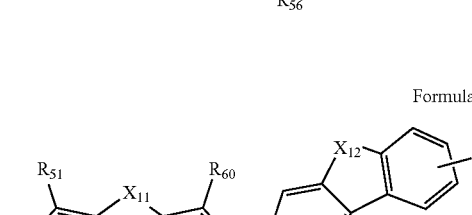

Formula 100B-3
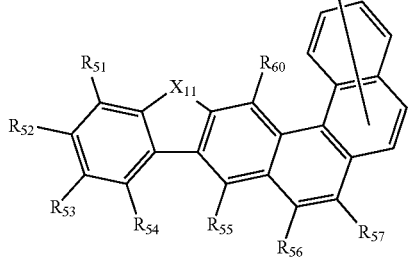

Formula 100B-4
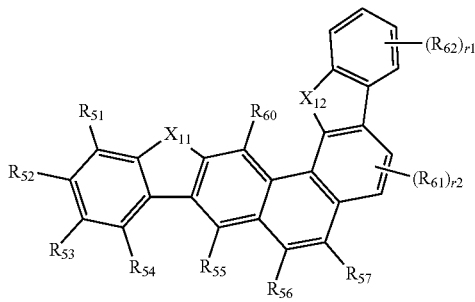

Formula 100B-5
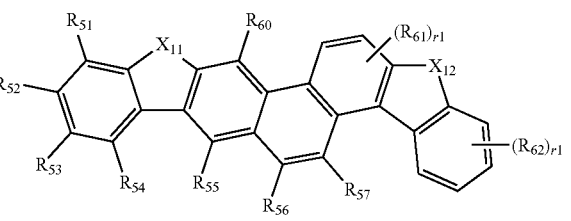

Formula 100B-6
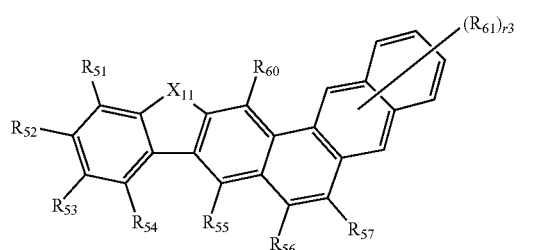

Formula 100B-7
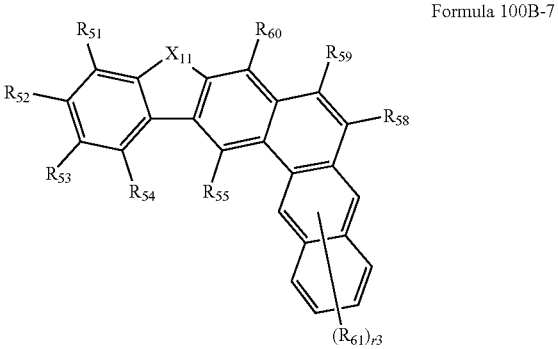

Formula 100B-8
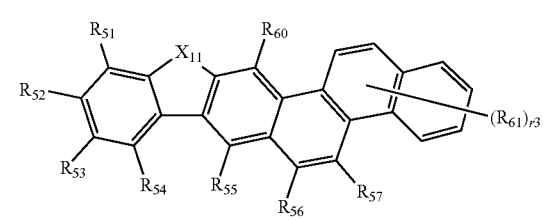

$X_{11}$, and $R_{51}$ to $R_{62}$ in Formulae 100A-1 to 100A-8 and 100B-1 to 100B-8 are already described above.

$X_{12}$ in Formulae 100A-1 to 100A-8 and 100B-1 to 100B-8 may be O, S C($R_{71}$)($R_{72}$), or N($R_{73}$).

In some embodiments, $R_{61}$, and $R_{62}$ and $R_{71}$ to $R_{73}$ in Formulae 100A-1 to 100A-8 and 100B-1 to 100B-8 may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or —N($Q_{51}$)($Q_{52}$) or —Si($Q_{53}$)($Q_{54}$)($Q_{55}$) (wherein $Q_{51}$ to $Q_{55}$ are each independently selected from a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group).

In Formulae 100A-1 to 100A-8, and 100B-1 to 100B-8, r1 may be an integer of 1 to 4; r2 may be an integer of 1 or 2; and r3 may be an integer of 1 to 6.

For example, $R_{61}$, and $R_{62}$ and $R_{71}$ to $R_{73}$ in Formulae 100A-1 to 100A-8 and 100B-1 to 100B-8 may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

a $C_1$-$C_{20}$ alkyl group or a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or —N($Q_{51}$)($Q_{52}$) or —Si($Q_{53}$)($Q_{54}$)($Q_{55}$) (wherein $Q_{51}$ to $Q_{55}$ are each independently selected from a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group), but are not limited thereto.

According to an embodiment of the present invention, $Ar_{51}$ of —($Ar_{51}$)$_q$—($Ar_{61}$) in Formula 100 may be each independently selected from a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, or a dibenzothiophenylene group; or a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, or a dibenzothiophenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

In other embodiments, $Ar_{51}$ of —($Ar_{51}$)$_q$—($Ar_{61}$) in Formula 100 may be selected from Formulae 102-1 to 102-5:

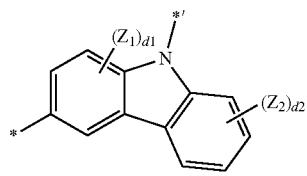

Formula 102-1

Formula 102-2

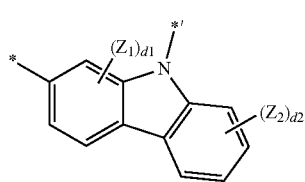

Formula 102-3

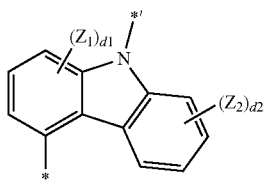

Formula 102-4

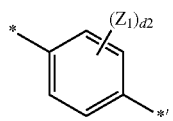

Formula 102-5

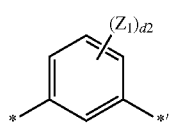

In Formulae 102-1 to 102-5, $Z_1$ and $Z_2$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; $d_1$ may be an integer of 1 to 3; $d_2$ may be an integer of 1 to 4; * indicates a binding site to the core of Formula 100 or to the other $Ar_{51}$ adjacent to the core; and *' indicates a binding site to the other $Ar_{51}$ spaced from the core of Formula 100 or to $Ar_{61}$, but these are not limited thereto.

q of —$(Ar_{51})_q$—$(Ar_{61})$ in Formula 100 may be an integer of 0 to 5, for example, 0, 1, or 2. When q is 2 or more, a plurality of $Ar_{51}$ may be identical or different.

In an embodiment, $Ar_{61}$ of —$(Ar_{51})_q$—$(Ar_{61})$ in Formula 100 may be selected from Formulae 103-1 to 103-15:

Formula 103-1

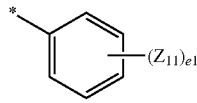

Formula 103-2

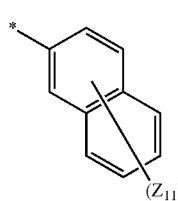

Formula 103-3

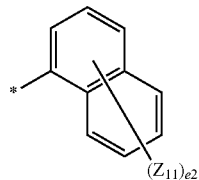

Formula 103-4

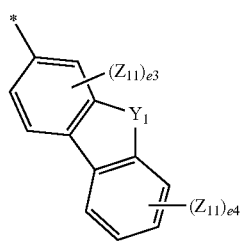

Formula 103-5

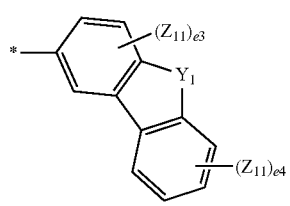

Formula 103-6

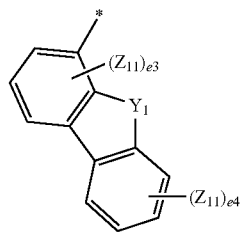

Formula 103-7

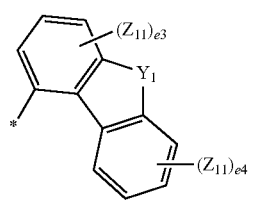

Formula 103-8

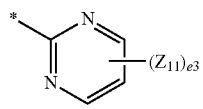

Formula 103-9

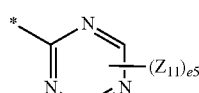

Formula 103-10

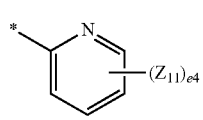

Formula 103-11

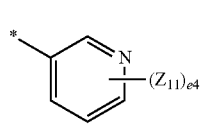

Formula 103-12

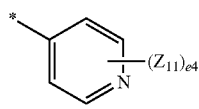

Formula 103-13

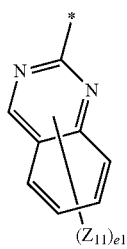

Formula 103-14

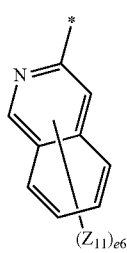

Formula 103-15

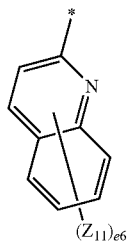

In Formulae 103-1 to 103-15, $Y_1$ may be O, S, $C(Z_{21})(Z_{22})$, or $N(Z_{23})$; $Z_{11}$, and $Z_{21}$ to $Z_{23}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; e1 may be an integer of 1 to 5; e2 may be an integer of 1 to 7; e3 may be an integer of 1 to 3; e4 may be an integer of 1 to 4; e5 may be an integer of 1 or 2, e6 may be an integer of 1 to 6, but these are not limited thereto.

In an embodiment, —$(Ar_{51})_q$—$(Ar_{61})$ in Formula 100 may be selected from Formulae 104-1 to 104-11:

Formula 104-1

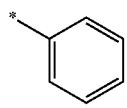

Formula 104-2

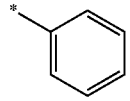

Formula 104-3

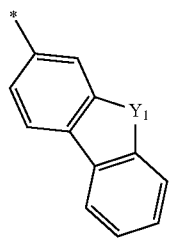

Formula 104-4

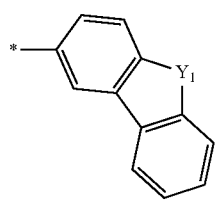

Formula 104-5

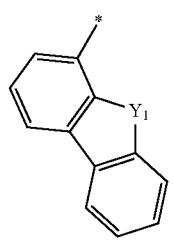

Formula 104-6

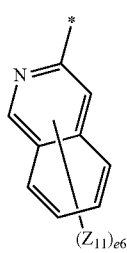

Formula 104-7

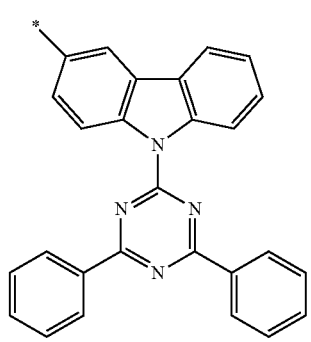

-continued

Formula 104-8

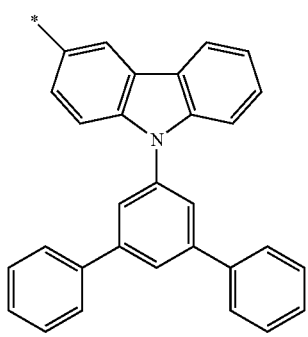

Formula 104-9

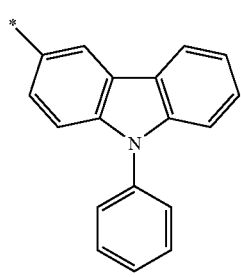

Formula 104-10

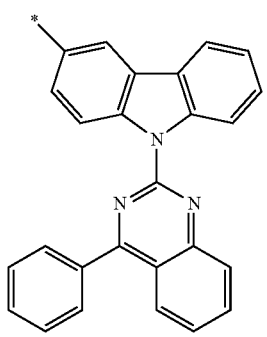

Formula 104-11

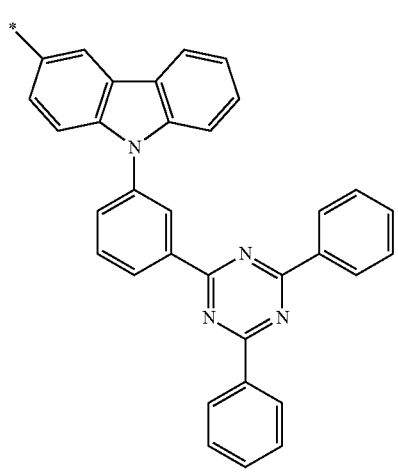

$Y_1$ in Formulae 104-1 to 104-11 may be O or S.

In some embodiments, the second compound may be represented by Formulae 100A-1(1), 100B-1(1), 100B-5(1), or 100B-8(1), but is not limited thereto:

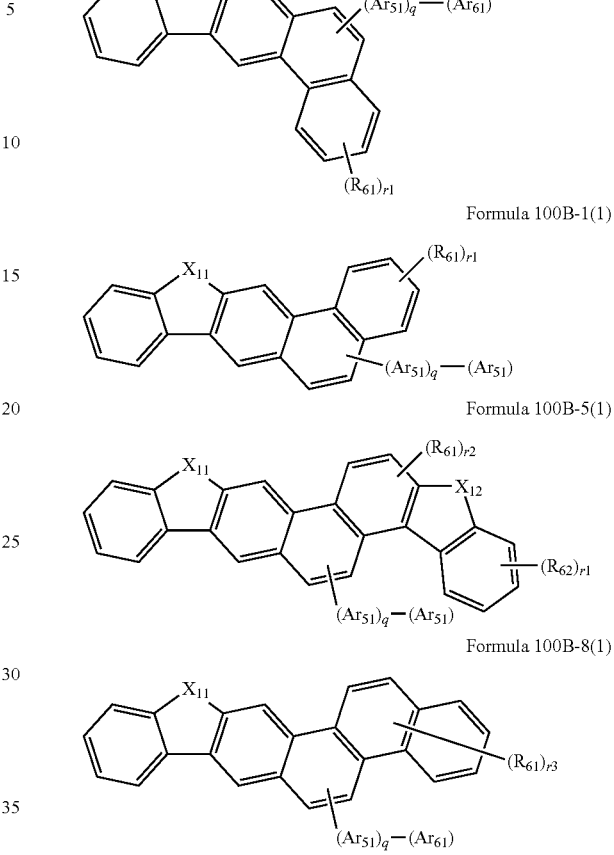

Formula 100A-1(1)

Formula 100B-1(1)

Formula 100B-5(1)

Formula 100B-8(1)

$X_{11}$, $Ar_{51}$, q, $Ar_{61}$, $R_{61}$, $R_{62}$, $r_1$, $r_2$ and $r_3$ in Formulae 100A-1(1), 100B-1(1), 100B-5(1), and 100B-8(1) are the same as described above.

In some embodiments, in Formulae 100A-1(1), 100B-1(1), 100B-5(1), and 100B-8(1), $X_{11}$ may be O or S;

$Ar_{51}$ may be selected from a phenylene group, a naphthylene group, a fluorenylene group, a pyridinylene group, a pyrazinylene group, a pyrimidinylene group, a pyridazinylene group, quinolinylene group, a carbazolylene group, a triazinylene group, a dibenzofuranylene group, or a dibenzothiophenylene group; or a phenylene group, a naphthylene group, a fluorenylene group, a pyridinylene group, a pyrazinylene group, a pyrimidinylene group, a pyridazinylene group, quinolinylene group, a carbazolylene group, a triazinylene group, a dibenzofuranylene group, or a dibenzothiophenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

q may be 0, 1, or 2;

$Ar_{61}$ may be represented by one of Formulae 103-1 to 103-15;

$R_{61}$ and $R_{62}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_1$-$C_{60}$ alkoxy group, a phenyl group, a naphthyl group, or an anthracenyl group;

r1, r2 and r3 may be each independently selected from 0, 1, 2, or 3, but are not limited thereto.

According to an embodiment of the present invention, in Formulae 100A-1(1), 100B-1(1), 100B-5(1), and 100B-8(1), $X_{11}$ may be O or S; $Ar_{51}$ may be represented by one of Formulae 102-1 to 102-5; q may be 0, 1, or 2; $Ar_{61}$ may be represented by one of Formulae 103-1 to 103-15; and $R_{61}$ and $R_{62}$ may be a hydrogen, but embodiments of the invention are not limited thereto.

The second compound may be one of Compounds H1 to H15 below, but is not limited thereto:

H1

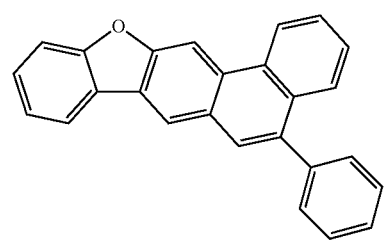

H2

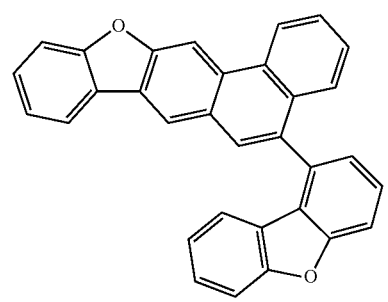

H3

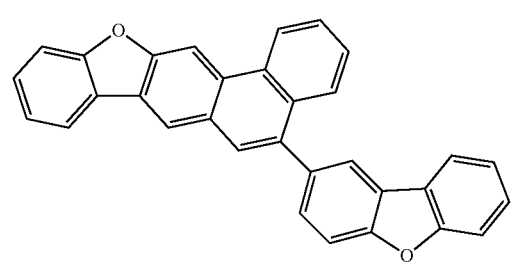

H4

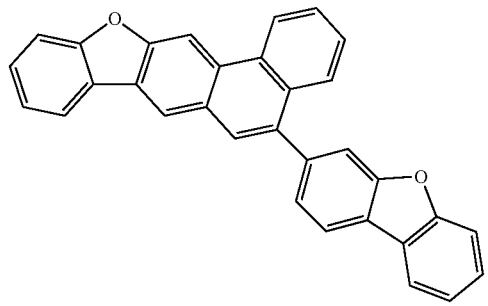

H5

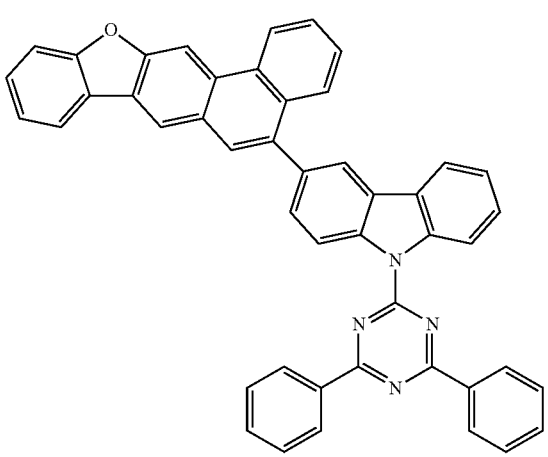

H6

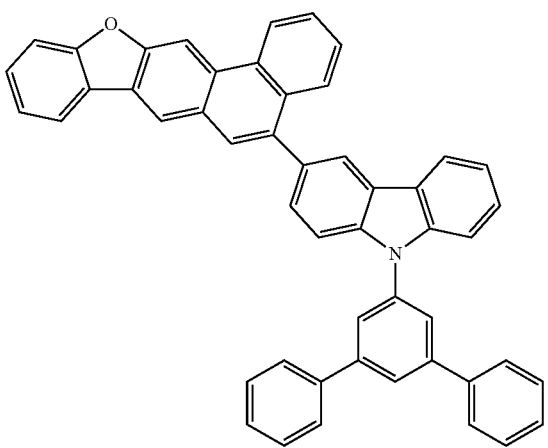

H7

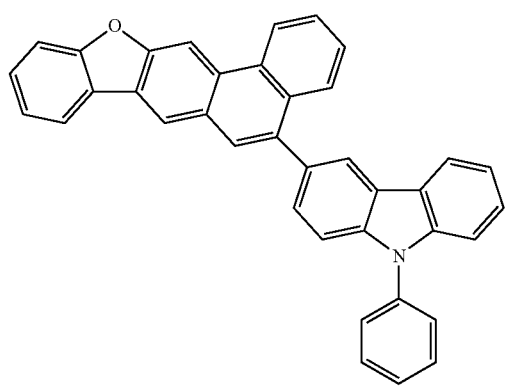

H8
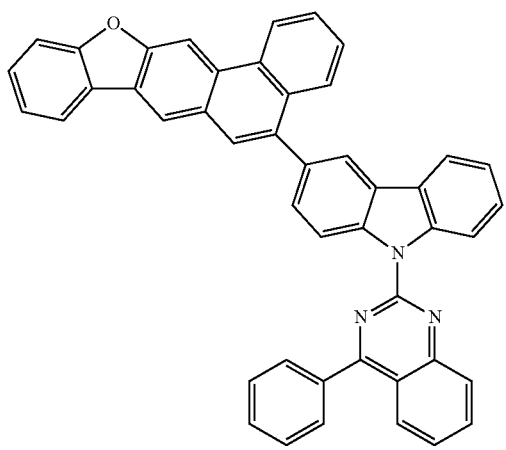
H9
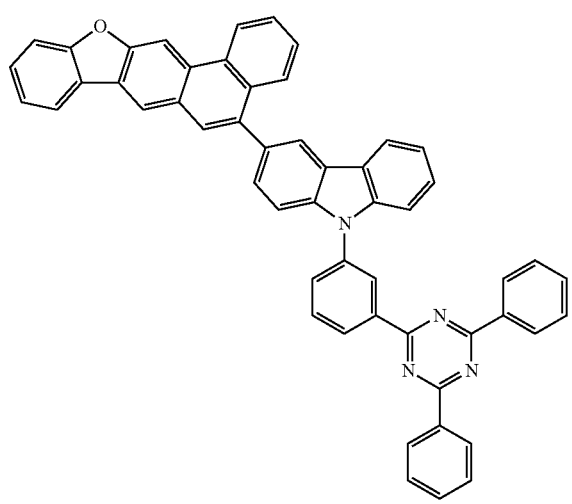
H10
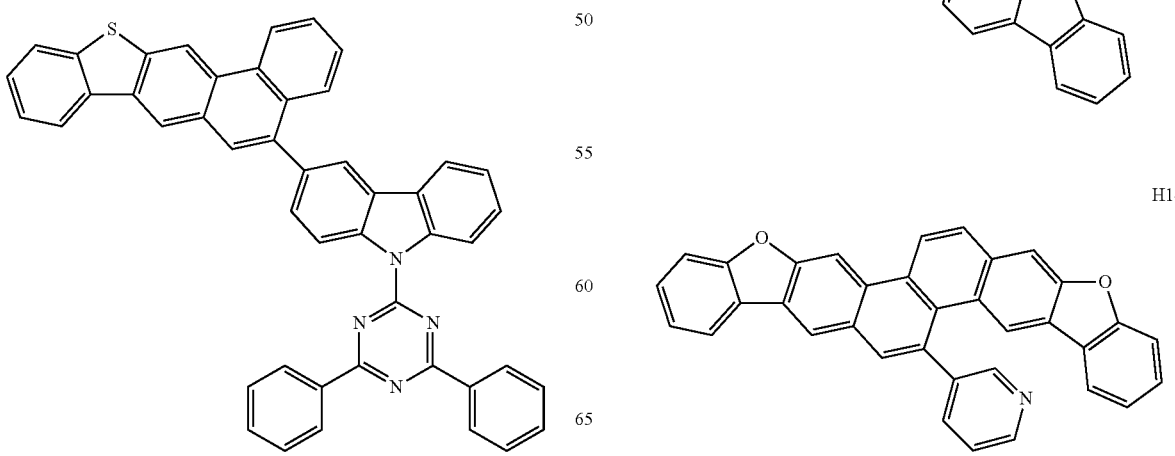
H11
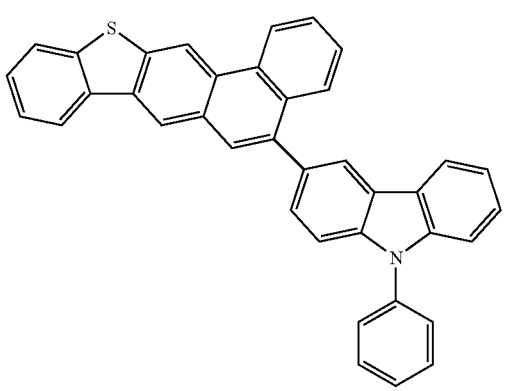
H12
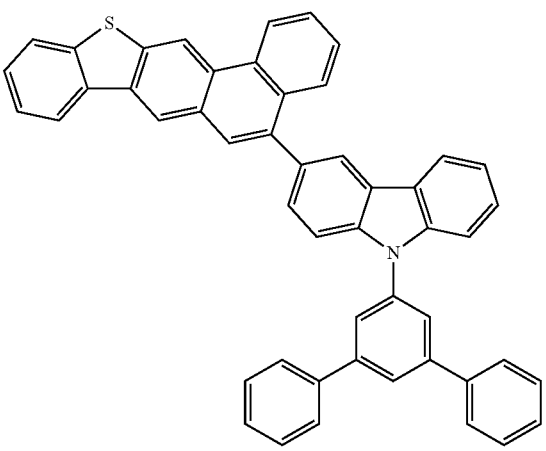
H13
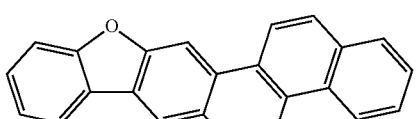
H14
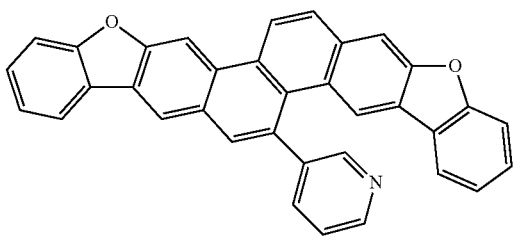

H15

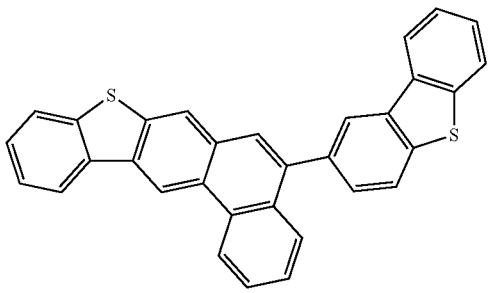

The second compound may have high charge transport capabilities and emission capabilities. Also, the second compound has a large difference between a highest occupied molecular orbit (HOMO) and the lowest unoccupied molecular orbit (LUMO), that is, a large energy gap, and thus, when the second compound is used, energy level may be easily controlled. Accordingly, when the second compound is used together with the first compound in forming an emission layer, efficiency and lifetime thereof may improve substantially.

The combination of the first compound included in a dopant of the emission layer and the second compound included in a host of the emission layer may be selected from the examples provided in the present specification.

For example, in one embodiment, the dopant of the emission layer may include the first compound represented by Formula 1(1), and the host of the emission layer may include the second compound represented by Formula 100A or 100B, but the dopant and the host are not limited thereto.

In another embodiment, the dopant of the emission layer may include the first compound represented by one of Formulae 1A to 1R, and the host of the emission layer may include the second compound represented by one of Formulae 100A-1 to 100A-8 and 100B-1 to 100B-8, but the dopant and the host are not limited thereto.

In another embodiment, the dopant of the emission layer may include the first compound selected from Compounds D1 to D35, and the host of the emission layer may include the second compound selected from Compounds H1 to H15, but the dopant and the host are not limited thereto.

Since the dopant of the emission layer includes the first compound, the emission layer may emit light according to a phosphorescent emission mechanism. The emission layer may emit at least one light selected from red light, green light, or blue light. For example, the emission layer may emit red light or green light.

The first compound represented by Formula 1 and the second compound represented by Formula 100 may be synthesized by using a known organic synthetic method. A synthesis method of the first compound and the second compound will be understood by one of ordinary skill in the art in view of the following embodiments.

The dopant of the emission layer may further include, in addition to the first compound, any suitable dopant, and the host of the emission layer may further include, in addition to the second compound, any suitable host.

An amount of the dopant in the emission layer may be, in general, in a range of about 0.01 to about 15 parts by weight based on 100 parts by weight of the host, but is not limited thereto.

A thickness of the emission layer may be in a range of about 100 Å to about 1,000 Å, and in some embodiments, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer (ETL), or an electron injection layer, but is not limited thereto.

For example, the electron transport region may have a structure of electron transport layer/electron injection layer or a structure of hole blocking layer/electron transport layer/electron injection layer, wherein layers of each structure are sequentially stacked on the emission layer in the stated order, but structure of the electron transport region is not limited thereto.

According to an embodiment of the present invention, the organic layer 150 of the organic light-emitting device may include an electron transport region disposed between the emission layer and the second electrode 190.

The electron transport region may include a hole blocking layer. The hole blocking layer may be formed, when the emission layer includes a phosphorescent dopant, to prevent diffusion of excitons or holes into an electron transport layer.

When the electron transport region includes a hole blocking layer, the hole blocking layer may be formed on the emission layer by using various methods, such as vacuum deposition, spin coating casting, a Langmuir-Blodgett (LB) method, ink-jet printing, laser-printing, or laser-induced thermal imaging. When the hole blocking layer is formed by vacuum deposition or spin coating, deposition and coating conditions for the hole blocking layer may be determined by referring to the deposition and coating conditions for the hole injection layer.

The hole blocking layer may include, for example, at least one of BCP or Bphen, but is not limited thereto.

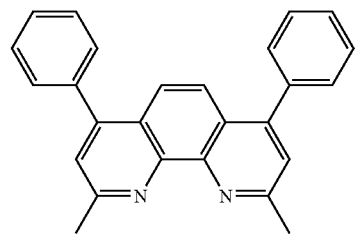

BCP

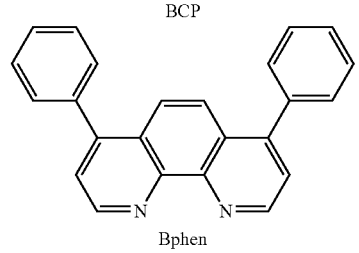

Bphen

A thickness of the hole blocking layer may be in a range of about 20 Å to about 1,000 Å, and in some embodiments, about 30 Å to about 300 Å. When the thickness of the hole blocking layer is within these ranges, the hole blocking layer may have excellent hole blocking characteristics without a substantial increase in driving voltage.

The electron transport region may include an electron transport layer. The electron transport layer may be formed on the emission layer or the hole blocking layer by using various methods, such as vacuum deposition, spin coating casting, a LB method, ink-jet printing, laser-printing, or laser-induced thermal imaging. When an electron transport layer is formed by vacuum deposition or spin coating, deposition and coating conditions for the electron transport layer may be determined by referring to the deposition and coating conditions for the hole injection layer.

The electron transport layer may further include, in addition to the condensed compound represented by Formula 1, at least one selected from BCP, Bphen, $Alq_3$, Balq, TAZ, or NTAZ.

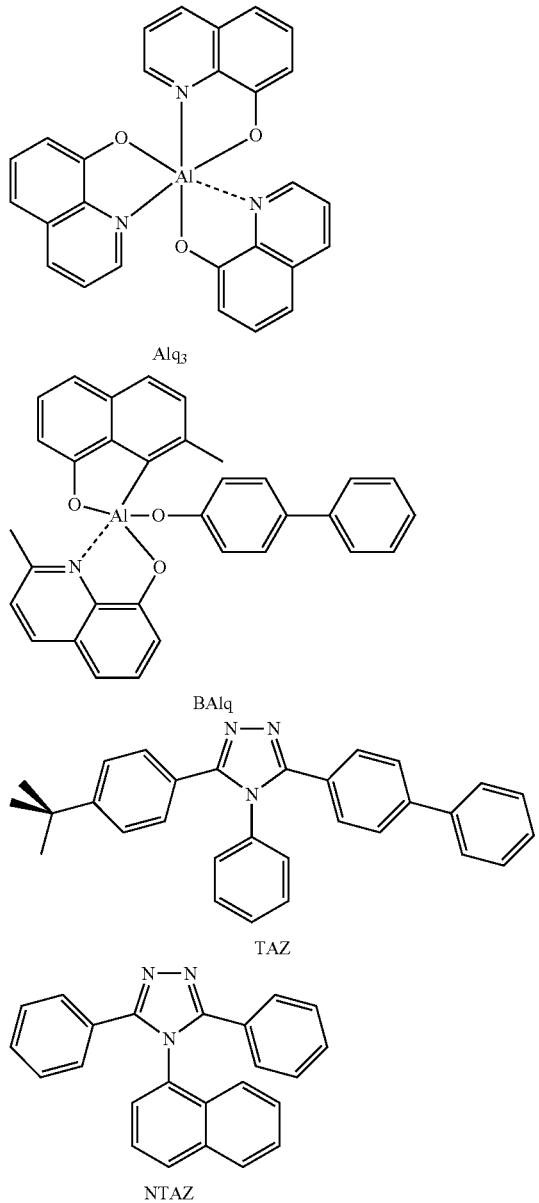

Alq₃

BAlq

TAZ

NTAZ

According to another embodiment of the present invention, the electron transport layer may further include at least one of compounds represented by Formula 601 below:

$Ar_{601}$-[($L_{601}$)$_{xe1}$-$E_{601}$]$_{xe2}$  <Formula 601> wherein in Formula 601, $Ar_{601}$ may be selected from a naphthalene, a heptalene, a fluorenene, a spiro-fluorene, a benzofluorene, a dibenzofluorene, a phenalene, a phenan-threne, an anthracene, a fluoranthene, a triphenylene, a pyrene, a chrysene, a naphthacene, a picene, a perylene, a pentaphene, or an indenoanthracene;

a naphthalene, a heptalene, a fluorenene, a spiro-fluorene, a benzofluorene, a dibenzofluorene, a phenalene, a phenan-threne, an anthracene, a fluoranthene, a triphenylene, a pyrene, a chrysene, a naphthacene, a picene, a perylene, a pentaphene, or an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a non-aromatic condensed polycyclic group, or —Si($Q_{301}$)($Q_{302}$)($Q_{303}$) ($Q_{301}$ to $Q_{303}$ are each independently selected from a hydrogen, a $C_1$-$C_{60}$ alkyl group, a $C_2$-$C_{60}$ alkenyl group, a $C_6$-$C_{60}$ aryl group, or a $C_2$-$C_{60}$ heteroaryl group);

$L_{601}$ may be understood by referring to the description provided in connection with $L_{201}$;

$E_{601}$ may be selected from a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthroli-nyl group, a phenazinyl group, a benzoimidazolyl group, a benzofuranyl group, a benzothiophenyl group, an isobenzo-thiazolyl group, a benzooxazolyl group, an isobenzoox-azolyl group, a triazolyl group, a tetrazolyl group, an oxadi-azolyl group, a triazinyl group, a dibenzofuranyl group, a dibenzothiophenyl group, a benzocarbazolyl group, or a dibenzocarbazolyl group; or a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthroli-nyl group, a phenazinyl group, a benzoimidazolyl group, a benzofuranyl group, a benzothiophenyl group, an isobenzo-thiazolyl group, a benzooxazolyl group, an isobenzoox-azolyl group, a triazolyl group, a tetrazolyl group, an oxadi-azolyl group, a triazinyl group, a dibenzofuranyl group, a dibenzothiophenyl group, a benzocarbazolyl group, or a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, or a dibenzothiophenyl group; and xe1 may be selected from 0, 1, 2, or 3; and xe2 may be selected from 1, 2, 3, or 4.

According to another embodiment of the present invention, the electron transport layer may further include at least one of compounds represented by Formula 602 below:

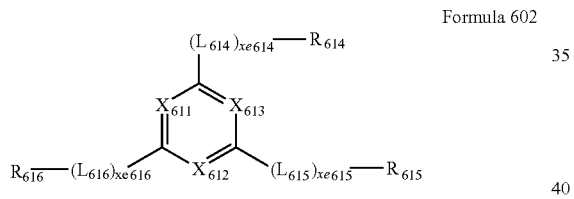

Formula 602 wherein in Formula 602, $X_{611}$ is N or C-$(L_{611})_{xe611}$-$R_{611}$, $X_{612}$ is N or C-$(L_{612})_{xe612}$-$R_{612}$, $X_{613}$ is N or C-$(L_{613})_{xe613}$-$R_{613}$; and at least one of $X_{611}$ to $X_{613}$ is N;

$L_{611}$ to $L_{616}$ may be understood by referring to the description provided herein in connection with $L_{201}$;

$R_{611}$ and $R_{616}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; and xe611 to xe616 may be each independently selected from 0, 1, 2, or 3.

The compound represented by Formula 601 and the compound represented by Formula 602 may include at least one of Compounds ET1 to ET15 illustrated below.

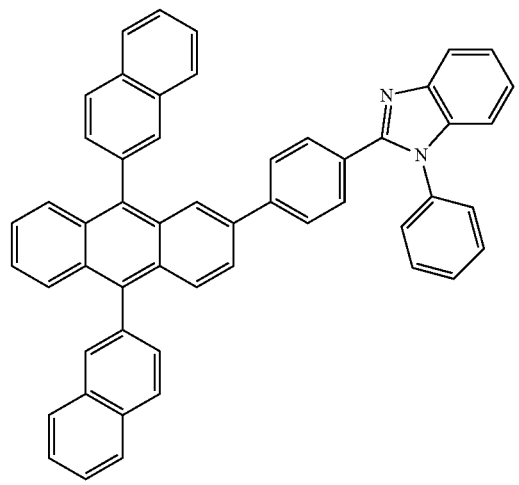

ET1

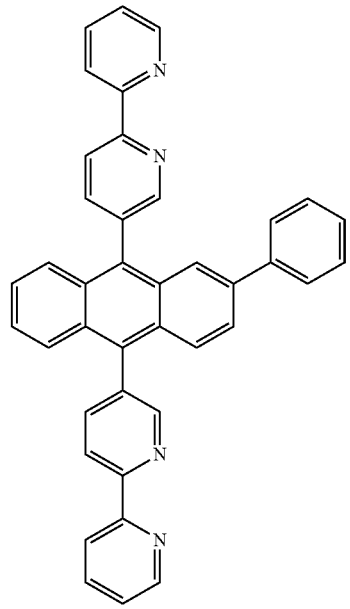

ET2

-continued
ET3
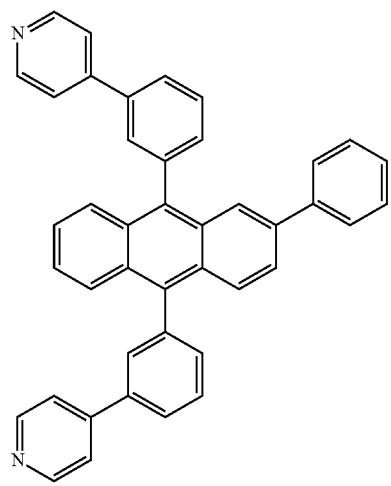
ET4
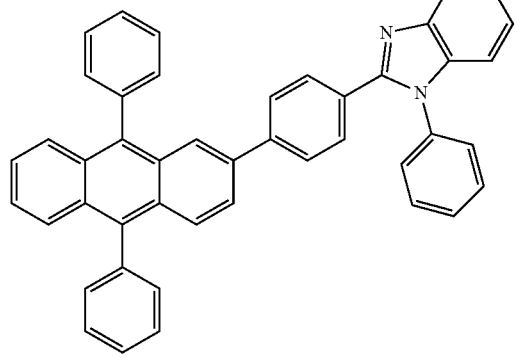
ET5
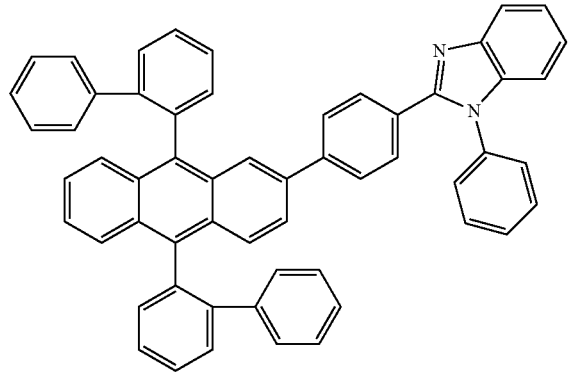
-continued
ET6
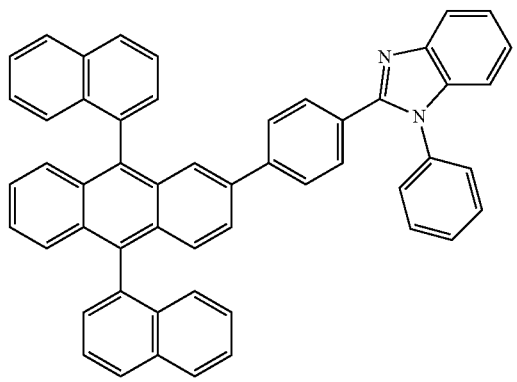
ET7
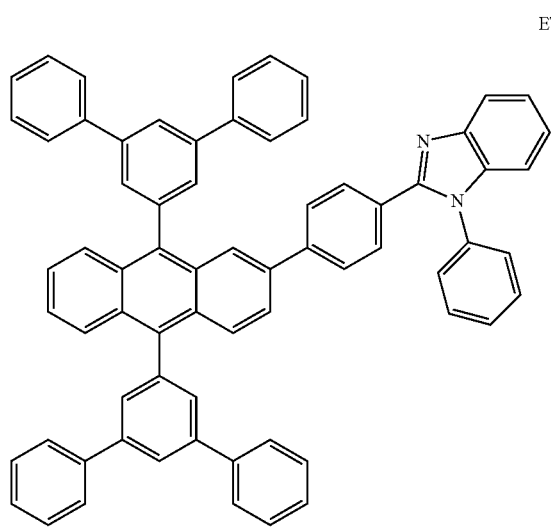
ET8
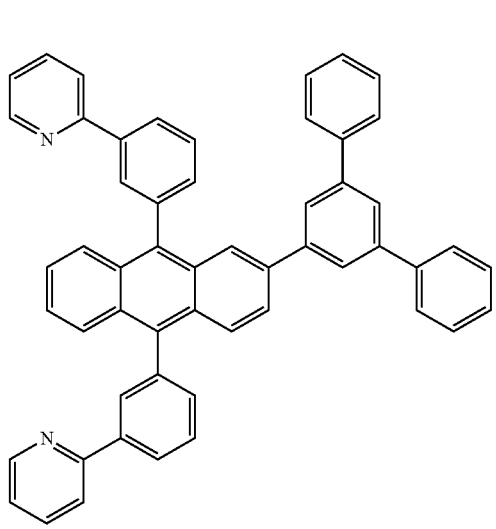

ET9
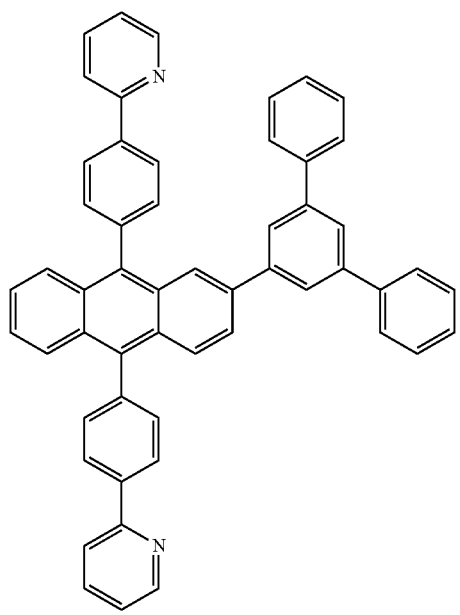
ET11
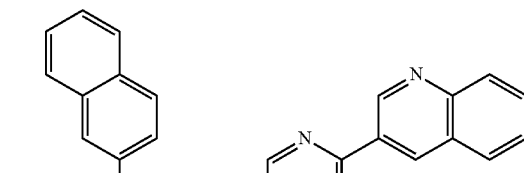
ET12
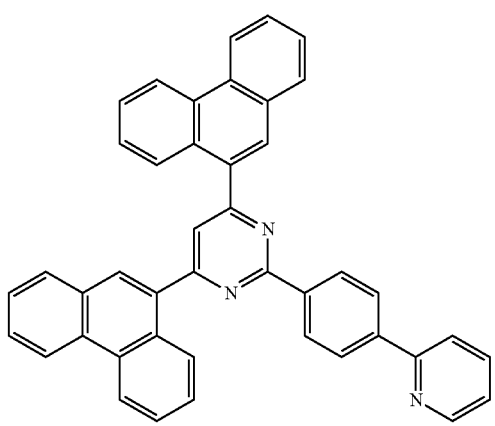
ET10
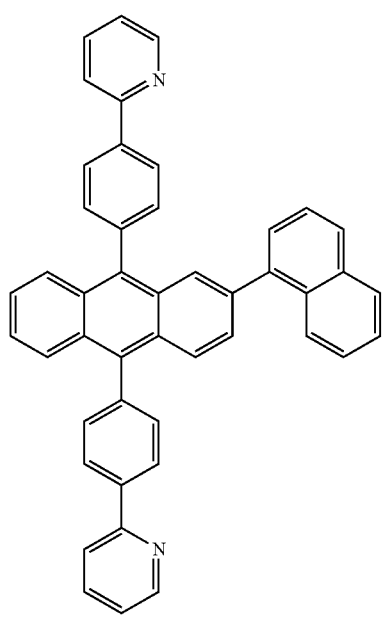
ET13
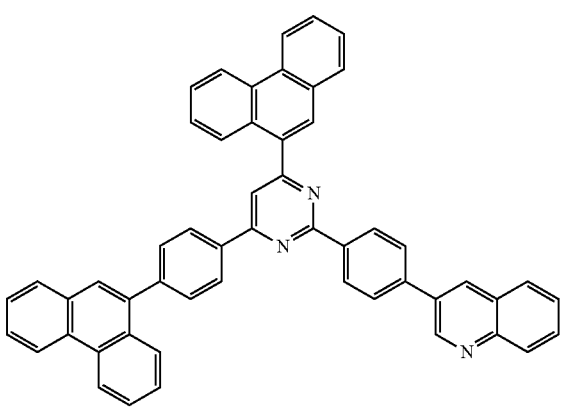

ET14

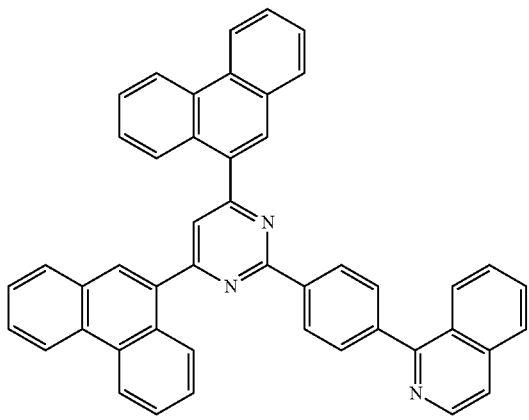

ET15

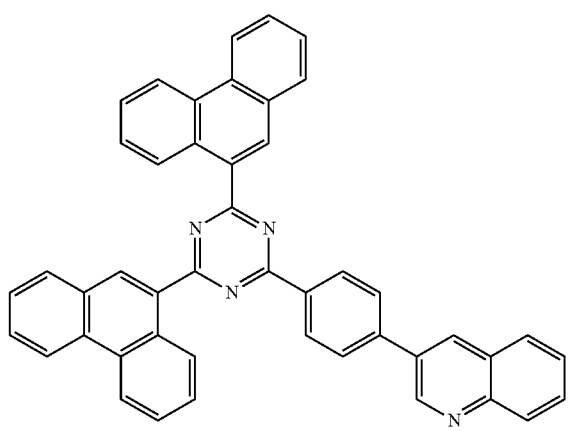

A thickness of the electron transport layer may be in a range of about 100 Å to about 1,000 Å, and in some embodiments, about 150 Å to about 500 Å. When the thickness of the electron transport layer is within the range described above, the electron transport layer may have satisfactory electron transportation characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or Compound ET-D2.

ET-D1

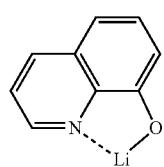

ET-D2

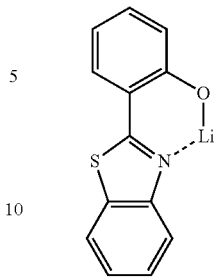

The electron transport region may include an electron injection layer that allows electrons to be easily provided from the second electrode 190.

The electron injection layer may be formed on the electron transport layer by using various methods, such as vacuum deposition, spin coating casting, a LB method, ink-jet printing, laser-printing, or laser-induced thermal imaging. When an electron injection layer is formed by vacuum deposition or spin coating, deposition and coating conditions for the electron injection layer may be determined by referring to the deposition and coating conditions for the hole injection layer.

The electron injection layer may include at least one selected from, LiF, NaCl, CsF, Li$_2$O, BaO, or LiQ.

A thickness of the electron injection layer may be in a range of about 1 Å to about 100 Å, and in some embodiments, about 3 Å to about 90 Å. When the thickness of the electron injection layer is within the ranges described above, the electron injection layer may have satisfactory electron transportation characteristics without a substantial increase in driving voltage.

The second electrode 190 is disposed on the organic layer 150. The second electrode 190 may be a cathode which is an electron injection electrode, and in this regard, a material for the second electrode 190 may be metal, an alloy, an electrically conductive compound, or a mixture thereof, which all have a relatively low work function. Non-limiting examples of the second electrode 190 are lithium (Li), magnesium (Mg), aluminum (Al), aluminum-lithium (Al—Li), calcium (Ca), magnesium-indium (Mg—In), and magnesium-silver (Mg—Ag). According to another embodiment of the present invention, the material for forming the second electrode 190 may be ITO or IZO. The second electrode 190 may be a reflective electrode, a semi-transmissive electrode, or a transmissive electrode.

Hereinbefore, the organic light-emitting device has been described with reference to the drawing, but embodiments of the invention are not limited thereto.

A C$_1$-C$_{60}$ alkyl group used herein refers to a linear or branched aliphatic hydrocarbon monovalent group having 1 to 60 carbon atoms, and non-limiting examples thereof are a methyl group, an ethyl group, a propyl group, an isobutyl group, a sec-butyl group, a ter-butyl group, pentyl group, an iso-amyl group, and a hexyl group. A C$_1$-C$_{60}$ alkylene group used herein refers to a divalent group having the same structure as the C$_1$-C$_{60}$ alkyl group.

A C$_1$-C$_{60}$ alkoxy group used herein refers to a monovalent group represented by —OA$_{101}$ (wherein A$_{101}$ is the C$_1$-C$_{60}$ alkyl group), and non-limiting examples thereof are a methoxy group, an ethoxy group, and an isopropyloxy group.

A C$_2$-C$_{60}$ alkenyl group used herein refers to a hydrocarbon group having at least one carbon double bond at one or more positions along a carbon chain of the $C_2$-$C_{60}$ alkyl group. For example, the $C_2$-$C_{60}$ alkenyl group may include a terminal alkene and/or an internal alkene. Non-limiting examples of the $C_2$-$C_{60}$ alkenyl group are an ethenyl group, a prophenyl group, and a butenyl group. A $C_2$-$C_{60}$ alkenylene used herein refers to a divalent group having the same structure as the $C_2$-$C_{60}$ alkenyl group.

A $C_2$-$C_{60}$ alkynyl group used herein refers to a hydrocarbon group having at least one carbon triple bond at one or more positions along a carbon chain of the $C_2$-$C_{60}$ alkyl group. For example, the $C_2$-$C_{60}$ alkynyl group may include a terminal alkyne and/or an internal alkyne. Non-limiting examples of the $C_2$-$C_{60}$ alkynyl group are an ethynyl group, and a propynyl group. A $C_2$-$C_{60}$ alkynylene group used herein refers to a divalent group having the same structure as the $C_2$-$C_{60}$ alkynyl group.

A $C_3$-$C_{10}$ cycloalkyl group used herein refers to a monovalent hydrocarbon monocyclic group having 3 to 10 carbon atoms, and non-limiting examples thereof are a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as the $C_3$-$C_{10}$ cycloalkyl group.

A $C_3$-$C_{10}$ heterocycloalkyl group used herein refers to a monovalent monocyclic group having at least one heteroatom selected from N, O, P, or S as a ring-forming atom and 3 to 10 carbon atoms as the remaining ring atoms, and non-limiting examples thereof are tetrahydrofuranyl and tetrahydrothiophenyl. A $C_3$-$C_{10}$ heterocycloalkylene group used herein refers to a divalent group having the same structure as the $C_3$-$C_{10}$ heterocycloalkyl group.

A $C_3$-$C_{10}$ cycloalkenyl group used herein refers to a monovalent monocyclic group that has 3 to 10 carbon atoms and at least one double bond in the ring thereof and does not have aromaticity, and non-limiting examples thereof are a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_3$-$C_{10}$ heterocycloalkenyl group used herein refers to a monovalent monocyclic group that has at least one heteroatom selected from N, O, P, or S as a ring-forming atom, 3 to 10 carbon atoms as the remaining ring atoms, and at least one double bond in its ring. Non-limiting examples of the $C_3$-$C_{10}$ heterocycloalkenyl group are 2,3-hydrofuranyl and 2,3-hydrothiophenyl. A $C_3$-$C_{10}$ heterocycloalkenylene group used herein refers to a divalent group having the same structure as the $C_3$-$C_{10}$ heterocycloalkenyl group.

A $C_6$-$C_{60}$ aryl group used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Non-limiting examples of the $C_6$-$C_{60}$ aryl group are a phenyl group, a naphthyl group, an anthracenyl group, a phenanthrenyl group, a pyrenyl group, and a chrysenyl group. When the $C_6$-$C_6$ aryl group or the $C_6$-$C_6$ arylene group each include two or more rings, the rings may be fused to each other or connected to each other via a single bond.

A $C_2$-$C_{60}$ heteroaryl used herein refers to a monovalent group having a carbocyclic aromatic system that has at least one heteroatom selected from N, O, P, and S as a ring-forming atom, and 2 to 60 carbon atoms as the remaining ring atoms. A $C_2$-$C_{60}$ heteroarylene used herein refers to a divalent group having a carbocyclic aromatic system that has at least one heteroatom selected from N, O, P, and S as a ring-forming atom, and 2 to 60 carbon atoms as the remaining ring atoms. Non-limiting examples of the $C_2$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl or the $C_2$-$C_{60}$ heteroarylene each include two or more rings, the rings may be fused to each other or connected to each other via a single bond.

A $C_6$-$C_{60}$ aryloxy used herein indicates —$OA_{102}$ (wherein $A_{102}$ is the $C_6$-$C_{60}$ aryl group), and a $C_6$-$C_{60}$ arylthio indicates —$SA_{103}$ (wherein $A_{103}$ is the $C_6$-$C_{60}$ aryl group).

A monovalent non-aromatic condensed polycyclic group used herein refers to a monovalent group that has two or more rings condensed to each other, only carbon atoms as ring forming atoms, and does not have overall aromaticity. Non-limiting example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic hetero-condensed polycyclic group used herein refers to a monovalent group that has two or more rings condensed to each other, has at least one heteroatom selected from N, O P, and S, other than carbon atoms, as a ring forming atom, and does not have overall aromaticity. Non-limiting example of the monovalent non-aromatic hetero-condensed polycyclic group is a carbazolyl group. A divalent non-aromatic hetero-condensed polycyclic group used herein refers to a divalent group having the same structure as the monovalent non-aromatic hetero-condensed polycyclic group.

At least one substituent of the substituted $C_3$-$C_{10}$ cycloalkylene group, the substituted $C_3$-$C_{10}$ heterocycloalkylene group, the substituted $C_3$-$C_{10}$ cycloalkenylene group, the substituted $C_3$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_3$-$C_{10}$ heterocycloalkyl group, the substituted $C_3$-$C_{10}$ cycloalkenyl group, the substituted $C_3$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, the substituted monovalent non-aromatic hetero-condensed polycyclic group, the substituted $C_3$-$C_{60}$ cyclic moiety, or the substituted $C_2$-$C_{60}$ heterocyclic moiety may be selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pycenyl group, a chrysenyl group, a naphthacenyl group, a pycenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, $-N(Q_{11})(Q_{12})$, $-Si(Q_{13})(Q_{14})(Q_{15})$, or $-B(Q_{16})(Q_{17})$;

a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, or an imidazopyridinyl group;

a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, or an imidazopyridinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, $-N(Q_{21})(Q_{22})$, $-Si(Q_{23})(Q_{24})(Q_{25})$ or $-B(Q_{26})(Q_{27})$, or $-N(Q_{31})(Q_{32})$, $-Si(Q_{33})(Q_{34})(Q_{35})$, or $-B(Q_{36})(Q_{37})$; and $Q_{11}$ to $Q_{17}$, $Q_{21}$ to $Q_{27}$, and $Q_{31}$ to $Q_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, or an imidazopyridinyl.

The term "Ph" used herein refers to phenyl group.

Hereinafter, an organic light-emitting device according to an embodiment of the present invention will be described in detail with reference to Synthesis Examples and Examples. The wording "B was used instead of A" used in describing Synthesis Examples means that a molar equivalent of A was identical to a molar equivalent of B.

SYNTHESIS EXAMPLE

Intermediates 1-8, 1-9, 1-10, 1-12, 2-8, and 2-10

Intermediate 1-8

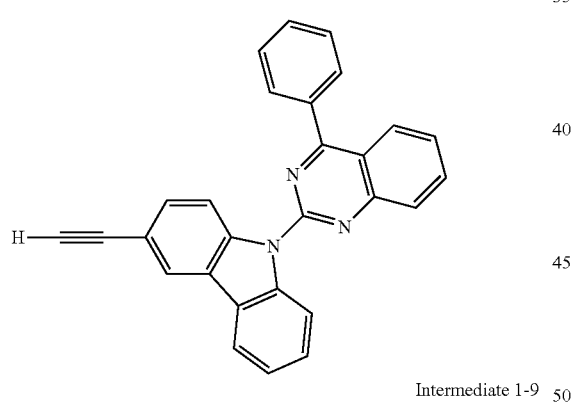

Intermediate 1-9

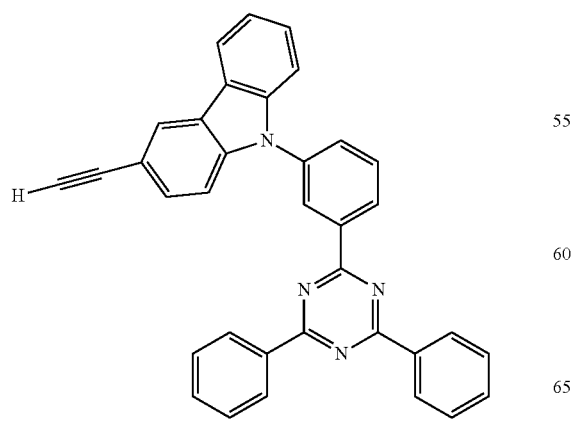

Intermediate 1-10

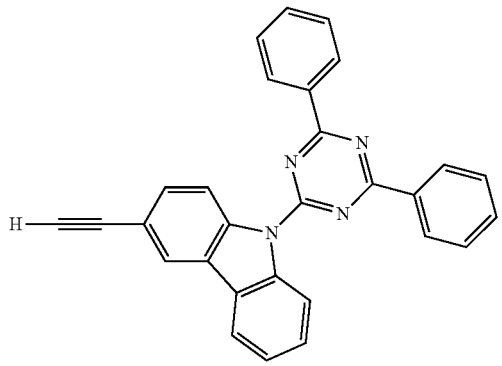

Intermediate 1-12

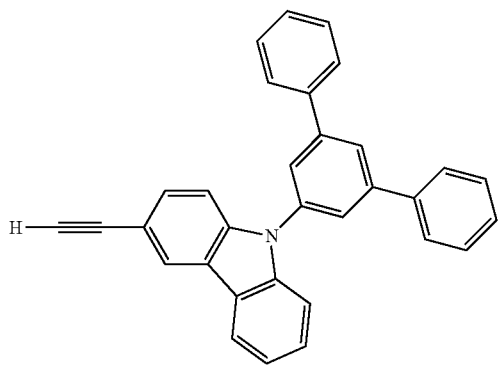

Intermediate 2-8

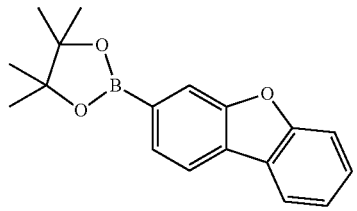

Intermediate 2-10

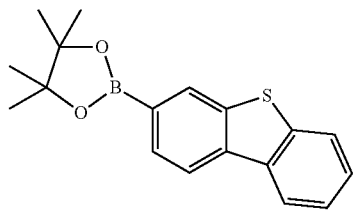

Synthesis Example 1

Synthesis of Compound H8

Compound H8 was synthesized according to the following Reaction Scheme:

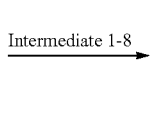 →^{Intermediate 1-8}

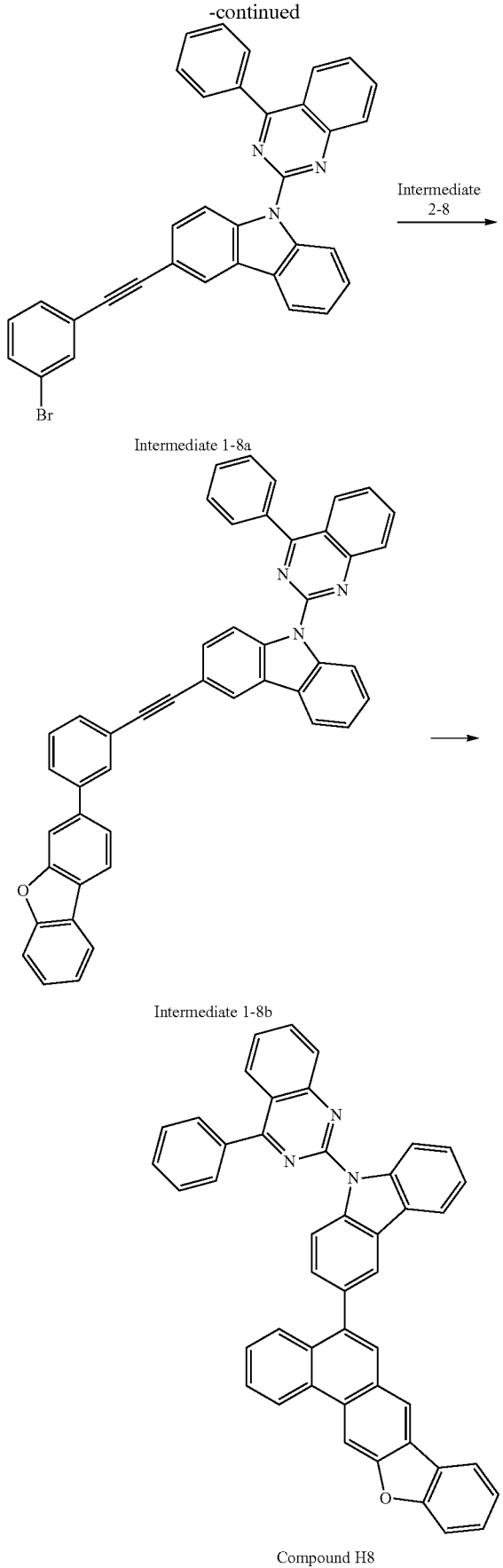

Intermediate 1-8a

Intermediate 1-8b

Compound H8

Synthesis of Intermediate 1-8a 5.15 g (1.2 eq) of 3-bromoiodobenzene, 530 mg (0.05 eq) of bis(chloro(triphenylphosphine))palladium (PdCl$_2$(PPh$_3$)$_2$), and 180 mg (0.06 eq) of CuI were mixed, and then the mixture was placed in a vacuum condition and then in an N$_2$ atmosphere. 70 mL of THF was added to the mixture and stirred, and 8.5 mL (4 eq) of triethylamine and 6 g(1 eq) of Intermediate 1-8 were slowly dropped thereto, and then, the resultant mixture was stirred in an N$_2$ atmosphere and an oxygen condition for 2 hours. A solvent was removed from the obtained result by using a rotating evaporator, and 50 mL of water was added to the reaction solution, and then, the resultant solution was extracted three times by using 100 mL of ethylether. An organic layer obtained therefrom was dried by using magnesium sulfate, and a solvent was removed therefrom, and the obtained residual was separation-purified by silicagel column chromatography to obtain Intermediate 1-8a (3.4 g, yield of 38%).

Synthesis of Intermediate 1-8b 3.0 g of Intermediate 1-8a, 1.8 g (1.2 eq) of Intermediate 2-8, 250 mg (0.07 eq) of Pd(PPh$_3$)$_4$, and 2.0 g (3.0 eq) of K$_2$CO$_3$ were mixed with 60 mL of THF and 30 mL of distilled water, and then, the mixture was heated up to the temperature of 70° C., and then, stirred for 24 hours while refluxing. The obtained mixture was cooled to room temperature, and then, extracted three times by using 100 mL of water and 100 mL of dichloromethane. An organic layer obtained therefrom was dried by using magnesium sulfate and a solvent was evaporated therefrom, and the obtained residual was separation-purified by silicagel column chromatography to obtain Intermediate 1-8b (2.0 g, yield of 65%).

Synthesis of Compound H8

2.0 g of Intermediate 1-8b was mixed with 100 mL of dichloromethane, and 7.5 mL (30 eq) of trifluoroacetic acid was slowly dropped thereto, and the mixture was stirred at room temperature for 16 hours. When the reaction stopped, 100 mL of water and 100 mL of dichloromethane were added to the reaction solution, and then the resultant solution was extracted three times. An organic layer obtained therefrom was dried by using magnesium sulfate, and a solvent was removed therefrom, and the obtained residual was separation-purified by silicagel column chromatography to obtain Compound H8 (1.2 g, yield of 60%). The obtained compound was identified by LC-MS and $^1$H NMR.

LC-MS m/z=638(M+H)$^+$ $^1$H NMR (300 MHz, CDCl$_3$) δ=9.08 (d, 1H), 8.95 (s, 1H), 8.63 (d, 1H), 8.31-8.25 (m, 2H), 8.17-8.10 (m, 2H), 8.07 (s, 1H), 7.99-7.85 (m, 4H), 7.75-7.70 (m, 5H), 7.68-7.31 (m, 6H), 7.28-7.25 (m, 3H), 7.15-7.13 (m, 1H)

Synthesis Example 2

Synthesis of Compound H9

Compound H9 was synthesized according to the following Reaction Scheme:

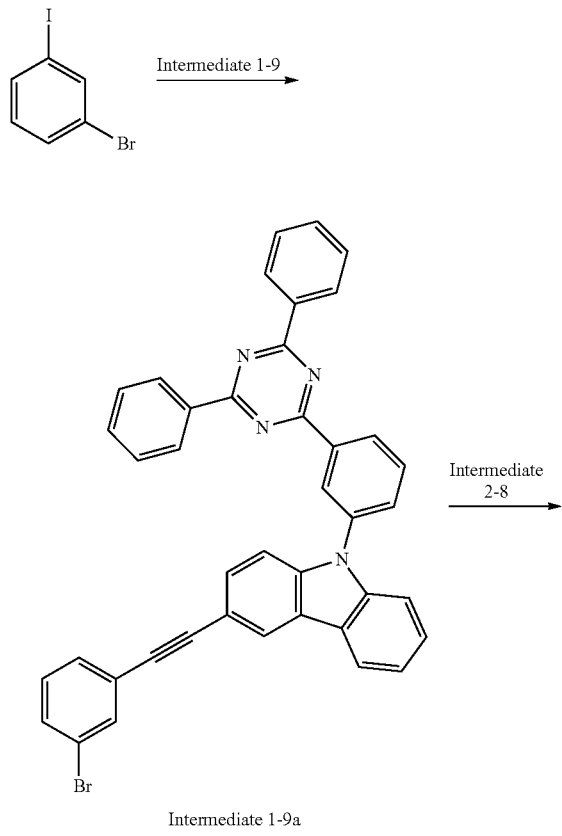

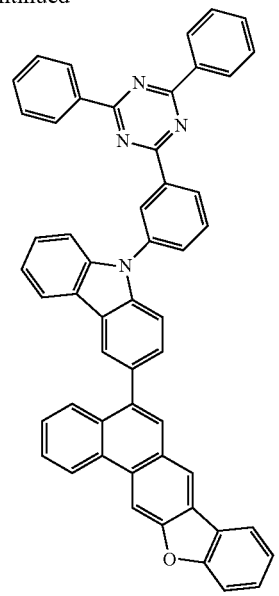

Compound H9

Synthesis of Intermediate 1-9a

Intermediate 1-9a (yield of 4 g, 25%) was synthesized in the same manner as in synthesizing Intermediate 1-8a, except that Intermediate 1-9 was used instead of Intermediate 1-8.

Synthesis of Intermediate 1-9b

Intermediate 1-9b (2.2 g, yield of 48%) was synthesized in the same manner as in synthesizing Intermediate 1-8b, except that Intermediate 1-9a was used instead of Intermediate 1-8a.

Synthesis of Compound H9

Compound H9 (1.1 g, yield of 52%) was synthesized in the same manner as in synthesizing Compound H8 in the Synthesis Example 1, except that Intermediate 1-9b was used instead of Intermediate 1-8b. The obtained compound was identified by LC-MS and $^1$H NMR.

LC-MS m/z=741(M+H)$^+$ $^1$H NMR (300 MHz, CDCl$_3$) δ=9.03 (d, 1H), 8.97 (s, 1H), 8.52 (d, 1H), 8.42-8.14 (m, 6H), 8.10 (s, 1H), 8.05 (s, 1H), 7.99-7.92 (m, 5H), 7.75-7.65 (m, 5H), 7.63-7.56 (m, 5H), 7.23-7.20 (m, 3H), 7.13-7.10 (m, 1H)

Synthesis Example 3

Synthesis of Compound H10

Compound H10 was synthesized according to the following Reaction Scheme:

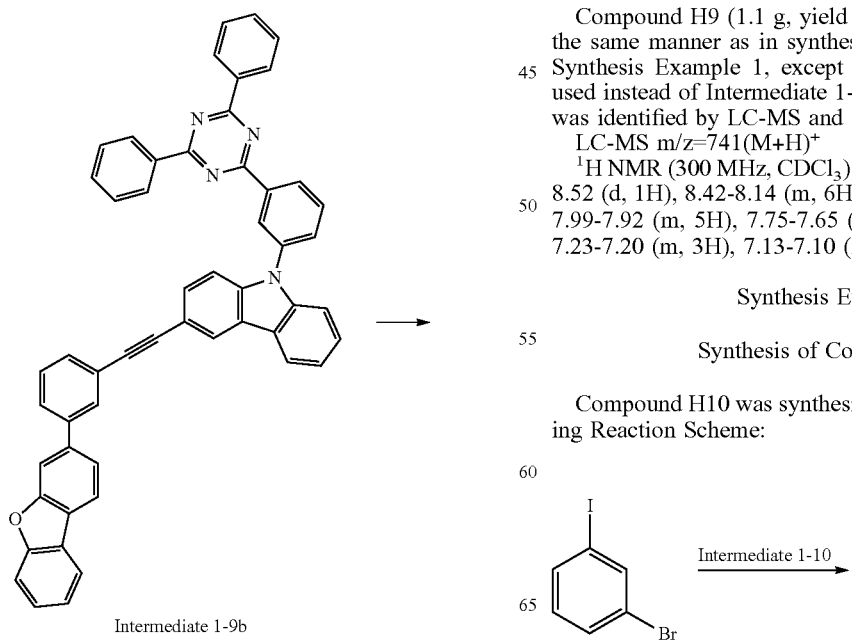

Synthesis of Intermediate 1-10a

Intermediate 1-10a (yield of 3.5 g, 32%) was synthesized in the same manner as in synthesizing Intermediate 1-8a, except that Intermediate 1-10 was used instead of Intermediate 1-8.

Synthesis of Intermediate 1-10b

Intermediate 1-10b (1.6 g, yield of 40%) was synthesized in the same manner as in synthesizing Intermediate 1-8b, except that Intermediate 1-10a and Intermediate 2-10 were used instead of Intermediate 1-8a and Intermediate 2-8.

Synthesis of Compound H10

Compound H10 (0.85 g, yield of 52%) was synthesized in the same manner as in synthesizing Compound H8 of the Synthesis Example 1, except that Intermediate 1-10b was used instead of Intermediate 1-8b. The obtained compound was identified by LC-MS and $^1$H NMR.

LC-MS m/z=681(M+H)$^+$ $^1$H NMR (300 MHz, CDCl$_3$) δ=9.07 (d, 1H), 8.96 (s, 1H), 8.76 (d, 1H), 8.73 (d, 1H), 8.72-8.68 (m, 2H), 8.42 (d, 1H), 8.16 (s, 1H), 8.10 (s, 1H), 8.08-7.98 (m, 6H), 7.68-7.24 (m, 10H), 7.19-7.16 (m, 11-1), 7.13-7.10 (m, 1H)

Synthesis Example 4

Synthesis of Compound H12

Compound H12 was synthesized according to the following Reaction Scheme:

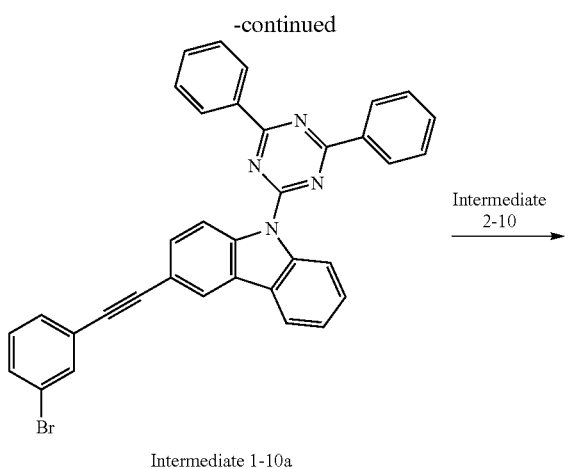
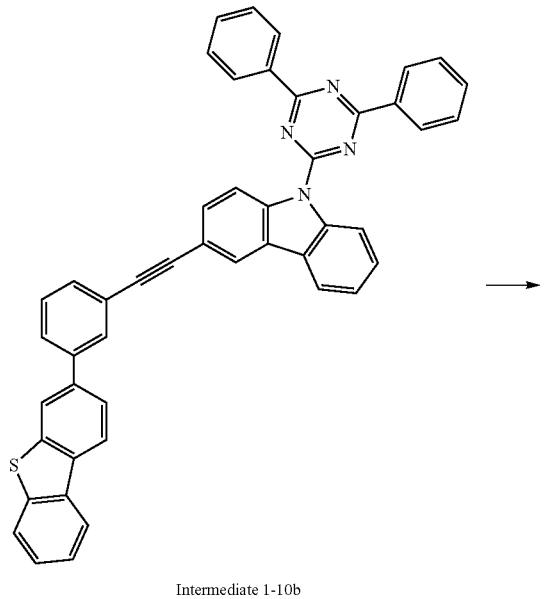
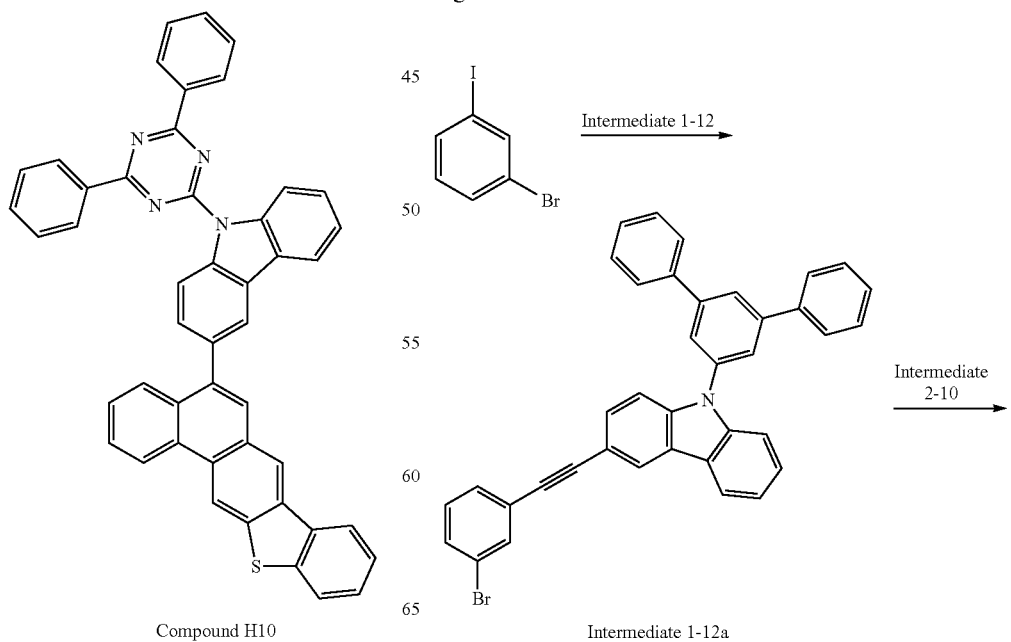

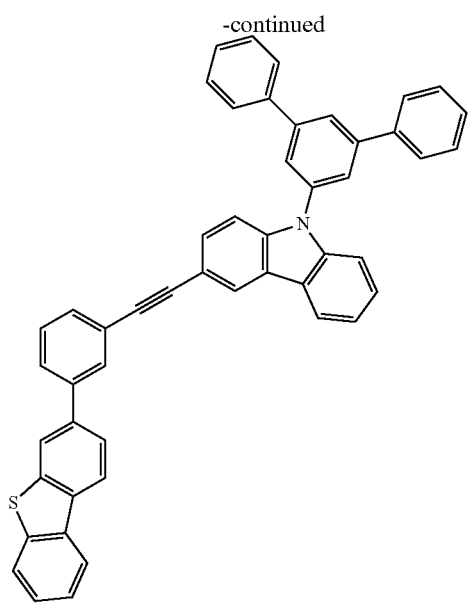

Intermediate 1-12b

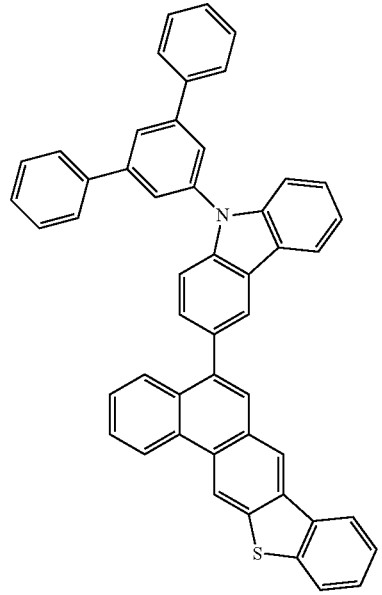

Compound H12

Synthesis of Intermediate 1-12a

Intermediate 1-12a (yield of 4.0 g, 61%) was synthesized in the same manner as in synthesizing Intermediate 1-8a, except that Intermediate 1-12 was used instead of Intermediate 1-8.

Synthesis of Intermediate 1-12b

Intermediate 1-12b (1.9 g, yield of 40%) was synthesized in the same manner as in synthesizing Intermediate 1-8b, except that Intermediate 1-12a and Intermediate 2-10 were used instead of Intermediate 1-8a and Intermediate 2-8.

Synthesis of Compound H12

Compound H12 (0.5 g, yield of 25%) was synthesized in the same manner as in synthesizing Compound H8 of the Synthesis Example 1, except that Intermediate 1-12b was used instead of Intermediate 1-8b. The obtained compound was identified by LC-MS and $^1$H NMR.

LC-MS m/z=678(M+H)$^+$ $^1$H NMR (300 MHz, CDCl$_3$) δ=9.02 (d, 1H), 8.98 (s, 1H), 8.74 (d, 1H), 8.71 (d, 1H), 8.73-8.69 (m, 2H), 8.21 (s, 1H), 8.18 (s, 1H), 8.03-7.86 (m, 5H), 7.71-7.51 (m, 5H), 7.50-7.23 (m, 12H), 7.12-7.10 (m, 1H)

Synthesis Example 5

Synthesis of Compound D10

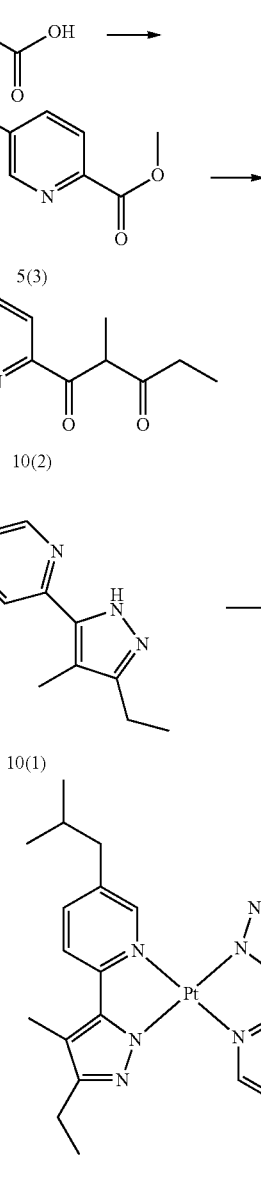

Compound D10

Synthesis of Intermediate 5(3)

25.7 g (143.6 mmol) of 5-isobutyl-pyridine-2-carboxylic acid was dissolved in 100 mL of methanol, and then, 5 mL of a strong sulfuric acid was added thereto, and the result was refluxed at a temperature of 80° C. for 18 hours while heating. When the reaction stopped, the reaction mixture was concentrated under reduced pressure, and then, mixed with 100 mL of dichloromethane, and then, at a temperature of 0° C., a saturated sodium hydrocarbon aqueous solution was slowly added thereto to make basic, and then extracted. An organic layer obtained therefrom was dried by using magnesium sulfate, and then, distilled under reduced pressure to obtain 26.0 g (137.8 mmol, yield of 96%) of Intermediate 5(3).

LC-MS m/z=194(M+H)$^+$ $^1$H NMR (500 MHz, CDCl$_3$) δ=8.87 (s, 1H), 8.31 (d, 1H), 8.19 (d, 1H), 3.92 (s, 3H), 2.55 (d, 2H), 2.01-1.99 (m, 1H), 1.01 (d, 6H).

Synthesis of Intermediate 10(2)

1.0 g (43.4 mmol) of NaH was added to 80 mL of anhydrous tetrahydrofurane, and then, at a temperature of 0° C., 4.5 mL (34.8 mmol) of 3-pentanone was slowly added thereto. After about 1 hour, 5.6 g (29.0 mmol) of Intermediate 5(3) was slowly added thereto, and then, at a temperature of about 80° C., the resultant mixture was refluxed for 16 hours while heating. When the reaction stopped, 30 mL of distilled water was added thereto, and the reaction solution was neutralized by slowly adding 4N dilute hydrochloric acid aqueous solution thereto, and then, extracted 5 times by using 100 mL of dichloromethane. The organic layer obtained therefrom was dried by using magnesium sulfate, and evaporated under reduced pressure, and separation-purified by column chromatography to obtain Intermediate 10(2) (yield of 51%). The obtained compound was identified by LC-MS.

LC-MS m/z=248(M+1-1)$^+$

Synthesis of Intermediate 10(1)

At room temperature, 3.6 g (13.9 mmol) of Intermediate 10(2) was dissolved in 50 mL of ethanol, and then, 4.0 mL (140.0 mmol) of hydrazine hydrate was added thereto, and at a temperature of 80° C., the mixture was refluxed for about 18 hours while heating, and then, concentrated under reduced pressure, and extracted with 80 mL of distilled water and 100 mL of dichloromethane. The organic layer obtained therefrom was dried by using magnesium sulfate, and evaporated under reduced pressure, and separation-purified by column chromatography to obtain Intermediate 10(1) (yield of 65%). The obtained compound was identified by LC-MS and $^1$H NMR.

LC-MS m/z=244(M+H)$^+$ $^1$H NMR (500 MHz, CDCl$_3$) δ=8.41 (s, 1H), 7.35 (d, 1H), 7.11 (d, 1H), 2.48 (q, 2H), 2.45 (d, 2H), 2.22-2.21 (m, 1H), 2.06 (s, 3H), 1.25 (t, 3H), 1.03 (t, 6H)

Synthesis of Compound D10

At room temperature, 0.6 g (2.5 mmol) of Intermediate 10(1) was dissolved in a mixed solvent of 30 mL of ethanol and 10 mL of distilled water, and then, 0.5 g (1.2 mmol) of K$_2$PtC$_{14}$ was added thereto, and refluxed for 18 hours while heating. Whether the reaction stopped was confirmed by LC-MS, and the reaction product was filtered to obtain Compound D10 (yield of 65%). The obtained product was identified by LC-MS and $^1$H NMR.

LC-MS m/z=666(M+H)$^+$ $^1$H NMR (500 MHz, CDCl$_3$) δ=10.74 (s, 1H), 8.63 (d, 1H), 8.31 (d, 1H), 2.38 (q, 2H), 2.32 (d, 2H), 2.22-2.21 (m, 1H), 2.13 (s, 3H), 1.21 (t, 3H), 1.00 (t, 6H)

Synthesis Example 6

Synthesis of Compound D26

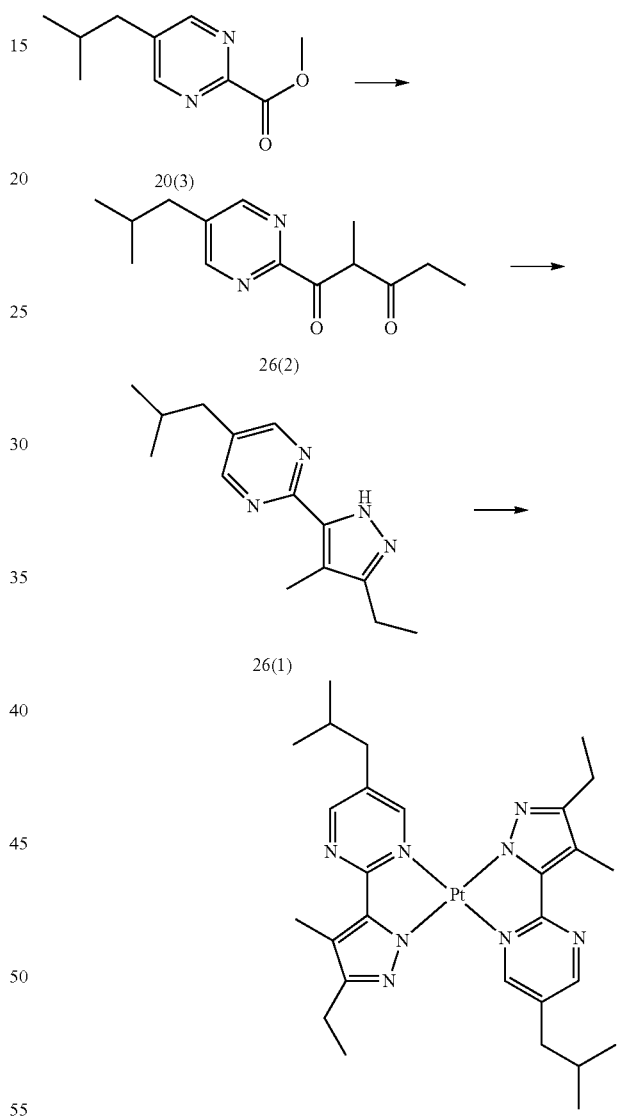

Compound D26

Synthesis of Intermediate 26(21

Intermediate 26(2) (yield of 47%) was synthesized in the same manner as in synthesizing Intermediate 10(2) of Synthesis Example 5, except that Intermediate 20(3) was used instead of Intermediate 5(3). The obtained compound was identified by LC-MS.

LC-MS m/z=249(M+H)$^+$

Synthesis of Intermediate 26(1)

Intermediate 26(1) (yield of 52%) was synthesized in the same manner as in synthesizing Intermediate 10(1) of Synthesis Example 5, except that Intermediate 26(2) was used instead of Intermediate 10(2). The obtained compound was identified by LC-MS.

LC-MS m/z=245(M+H)$^+$

Synthesis of Compound D26

Intermediate D26 (yield of 55%) was synthesized in the same manner as in synthesizing Compound D10 of Synthesis Example 5, except that Intermediate 26(1) was used instead of Intermediate 10(1). The obtained product was identified by LCMS and $^1$H NMR.

LC-MS m/z=682(M+H)$^+$ $^1$H NMR (500 MHz, CDCl$_3$) δ=10.75 (s, 1H), 8.58 (s, 1H), 2.69 (q, 2H), 2.58 (d, 2H), 2.40 (s, 3H), 2.05-2.02 (m, 1H), 1.37 (t, 3H), 1.02 (d, 6H).

Synthesis Example 7

Synthesis of Compound D20

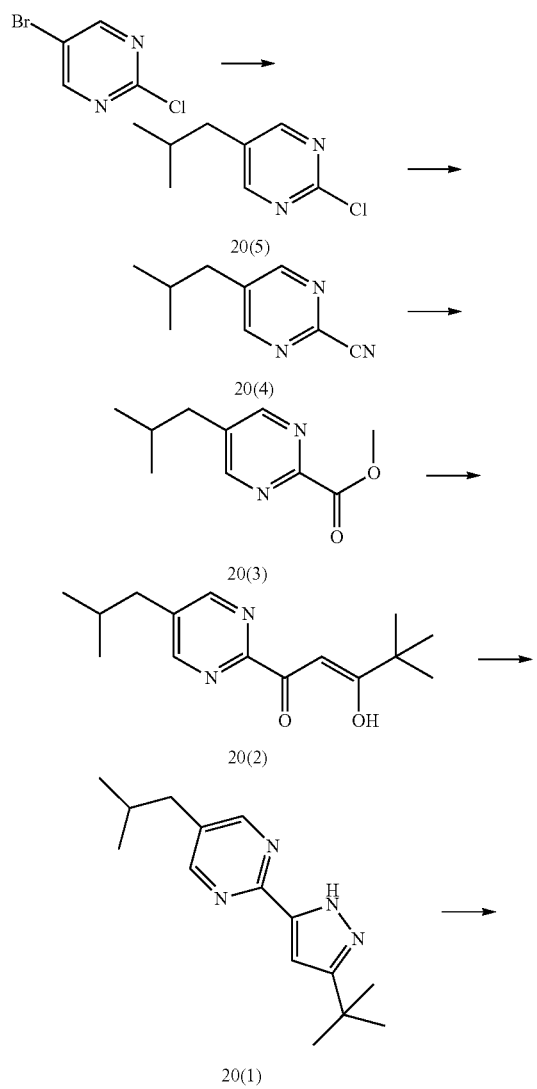

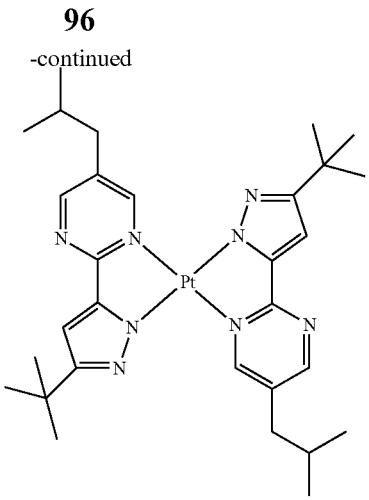

Compound D20

Synthesis of Intermediate 20(5)

5 g (25.9 mmol) of 5-bromo-2-chloropyrimidine, 3.1 g (31.0 mmol) of (2-methylpropyl)boronic acid, 0.9 g (3.8 mmol) of Pd(OAc)$_2$, 1.4 g (5.2 mmol) of tricyclohexyl phosphine, and 16.5 g (78 mmol) of K$_3$PO$_4$ were dissolved in a mixed solution of 90 mL of toluene and 6 mL of water, and then, at a temperature of 80° C., the mixture was refluxed for 18 hours while heating. When the reaction stopped, the reaction solution was filtered through celit, and then, distilled under reduced pressure, and the reaction mixture was separation-purified by column chromatography to obtain 2.2 g (12.7 mmol, yield of 49%) of Intermediate 20(5).

LC-MS m/z=171(M+H)$^+$ $^1$H NMR (500 MHz, CDCl$_3$) δ=8.43 (s, 2H), 2.47 (d, 2H), 1.91-1.83 (m, 1H), 0.94 (d, 6H).

Synthesis of Intermediate 20(4)

2.2 g (12.9 mmol) of Intermediate 20(5) was dissolved in 12 mL of DMSO and 12 mL of water, and then, 0.7 g (14.1 mmol) of NaCN and 0.3 g (2.6 mmol) of DABCO were added thereto, and at room temperature, the mixture was stirred for 2 hours, and then heated at a temperature of 80° C. for 16 hours. When the reaction stopped, the reaction solution was extracted by using water and EA, and then, dried by using magnesium sulfate, and the obtained reaction mixture was distilled under reduced pressure to obtain 2.0 g (12.2 mmol, yield of 95%) of Intermediate 20(4).

LC-MS m/z=162(M+H)$^+$ $^1$H NMR (500 MHz, CDCl$_3$) δ=8.64 (s, 2H), 2.57 (d, 2H), 1.96-1.91 (m, 1H), 0.96 (d, 6H).

Synthesis of Intermediate 20(3)

2.0 g (12.2 mmol) of Intermediate 20(4) was dissolved in 40 ml of methanol, and then, the mixture was added to 10 mL of 35% HCl, and then, at a temperature of 80° C., the resultant mixture was refluxed for about 18 hours while heating. When the reaction stopped, the reaction mixture obtained by distillation under reduced pressure was dissolved in dichloromethane, and then, neutralized by using a saturated sodium hydrocarbonate aqueous solution, and extracted to obtain an organic layer, which was then dried by using magnesium sulfate, and purified by column chromatography to obtain 1.0 g (5.1 mmol, yield of 42%) of Intermediate 20(3).

LC-MS m/z=195(M+H)$^+$

Synthesis of Intermediate 20(2)

Intermediate 20(2) (yield of 60%) was synthesized in the same manner as in synthesizing Intermediate 10(2) of Synthesis Example 5, except that Intermediate 20(3) and LiH-MDS were respectively used instead of Intermediate 5(3) and NaH. The obtained compound was identified by LC-MS.

LC-MS m/z=263(M+H)$^+$

Synthesis of Intermediate 20(1)

Intermediate 20(1) (yield of 55%) was synthesized in the same manner as in synthesizing Intermediate 10(1) of Synthesis Example 5, except that Intermediate 20(2) was used instead of Intermediate 10(2). The obtained compound was identified by LC-MS.

LC-MS m/z=259(M+H)$^+$

Synthesis of Compound D20

Intermediate D$_2$O (yield of 75%) was synthesized in the same manner as in synthesizing Compound D10 of Synthesis Example 5, except that Intermediate 20(1) was used instead of Intermediate 10(1). The obtained product was identified by LCMS and $^1$H NMR.

LC-MS m/z=710(M+H)$^+$ $^1$H NMR (500 MHz, CDCl$_3$) δ=10.59 (s, 1H), 8.49 (s, 1H), 6.78 (s, 1H), 2.43 (d, 2H), 2.26-2.23 (m, 1H), 1.29 (s, 9H), 1.05 (s, 6H)

Synthesis Example 8

Synthesis of Compound D30

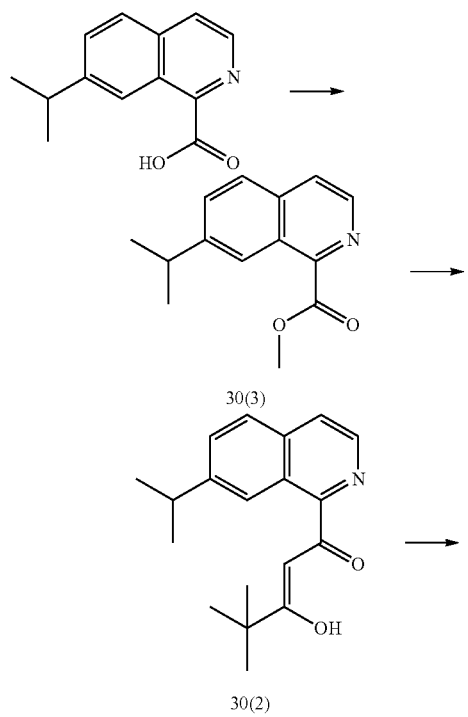

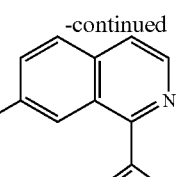

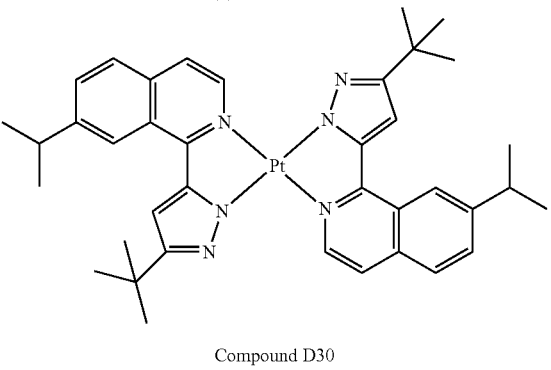

Compound D30

Synthesis of Intermediate 30(3)

Intermediate 30(3) (yield of 95%) was synthesized in the same manner as in synthesizing Intermediate 5(3) of Synthesis Example 5, except that 7-isopropyl-isoquinoline-1-carboxylic acid was used instead of 5-isobutyl-pyridin-2-carboxylic acid.

The obtained compound was identified by LC-MS.

LC-MS m/z=230(M+H)$^+$

Synthesis of Intermediate 30(2)

Intermediate 30(2) (yield of 41%) was synthesized in the same manner as in synthesizing Intermediate 10(2) of Synthesis Example 5, except that Intermediate 30(3) was used instead of Intermediate 5(3). The obtained compound was identified by LC-MS.

LC-MS m/z=298(M+H)$^+$

Synthesis of Intermediate 30(1)

Intermediate 30(1) (yield of 63%) was synthesized in the same manner as in synthesizing Intermediate 10(1) of Synthesis Example 5, except that Intermediate 30(2) was used instead of Intermediate 10(2). The obtained compound was identified by LC-MS.

LC-MS m/z=294(M+H)$^+$

Synthesis of Compound D30

Intermediate D30 (yield of 46%) was synthesized in the same manner as in synthesizing Compound 010 of Synthesis Example 5, except that Intermediate 30(1) was used instead of Intermediate 10(1). The obtained product was identified by LCMS and $^1$H NMR.

LC-MS m/z=780(M+H)$^+$ $^1$H NMR (500 MHz, CDCl$_3$) δ=8.62 (d, 1H), 7.72-7.43 (m, 4H), 6.74 (s, 1H), 3.16-3.14 (m, 1H), 1.33 (s, 9H), 1.27 (s, 6H).

Synthesis Example 9

Synthesis of Compound D31

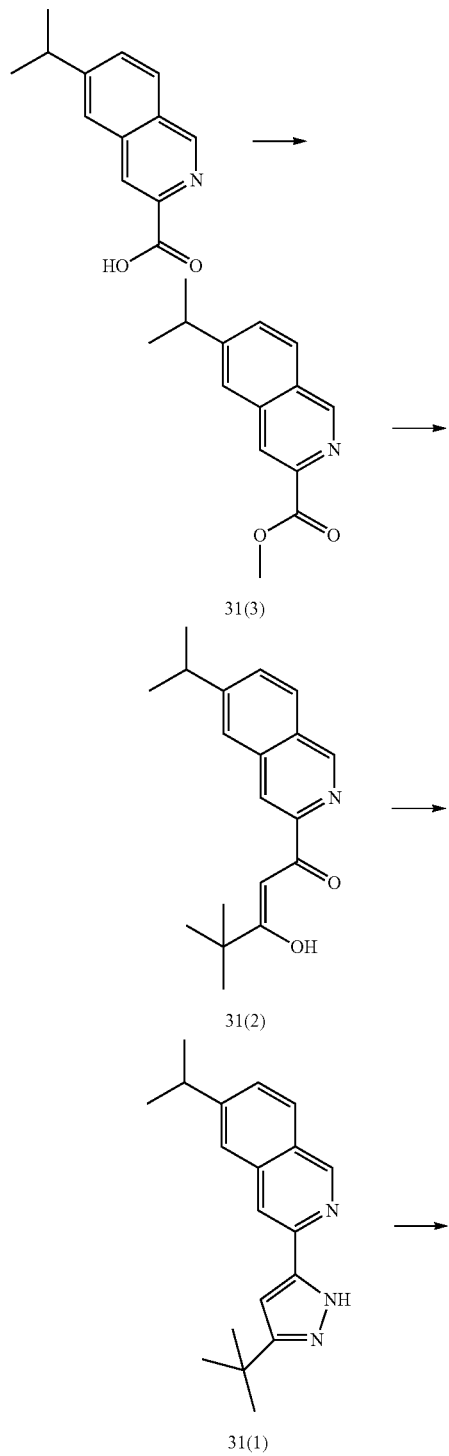

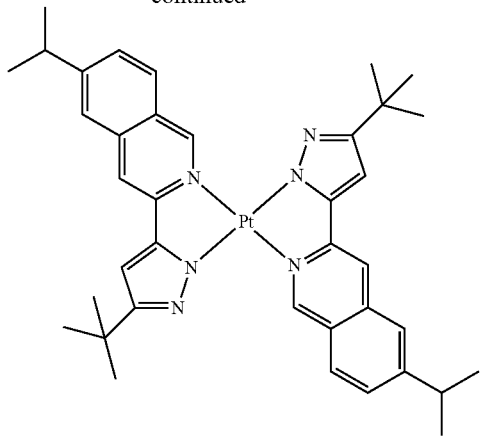

Compound D31

Synthesis of Intermediate 31(3)

Intermediate 31(3) (yield of 96%) was synthesized in the same manner as in synthesizing Intermediate 5(3) of Synthesis Example 1, except that 6-Isopropyl-isoquinoline-3-carboxylic acid was used instead of 5-isobutyl-pyridin-2-carboxylic acid. The obtained compound was identified by LC-MS.

LC-MS m/z=230(M+H)$^+$

Synthesis of Intermediate 31(2)

Intermediate 31(2) (yield of 45%) was synthesized in the same manner as in synthesizing Intermediate 10(2) of Synthesis Example 5, except that Intermediate 31(3) was used instead of Intermediate 5(3). The obtained compound was identified by LC-MS.

LC-MS m/z=298(M+H)$^+$

Synthesis of Intermediate 31(11

Intermediate 31(1) (yield of 55%) was synthesized in the same manner as in synthesizing Intermediate 10(1) of Synthesis Example 5, except that Intermediate 31(2) was used instead of Intermediate 10(2). The obtained compound was identified by LC-MS.

LC-MS m/z=294(M+H)$^+$

Synthesis of Compound D31

Intermediate D31 (yield of 54%) was synthesized in the same manner as in synthesizing Compound D10 of Synthesis Example 5, except that Intermediate 31(1) was used instead of Intermediate 10(1). The obtained product was identified by LCMS and $^1$H NMR.

LC-MS m/z=780(M+H)$^+$ $^1$H NMR (500 MHz, CDCl$_3$) δ=9.15 (s, 1H), 7.86-7.46 (m, 4H), 6.77 (s, 1H), 3.12-3.10 (m, 1H), 1.34 (s, 9H), 1.29 (s, 6H).

Example 1

An anode was prepared by cutting a glass substrate with ITO/Ag/ITO having a thickness of 70 Å/1000 Å/70 Å deposited thereon to a size of 50 mm×50 mm×0.7 mm, ultrasonically cleaning the glass substrate by using isopropyl alcohol and pure water for 5 minutes each, and then irradiating UV light for 30 minutes thereto and exposing to ozone to clean. Then, the anode was loaded into a vacuum deposition apparatus.

2-TNATA was deposited on the anode to form a hole injection layer having a thickness of 600 Å, and then, 4,4'-bis[N-(1-naphthyl)-N-a phenylamino group]biphenyl group (NPB) was deposited thereon to form a hole transport layer having a thickness of 1000 Å.

Compound H9 (host) and Compound D10 (dopant) were co-deposited on the hole transport layer at a weight ratio of 91:9 to form an emission layer having a thickness of 250 Å, and then, BCP was deposited on the emission layer to form a hole blocking layer having a thickness of 50 Å. Then, $Alq_3$ was deposited on the hole blocking layer to form an electron transport layer having a thickness of 350 Å, and then, LiF was deposited on the electron transport layer to form an electron injection layer having a thickness of 10 Å, and MgAg was deposited on the electron injection layer at a weight ratio of 90:10 to form a cathode having a thickness of 120 Å to manufacture a organic light-emitting device (emission of green light).

Example 2

An organic light-emitting device was manufactured in the same manner as in Example 1, except that in forming an emission layer, as a dopant, Compound D26 was used instead of Compound D10.

Example 3

An organic light-emitting device was manufactured in the same manner as in Example 1, except that in forming an emission layer, as a host, Compound H12 was used instead of Compound H9.

Example 4

An organic light-emitting device was manufactured in the same manner as in Example 1, except that in forming an emission layer, as a host, Compound H12 was used instead of Compound H9, and as a dopant, Compound D20 was used instead of Compound D10.

Example 5

An organic light-emitting device (emission of red light) was manufactured in the same manner as in Example 1, except that the thickness of the hole transport layer was 1350 Å, and in forming the emission layer, Compound H8 (host) and Compound D30 (dopant) were co-deposited at a weight ratio of 94:6 to form an emission layer having a thickness of 400 Å.

Example 6

An organic light-emitting device was manufactured in the same manner as in Example 5, except that in forming an emission layer, as a host, Compound H10 was used instead of Compound H8, and as a dopant, Compound D31 was used instead of Compound D30.

Comparative Example 1

An organic light-emitting device was manufactured in the same manner as in Example 1, except that in forming an emission layer, as a host, Compound CBP was used instead of Compound H9, and as a dopant, $Ir(ppy)_3$ was used instead of Compound D10.

Comparative Example 2

An organic light-emitting device was manufactured in the same manner as in Example 5, except that in forming an emission layer, as a host, Compound CBP was used instead of Compound H8, and as a dopant, Compound PtOEP was used instead of Compound D30.

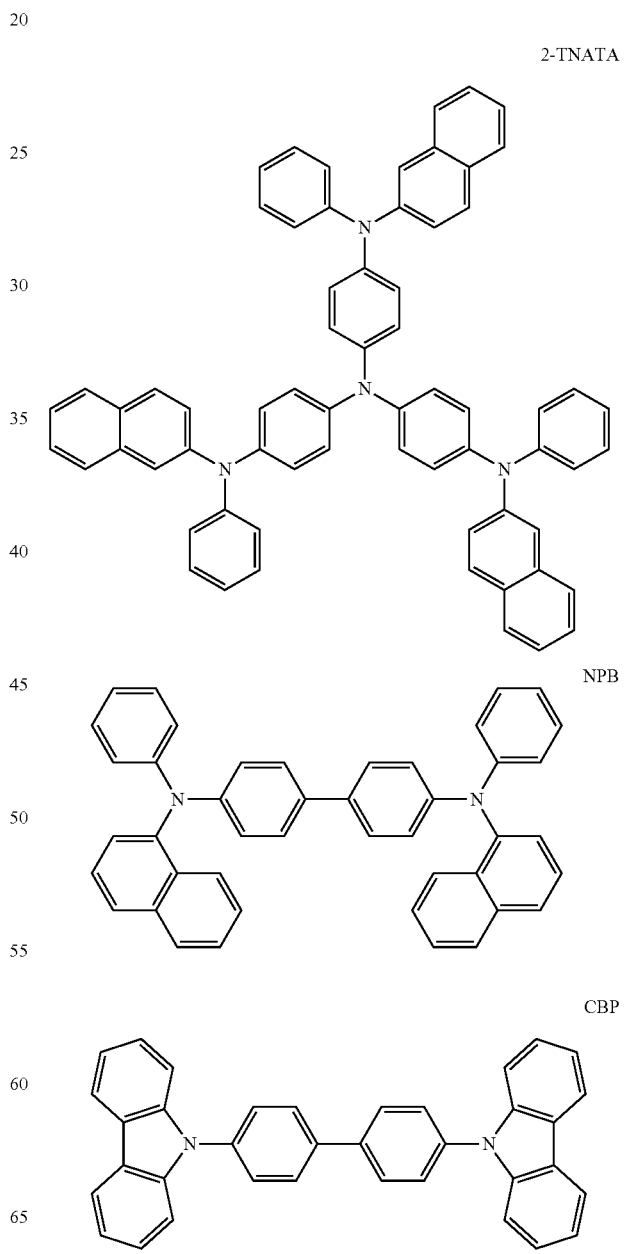

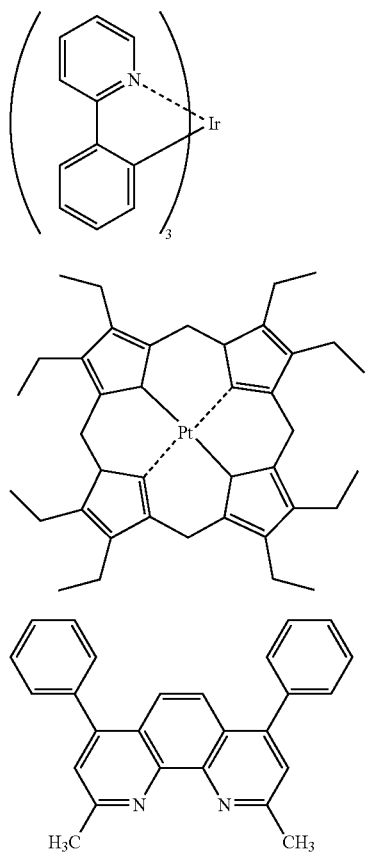

Evaluation Example 1

Driving voltage, current density, brightness, efficiency, and color purity of the organic light-emitting devices of Examples 1 to 6 and Comparative Examples 1 and 2 were evaluated by using PR650Spectroscan Source Measurement Unit. (a product of PhotoResearch Company). $LT_{97}$ is a lifespan data when brightness is reduced from 100% (initial brightness) to 97% at the current density of 10 mA/cm². Results thereof are shown in Table 1 below.

Based on the results in Table 1, it was confirmed that the organic light-emitting devices of Examples 1 to 4 had lower driving voltage, higher brightness, higher efficiency, and better lifespan characteristics than the organic light-emitting device of Comparative Example 1, and the organic light-emitting devices of Example 5 and 6 had lower driving voltage, higher brightness, higher efficiency, and better lifespan characteristics than the organic light-emitting device of Comparative Examples 2.

An organic light-emitting device according to an embodiment of the present invention may have a low driving voltage, high efficiency, high color purity, and long lifespan.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and equivalents thereof.

What is claimed is:
1. An organic light-emitting device comprising:
a substrate;
a first electrode;
a second electrode; and
an organic layer between the first electrode and the second electrode, the organic layer comprising an emission layer comprising a dopant and a host, wherein the dopant comprises a first compound represented by Formula 1(1), and the host comprises a second compound represented by Formulae 100A-1(1), 100B-1(1), 100B-5(1),or 100B-8(1):

TABLE 1

| | Host | Dopant | Driving voltage (V) | Current Density (mA/cm2) | Brightness (cd/m2) | Efficiency (cd/A) | Emission color | Color coordinate | LT97 (HR) |
|---|---|---|---|---|---|---|---|---|---|
| Example 1 | H9 | D10 | 5.6 | 10 | 6,245 | 62.4 | Green | 0.27, 0.69 | 91 |
| Example 2 | H9 | D26 | 5.5 | 10 | 6,521 | 65.2 | Green | 0.26, 0.72 | 98 |
| Example 3 | H12 | D10 | 5.3 | 10 | 6,810 | 68.1 | Green | 0.26, 0.69 | 93 |
| Example 4 | H12 | D20 | 5.3 | 10 | 6,620 | 66.2 | Green | 0.25, 0.72 | 91 |
| Example 5 | H8 | D30 | 5.9 | 10 | 3,042 | 30.4 | Red | 0.64, 0.32 | 107 |
| Example 6 | H10 | D31 | 5.8 | 10 | 3,351 | 33.5 | Red | 0.65, 0.33 | 102 |
| Comparative Example 1 | CBP | Ir(ppy)3 | 6.8 | 10 | 4,766 | 47.7 | Green | 0.27, 0.70 | 61 |
| Comparative Example 2 | CBP | PtOEP | 7.3 | 10 | 2,212 | 22.1 | Red | 0.67, 0.32 | 89 |

Formula 1(1)

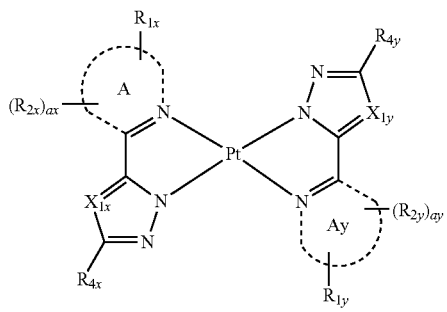

Formula 100A-1(1)

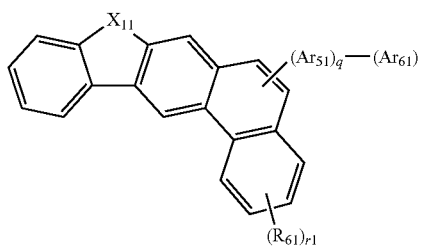

Formula 100B-1(1)

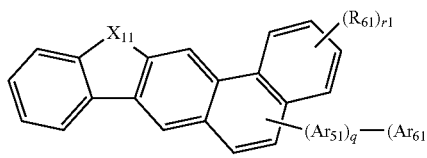

Formula 100B-5(1)

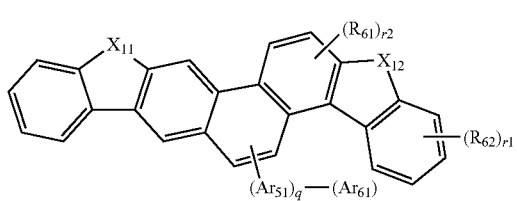

Formula 100B-8(1)

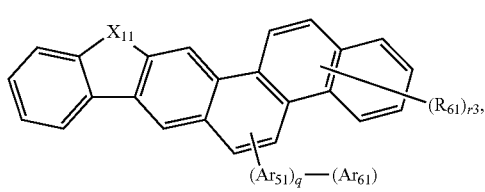

wherein in Formula 1(1), ring Ax and ring Ay are each independently a 6-membered ring including at least one N, a 6-membered ring to which at least one 5-membered ring is condensed and which includes at least one N, or a 6-membered ring to which at least one 6-membered ring is condensed and which includes at least one N;

$R_{1x}$ and $R_{1y}$ are each independently selected from a substituted or unsubstituted linear or branched $C_2$-$C_{60}$ alkyl group;

$X_{1x}$ is N or $C(R_{3x})$, and $X_{1y}$ is N or $C(R_{3y})$, $R_{2x}$ to $R_{4x}$ and $R_{2y}$ to $R_{4y}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic hetero-condensed polycyclic group, —Si($Q_3$)($Q_4$)($Q_5$), or —C(=O)($Q_6$), wherein $Q_3$ to $Q_6$ are each independently selected from a hydrogen, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group or a substituted or unsubstituted monovalent non-aromatic hetero-condensed polycyclic group, wherein $R_{3x}$ and $R_{4x}$ optionally bond to each other to form a substituted or unsubstituted $C_3$-$C_{60}$ cyclic moiety, or a substituted or unsubstituted $C_2$-$C_{60}$ heterocyclic moiety, and $R_{3y}$ and $R_{4y}$ optionally bond to each other to form a substituted or unsubstituted $C_3$-$C_{60}$ cyclic moiety, or a substituted or unsubstituted $C_2$-$C_{60}$ heterocyclic moiety; and ax and ay are each independently an integer of 0 to 10, wherein when ax and ay are each independently 2 or more, a plurality of $R_{2x}$ and a plurality of $R_{2y}$, respectively, are identical or different; and wherein in Formulae 100A-1(1), 100B-1(1), 100B-5(1), and 100B-8(1), $X_{11}$ is O or S;

$X_{12}$ is O, S, C($R_{71}$)($R_{72}$), or N($R_{73}$);

$Ar_{51}$ is selected from a substituted or unsubstituted $C_3$-$C_{10}$ cycloalkylene group, a substituted or unsubstituted $C_3$-$C_{10}$ heterocycloalkylene group, a substituted or unsubstituted $C_3$-$C_{10}$ cycloalkenylene group, a substituted or unsubstituted $C_3$-$C_{10}$ heterocycloalkenylene group, a substituted or unsubstituted $C_6$-$C_{60}$ arylene group, a substituted or unsubstituted $C_2$-$C_{60}$ heteroarylene group, a substituted or unsubstituted divalent non-aromatic condensed polycyclic group, or a substituted or unsubstituted divalent non-aromatic hetero-condensed polycyclic group;

$Ar_{61}$ is selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic hetero-condensed polycyclic group, $Si(Q_{43})(Q_{44})(Q_{45})$, or —$B(Q_{46})(Q_{47})$;

q is an integer from 0 to 5;

$R_{61}$, $R_{62}$, and $R_{71}$ to $R_{73}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof or a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

13 $Si(Q_{53})(Q_{54})(Q_{55})$, wherein $Q_{53}$ to $Q_{55}$ are each independently selected from a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group;

r1 is an integer of 1 to 4, r2 is 1 or 2, and r3 is an integer of 1 to 6; and at least one substituent of the substituted $C_3$-$C_{10}$ cycloalkylene group, the substituted $C_3$-$C_{10}$ heterocycloalkylene group, the substituted $C_3$-$C_{10}$ cycloalkenylene group, the substituted $C_3$-$C_{10}$ heterocycloalkenylene group, the substituted $C_6$-$C_{60}$ arylene group, the substituted $C_2$-$C_{60}$ heteroarylene group, the substituted divalent non-aromatic aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_3$-$C_{10}$ heterocycloalkyl group, the substituted $C_3$-$C_{10}$ cycloalkenyl group, the substituted $C_3$-$C_{10}$ heterocycloalkenyl group, the substituted $C_6$-$C_{60}$ aryl group, the substituted $C_6$-$C_{60}$ aryloxy, the substituted $C_6$-$C_{60}$ arylthio group, the substituted $C_2$-$C_{60}$ heteroaryl group, the substituted monovalent non-aromatic condensed polycyclic group, the substituted monovalent non-aromatic hetero-condensed polycyclic group, the substituted $C_3$-$C_{60}$ cyclic moiety, or the substituted $C_2$-$C_{60}$ heterocyclic moiety is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy, a $C_6$-$C_{60}$ arylthio, a $C_2$-$C_{60}$ heteroaryl group, a monovalent non-aromatic condensed polycyclic group, a monovalent non-aromatic hetero-condensed polycyclic group, $Si(Q_{13})(Q_{14})(Q_{15})$, or —$B(Q_{16})(Q_{17})$;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, $Si(Q_{23})(Q_{24})(Q_{25})$, or —$B(Q_{26})(Q_{27})$;

—$Si(Q_{33})(Q_{34})(Q_{35})$, or —$B(Q_{36})(Q_{37})$; wherein $Q_{13}$ to $Q_{17}$, $Q_{23}$ to $Q_{27}$, $Q_{33}$ to $Q_{37}$, and $Q_{43}$ to $Q_{47}$ are each independently selected from a hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent non-aromatic condensed polycyclic group, or a monovalent non-aromatic hetero-condensed polycyclic group.

2. The organic light-emitting device of claim 1, wherein $R_{1x}$, and $R_{1y}$ in Formula 1(1) are each independently selected from an ethyl group, an n-propyl group, an i-propyl group, an n-butyl group, an i-butyl group, a t-butyl group, a pentyl group, a hexyl group, a heptyl group, an octyl group, a nonyl group, a decyl group; or an ethyl group, an n-propyl group, an i-propyl group, an n-butyl group, an i-butyl group, a t-butyl group, a pentyl group, a hexyl group, a heptyl group, an octyl group, a nonyl group, or a decyl group, each substituted with at least one selected from a deuterium, —F, a hydroxyl group, a cyano group, a nitro group, or an amino group.

3. The organic light-emitting device of claim 1, wherein the first compound is represented by one of Formulae 1A to 1R:

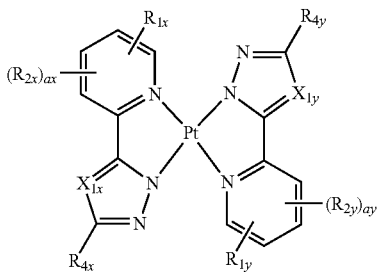

Formula 1A

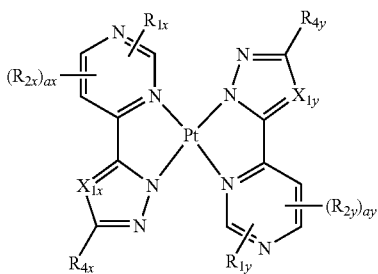

Formula 1B

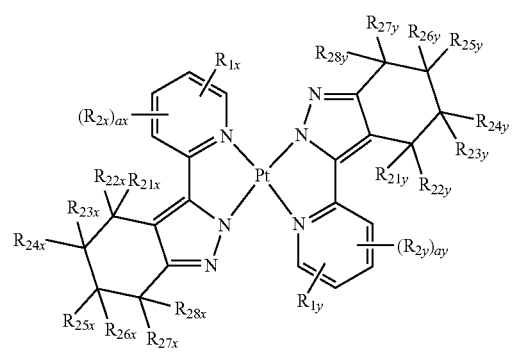

Formula 1C

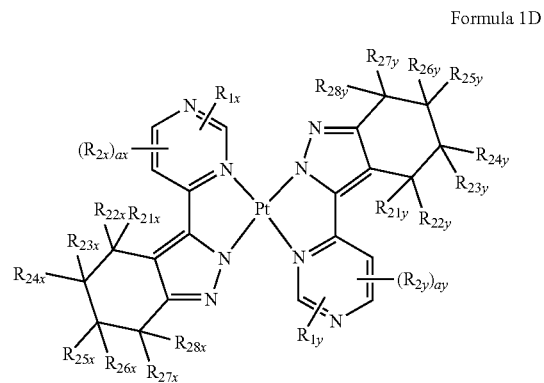

Formula 1D

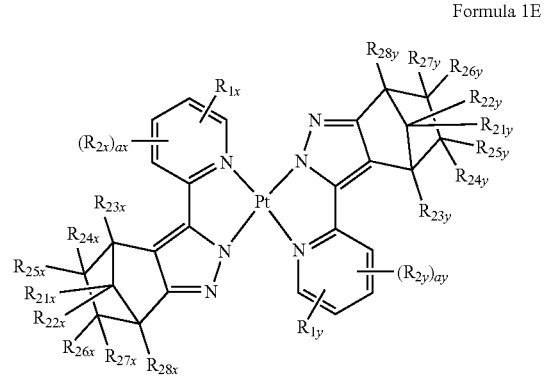

Formula 1E

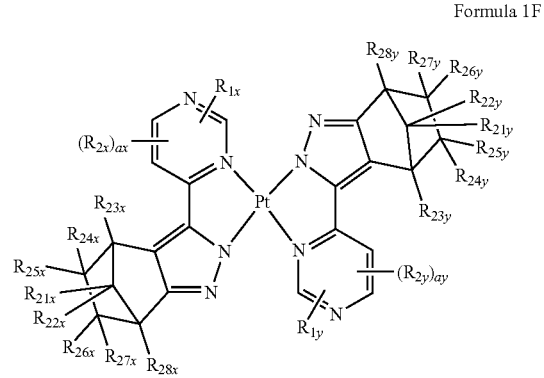

Formula 1F

Formula 1G
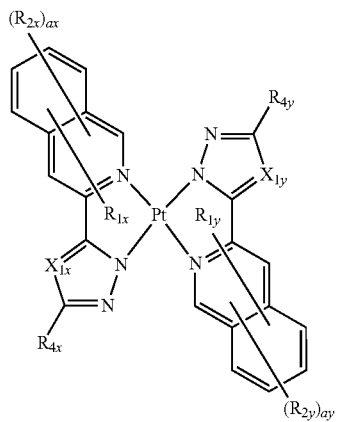
Formula 1H
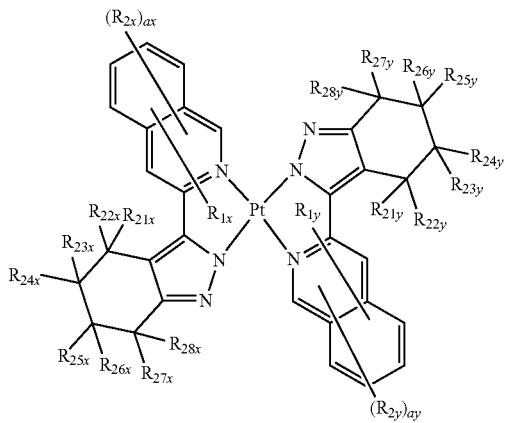
1I
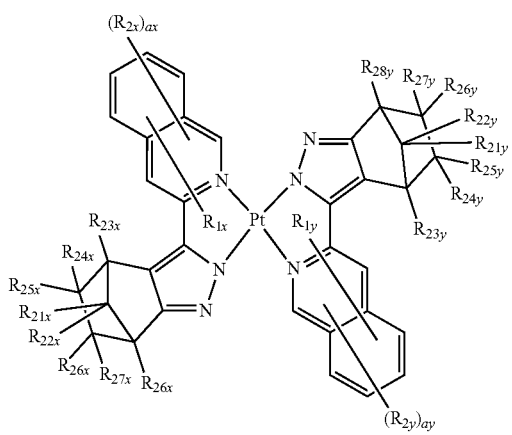
Formula 1J
Formula 1K
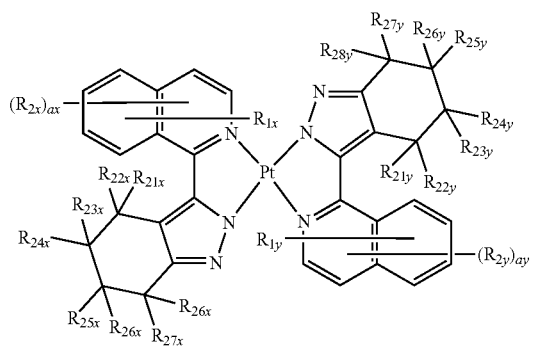
Formula 1L
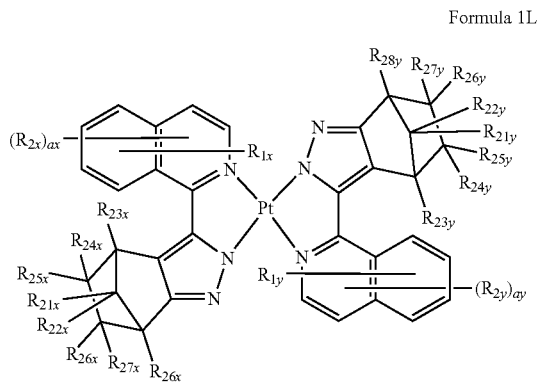
Formula 1M
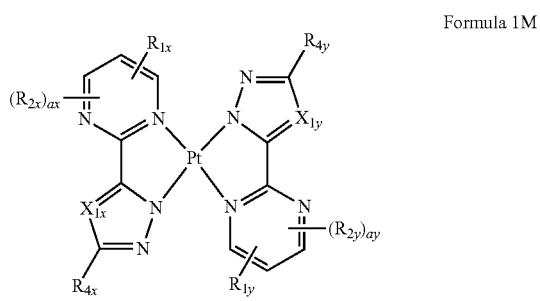
Formula 1N
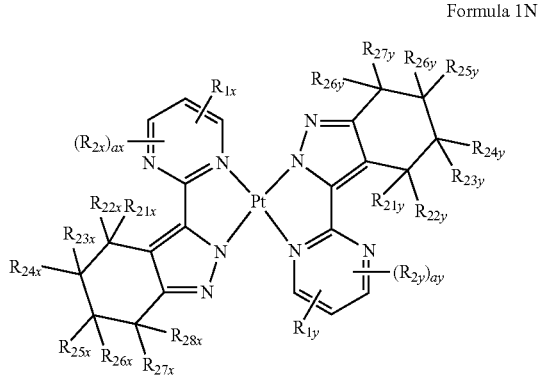

-continued

Formula 1O

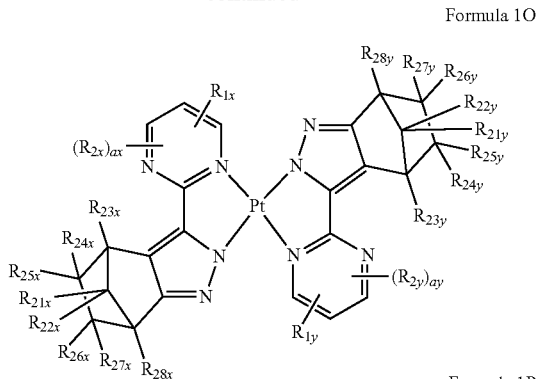

Formula 1P

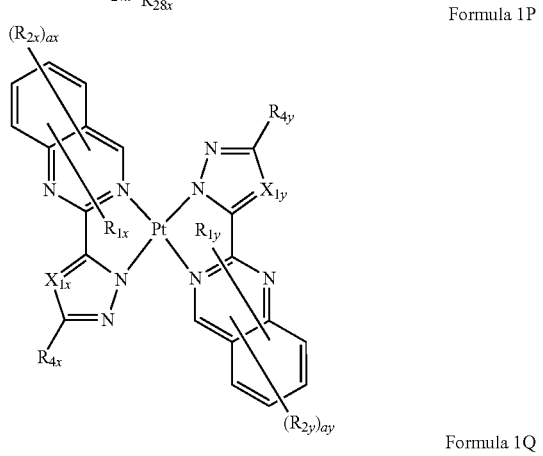

Formula 1Q

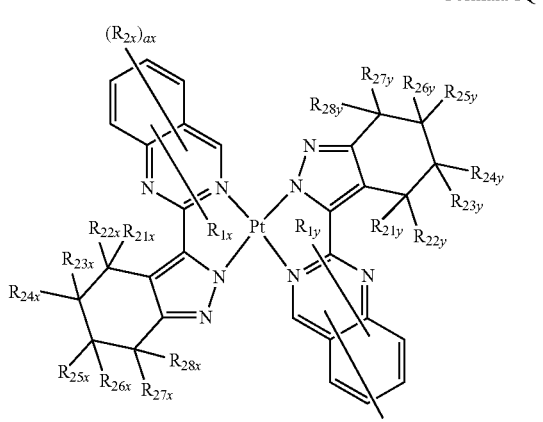

Formula 1R

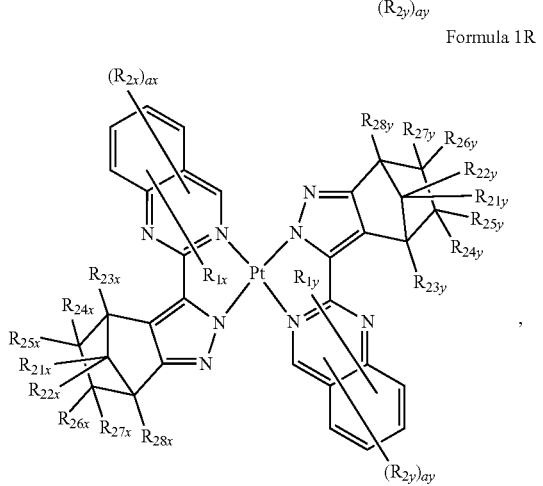

in Formulae 1A to 1R, $X_{1x}$ is N or $C(R_{3x})$, and $X_{1y}$ is N or $C(R_{3y})$;

$R_{1x}$ and $R_{1y}$ are each independently selected from an ethyl group, an n-propyl group, an i-propyl group, an n-butyl group, an i-butyl group, a t-butyl group, a pentyl group, a hexyl group, a heptyl group, an octyl group, a nonyl group, a decyl group; or an ethyl group, an n-propyl group, an i-propyl group, an n-butyl group, an i-butyl group, a t-butyl group, a pentyl group, a hexyl group, a heptyl group, an octyl group, a nonyl group, or a decyl group, each substituted with at least one selected from a deuterium, —F, a hydroxyl group, a cyano group, a nitro group, or an amino group;

$R_{2x}$ to $R_{4x}$, $R_{21x}$ to $R_{28x}$, $R_{2y}$ to $R_{4y}$, and $R_{21y}$ to $R_{28y}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an i-propyl group, an n-butyl group, an i-butyl group, a t-butyl group, a pentyl group, a hexyl group, a heptyl group, octyl, a nonyl group, a decyl group, a methoxy group, an ethoxy group, a propoxy group, a butoxy group, a pentoxy group; or a methyl group, an ethyl group, an n-propyl group, an i-propyl group, an n-butyl group, an i-butyl group, a t-butyl group, a pentyl group, a hexyl group, a heptyl group, octyl, a nonyl group, a decyl group, a methoxy group, an ethoxy group, a propoxy group, a butoxy group, or a pentoxy group, each substituted with at least one selected from a deuterium, —F, a hydroxyl group, a cyano group, a nitro group or an amino group;

ax and ay are each independently an integer of 1 to 3.

4. The organic light-emitting device of claim 1, wherein the first compound is a homoleptic compound.

5. The organic light-emitting device of claim 1, wherein the first compound is one of Compounds D1 to D34:

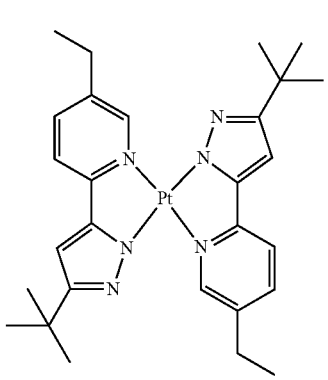

D1

115
-continued
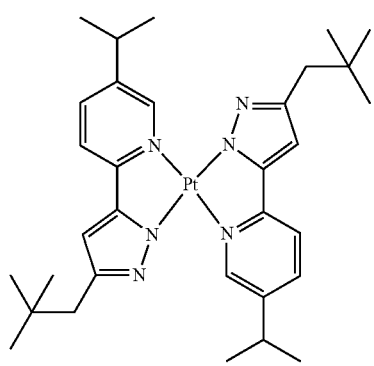
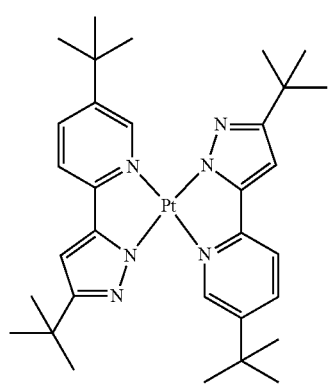
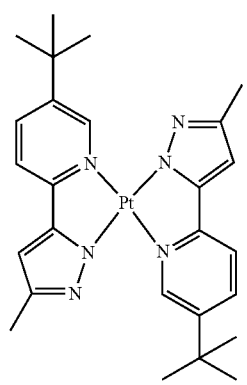
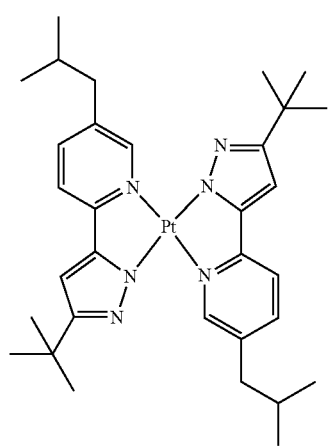
116
-continued
D2
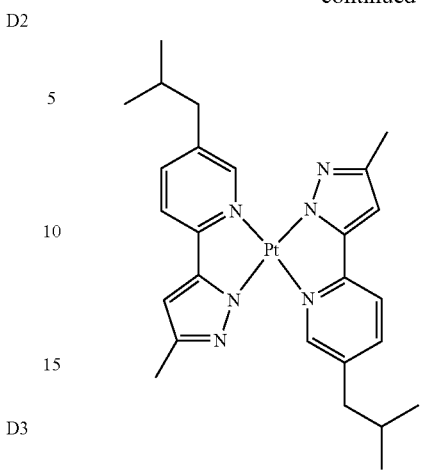
D3
D4
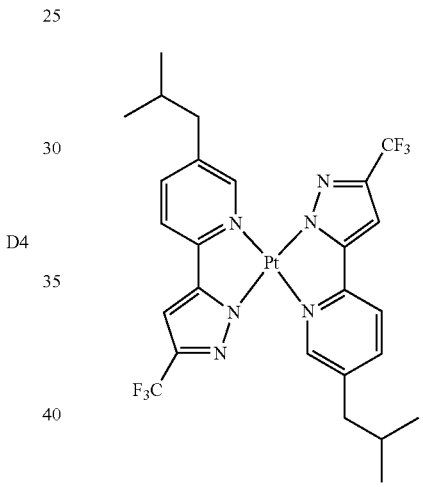
D5
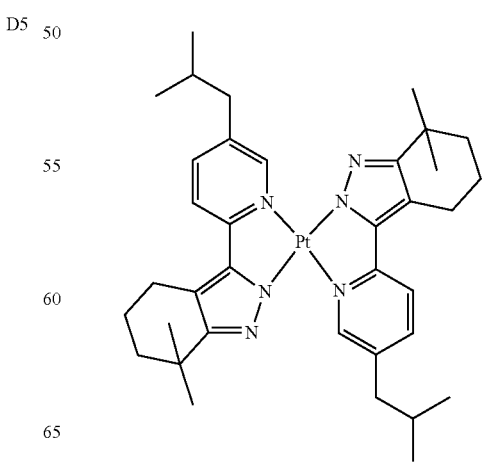
D6
D7
D8

-continued
D9
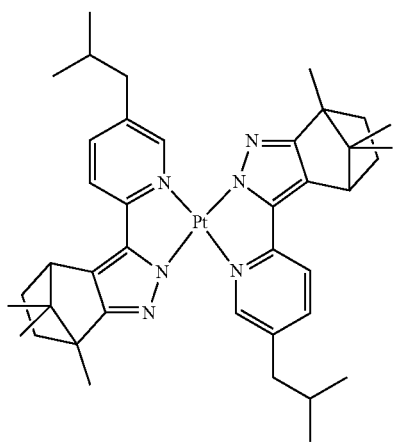
D10
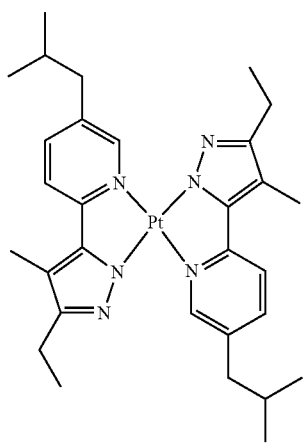
D11
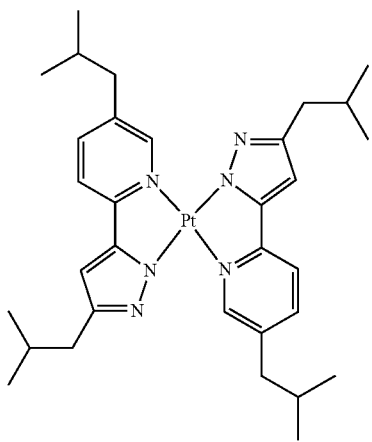
D12
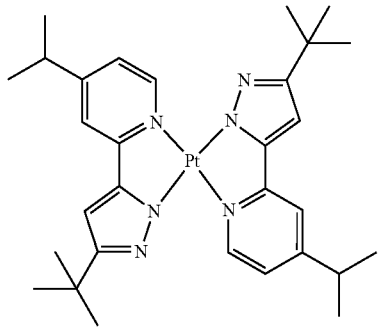
-continued
D13
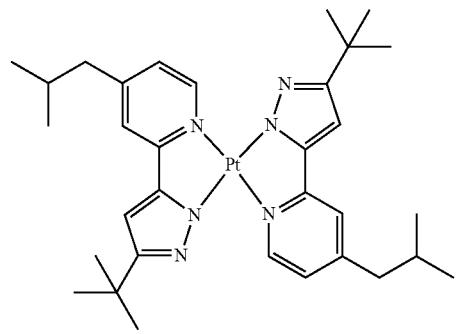
D14
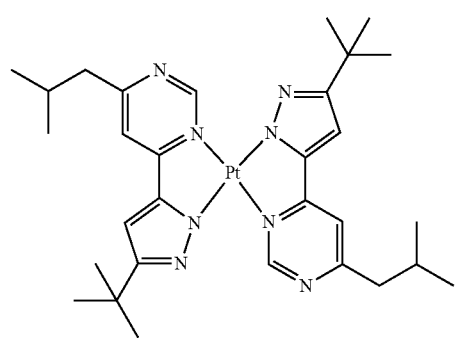
D15
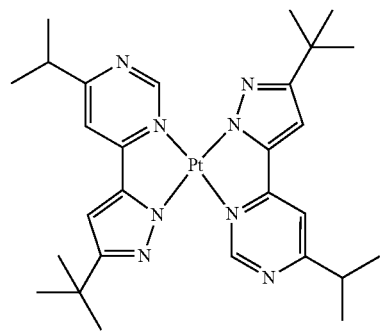
D16
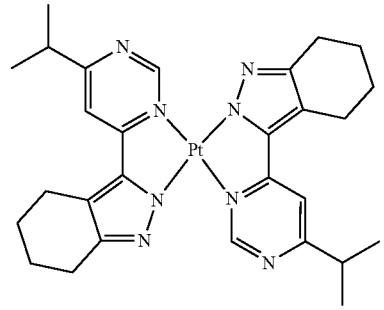
D17
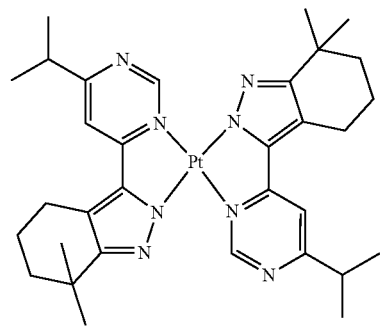

-continued
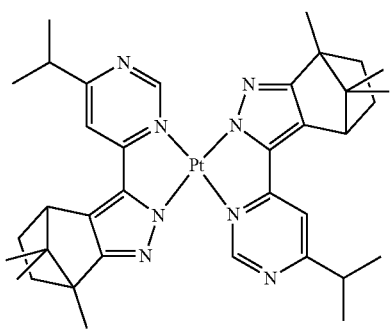
D18
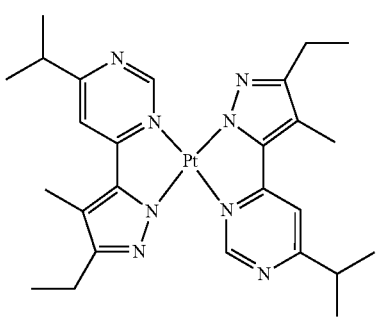
D19
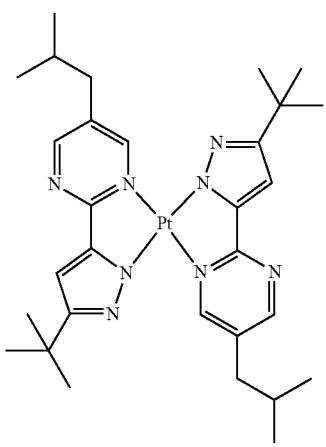
D20
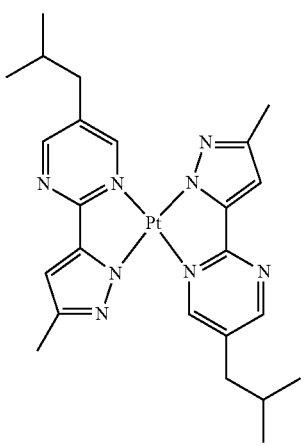
D21
-continued
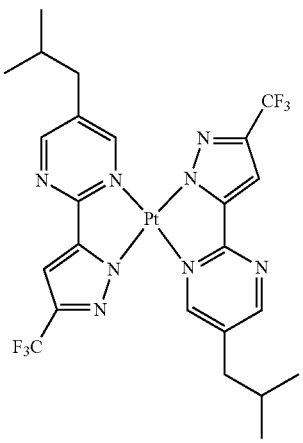
D22
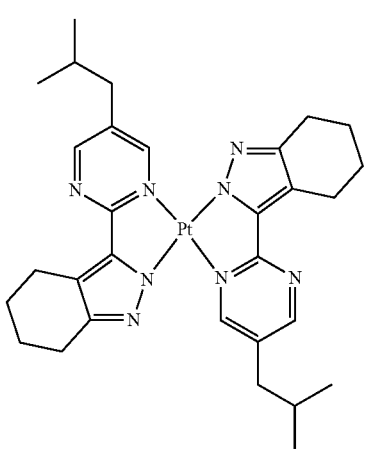
D23
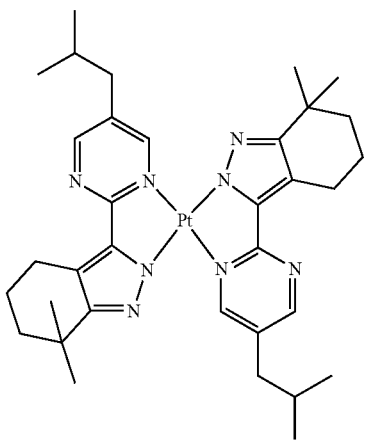
D24

D25
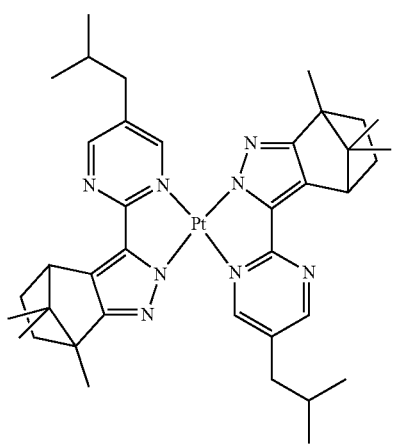
D26
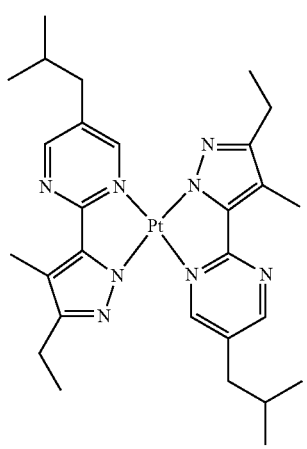
D27
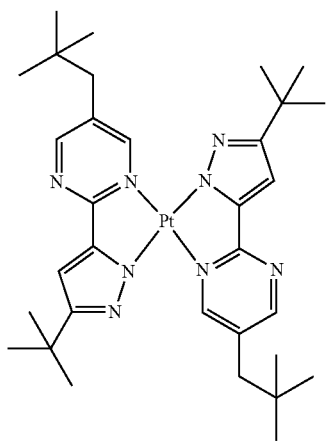
D28
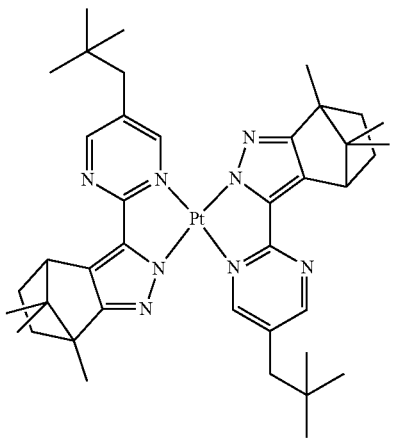
D29
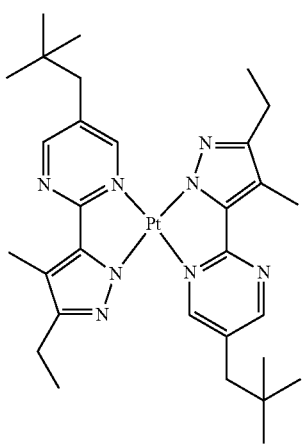
D30
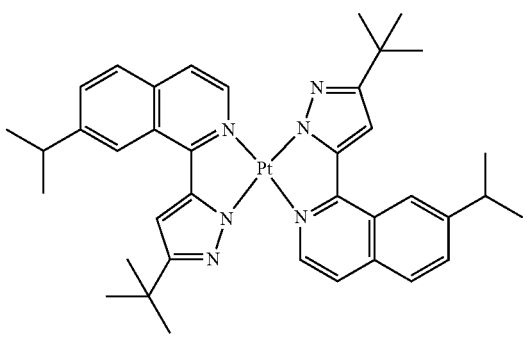

-continued

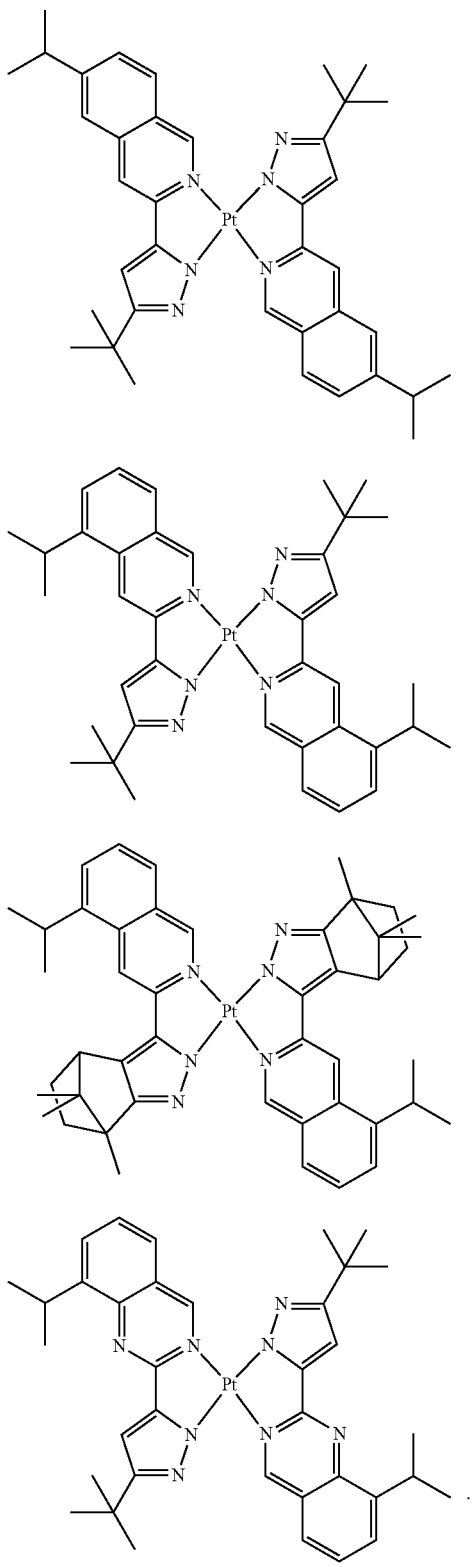

D31

D32

D33

D34

6. The organic light-emitting device of claim 1, wherein Ar$_{51}$ of —(Ar$_{51}$)$_q$—(Ar$_{61}$) is selected from a phenylene group, a naphthylene group, a fluorenylene group, a pyridinylene group, a pyrazinylene group, a pyrimidinylene group, a pyridazinylene group, quinolinylene group, a carbazolylene group, a triazinylene group, a dibenzofuranylene group, a dibenzothiophenylene group; or a phenylene group, a naphthylene group, a fluorenylene group, a pyridinylene group, a pyrazinylene group, a pyrimidinylene group, a pyridazinylene group, quinolinylene group, a carbazolylene group, a triazinylene group, a dibenzofuranylene group, or a dibenzothiophenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a C$_1$-C$_{20}$ alkyl group, a C$_1$-C$_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

7. The organic light-emitting device of claim 1, wherein Ar$_{51}$ of —(Ar$_{51}$)$_q$—(Ar$_{61}$) is represented by one of Formulae 102-1 to 102-5:

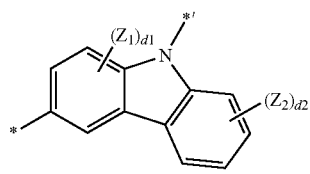

Formula 102-1

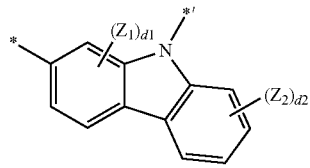

Formula 102-2

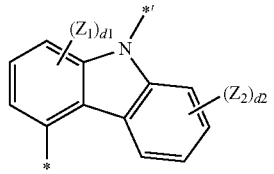

Formula 102-3

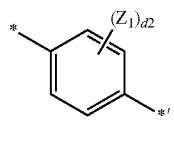

Formula 102-4

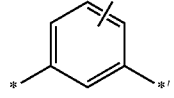

Formula 102-5 wherein in Formulae 102-1 to 102-5,

Z$_1$ and Z$_2$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a C$_1$-C$_{20}$ alkyl group, a C$_1$-C$_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

d1 is an integer of 0 to 3, and d2 is an integer of 0 to 4; and * and *' each independently is a binding site.

8. The organic light-emitting device of claim 1, wherein q of —$(Ar_{51})_q$—$(Ar_{61})$ is 0, 1, or 2.

9. The organic light-emitting device of claim 1, wherein $Ar_{61}$ of —$(Ar_{51})_q$—$(Ar_{61})$ is represented by one of Formulae 103-1 to 103-15:

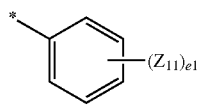

Formula 103-1

Formula 103-2

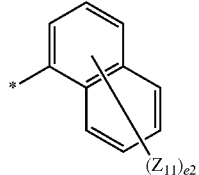

Formula 103-3

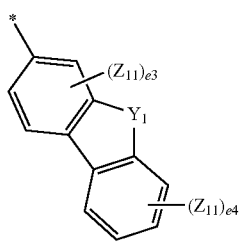

Formula 103-4

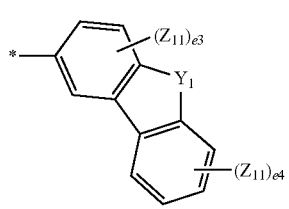

Formula 103-5

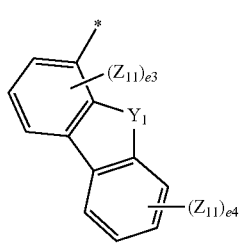

Formula 103-6

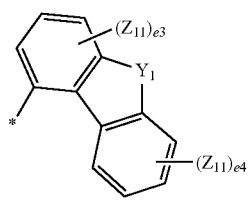

Formula 103-7

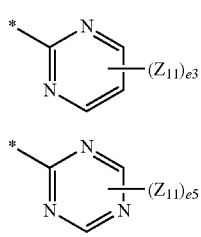

Formula 103-8

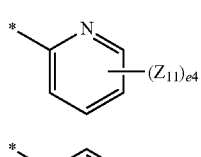

Formula 103-9

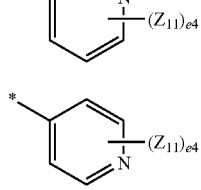

Formula 103-10

Formula 103-11

Formula 103-12

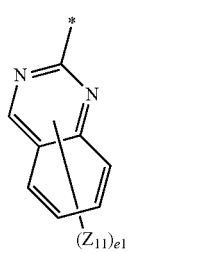

Formula 103-13

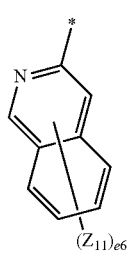

Formula 103-14

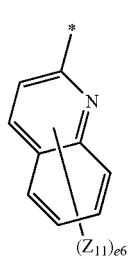

Formula 103-15 wherein in Formulae 103-1 to 103-15,
$Y_1$ is O, S, $C(Z_{21})(Z_{22})$, or $N(Z_{23})$;
$Z_{11}$, and $Z_{21}$ to $Z_{23}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

e1 is an integer of 1 to 5;

e2 is an integer of 1 to 7;

e3 is an integer of 1 to 3;

e4 is an integer of 1 to 4;

e5 is 1 or 2; and e6 is an integer of 1 to 6;

and * is a binding site.

10. The organic light-emitting device of claim 1, wherein —(Ar$_{51}$)$_q$—(Ar$_{61}$) is represented by one of Formulae 104-1 to 104-11:

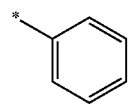

Formula 104-1

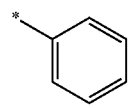

Formula 104-2

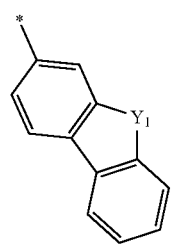

Formula 104-3

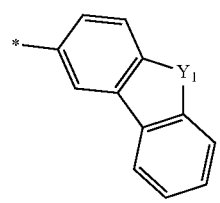

Formula 104-4

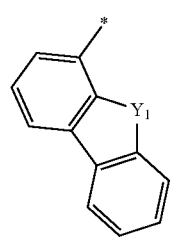

Formula 104-5

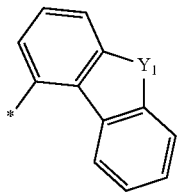

Formula 104-6

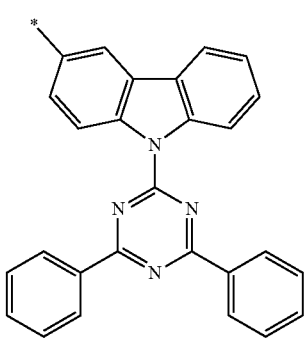

Formula 104-7

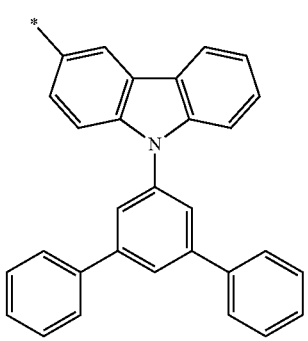

Formula 104-8

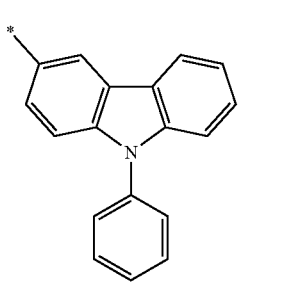

Formula 104-9

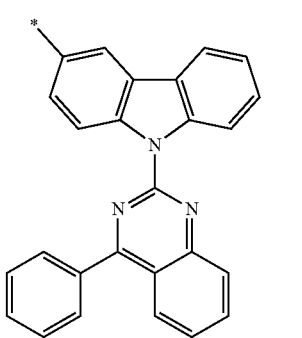

Formula 104-10

Formula 104-11

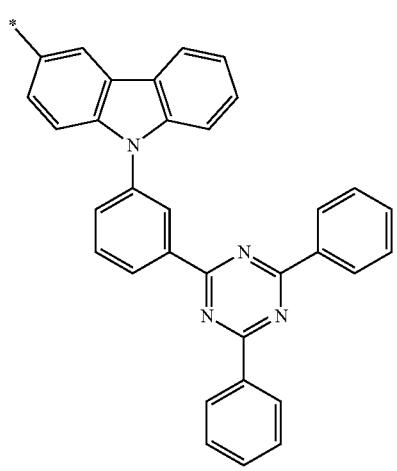

Formula 102-1

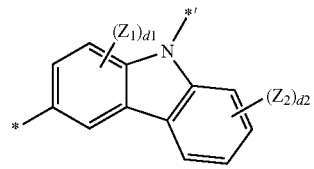

Formula 102-2

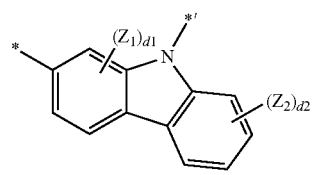

Formula 102-3

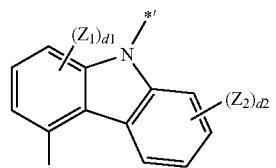

Formula 102-4

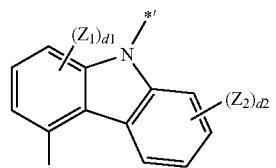

Formula 102-5

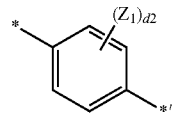

$Y_1$ in Formulae 104-3 to 104-6 is O or S;

and * in Formulae 104-1 to 104-11 is a binding site.

11. The organic light-emitting device of claim 1, wherein in Formulae 100A-1(1), 100B-1(1), 100B-5(1), and 100B-8(1), $Ar_{51}$ is selected from a naphthylene group, a fluorenylene group, a pyridinylene group, a pyrazinylene group, a pyrimidinylene group, a pyridazinylene group, quinolinylene group, a triazinylene group, a dibenzofuranylene group, a dibenzothiophenylene group;

a naphthylene group, a fluorenylene group, a pyridinylene group, a pyrazinylene group, a pyrimidinylene group, a pyridazinylene group, quinolinylene group, a triazinylene group, a dibenzofuranylene group, or a dibenzothiophenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, an isoquinolinyl group, and a compound represented by one of Formulae 102-1 to 102-5;

q is 0, 1, or 2;

$R_{61}$ and $R_{62}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_1$-$C_{60}$ alkoxy group, a phenyl group, a naphthyl group, or an anthracenyl group;

$Z_1$ and $Z_2$ in Formulae 102-1 to 102-5 are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

d1 is an integer of 0 to 3, and d2 is an integer of 0 to 4;

and * is a binding site to the core of any of Formulae 100A-1(1), 100B-1(1), 100B-5(1), and 100B-8(1) or the other $Ar_{51}$ adjacent to the core of any of Formulae 100A-1(1), 100B-1(1), 100B-5(1), and 100B-8(1), and *' is a binding site to the other $Ar_{51}$ spaced from the core of any of Formulae 100A-1(1), 100B-1(1), 100B-5(1), and 100B-8(1) or to $Ar_{61}$.

12. The organic light-emitting device of claim 1, wherein the second compound is one of Compounds H1 to H15:
H1
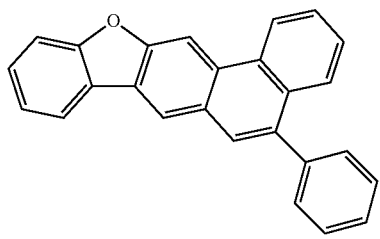
H2
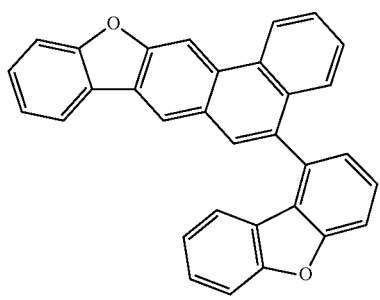
H3
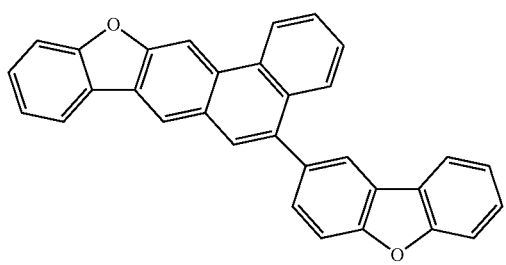
H4
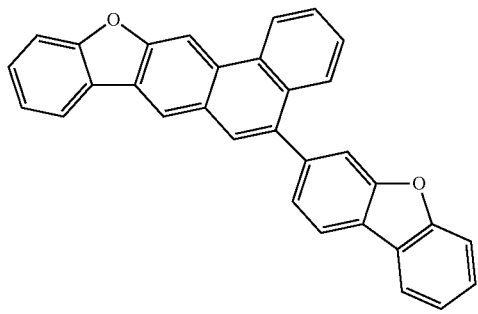
-continued
H5
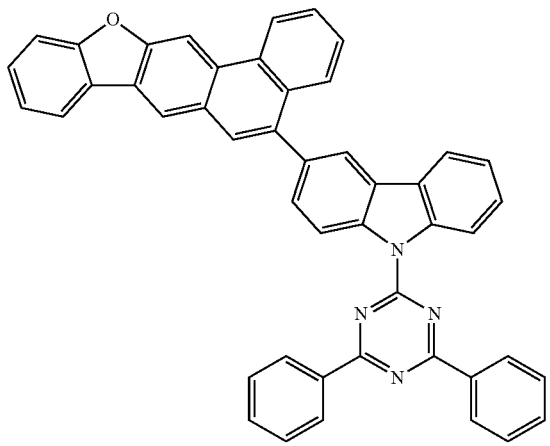
H6
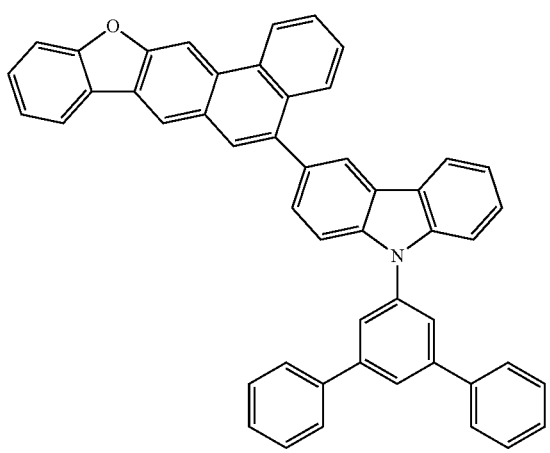
H7
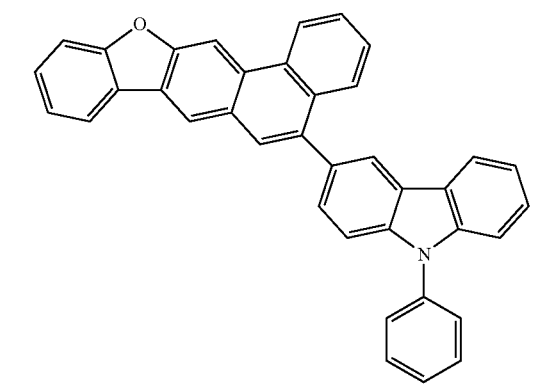

133
-continued
H8
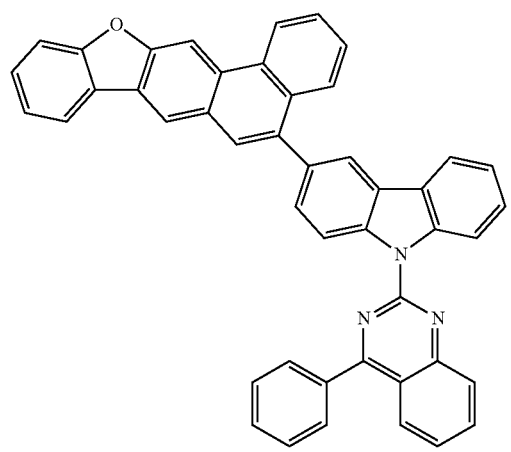
H9
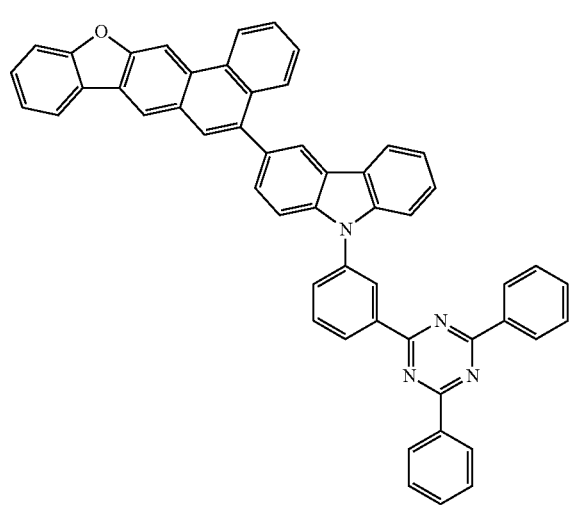
H10
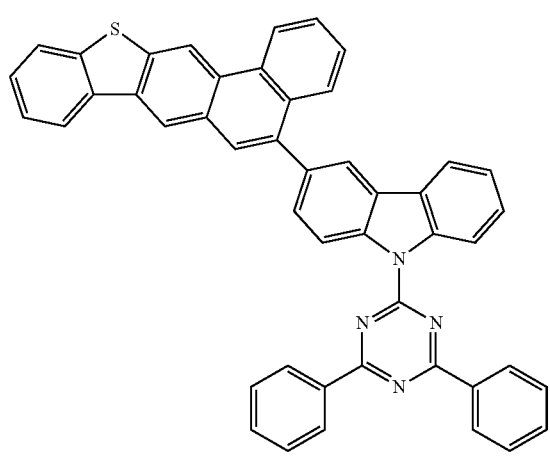
134
-continued
H11
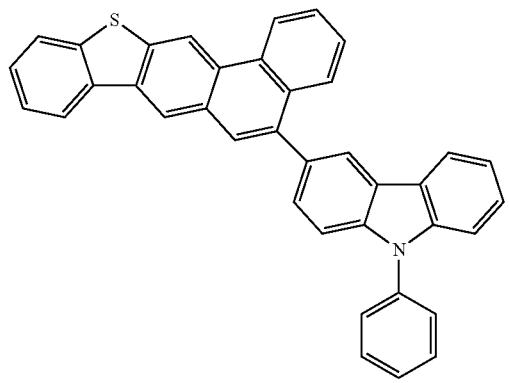
H12
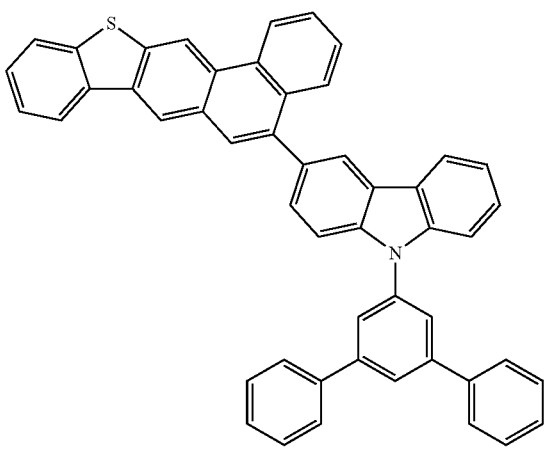
H13
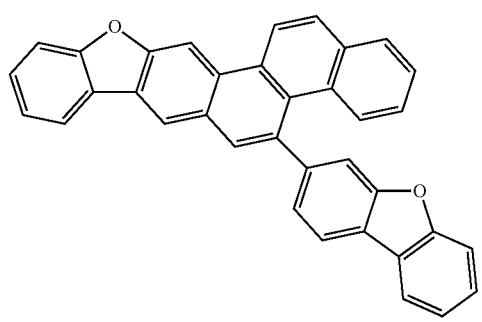
H14
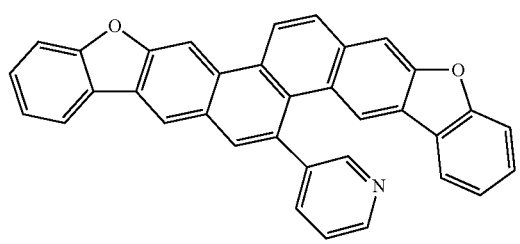

H15
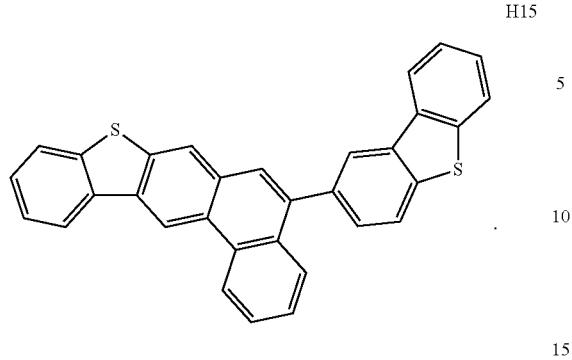
13. The organic light-emitting device of claim 1, wherein the dopant of the emission layer comprises the first compound selected from Compounds D1 to D34, and the host of the emission layer comprises the second compound selected from Compounds H1 to H15:
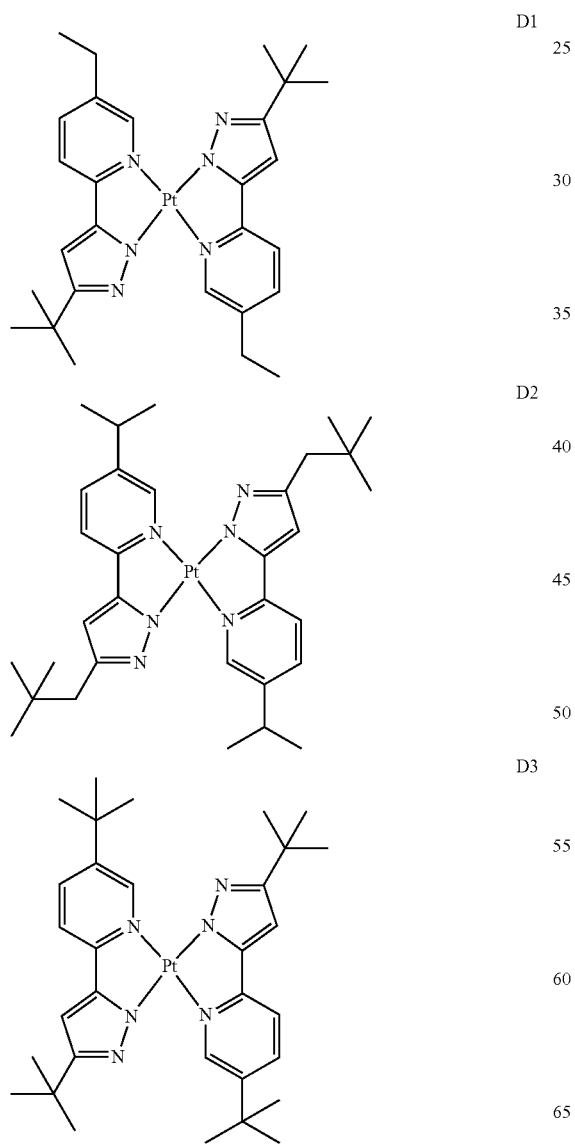
D1
D2
D3
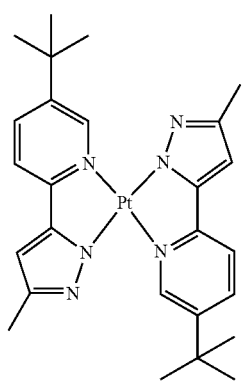
D4
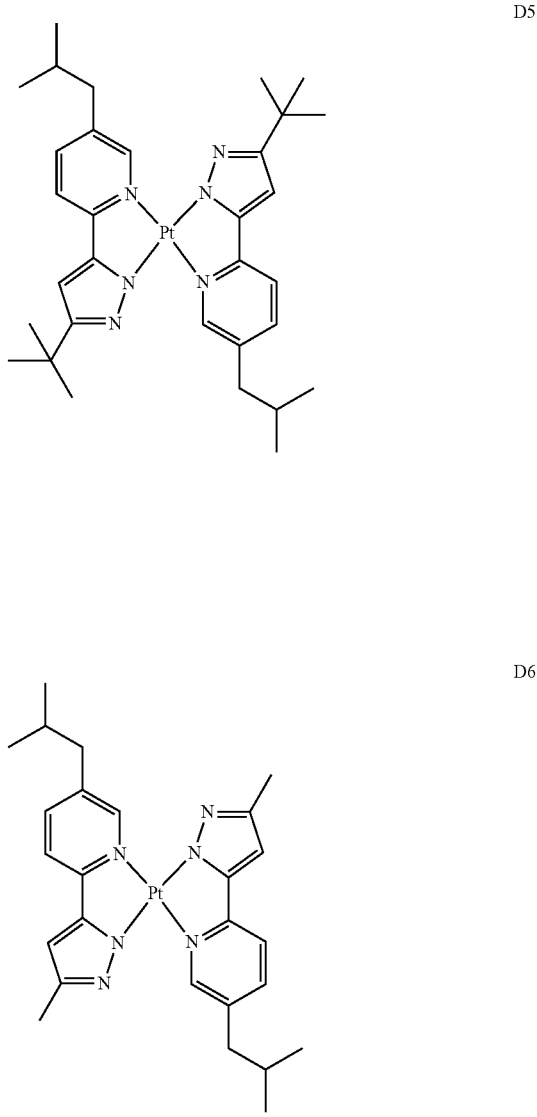
D5
D6

-continued
D7
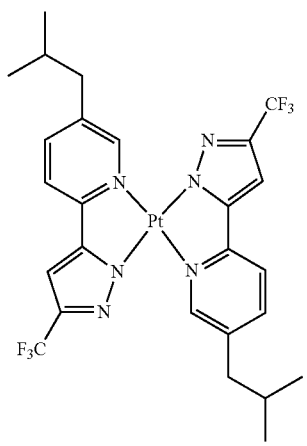
D8
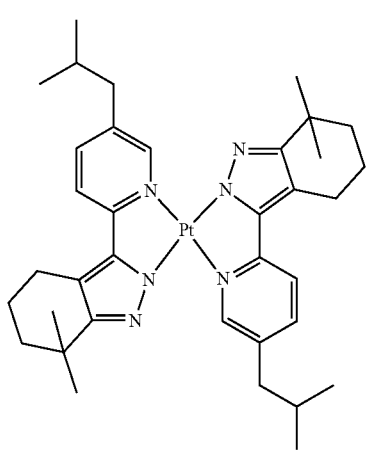
D9
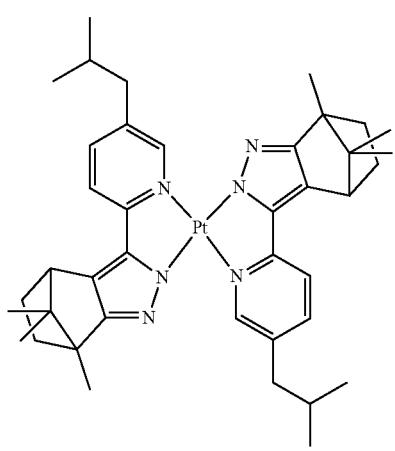
-continued
D10
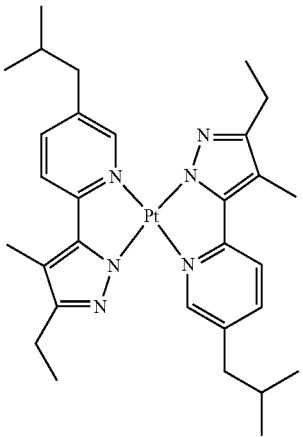
D11
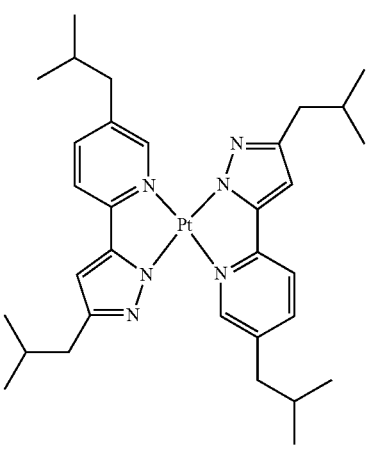
D12
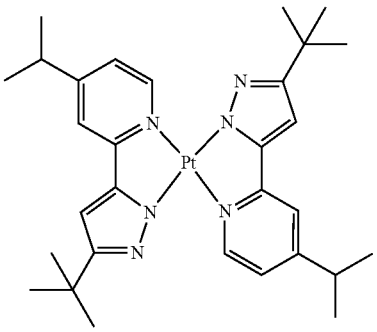
D13
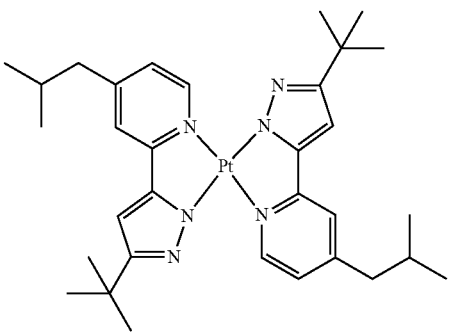

D14
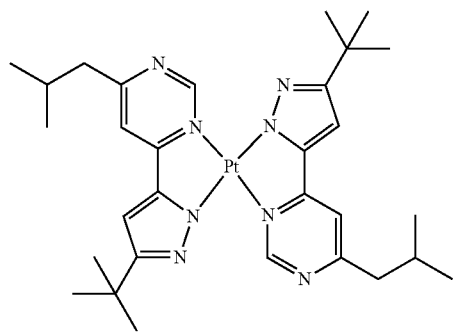
D15
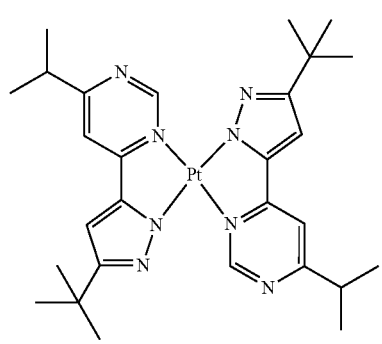
D16
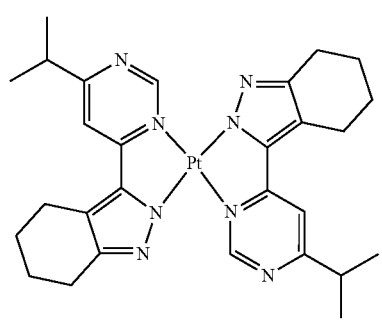
D17
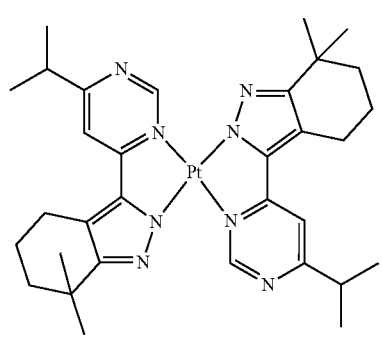
D18
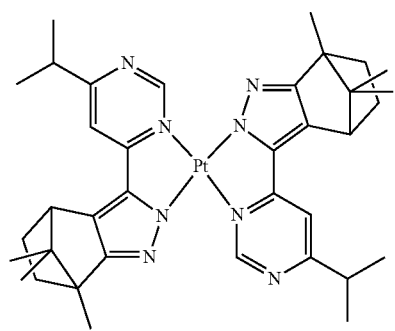
D19
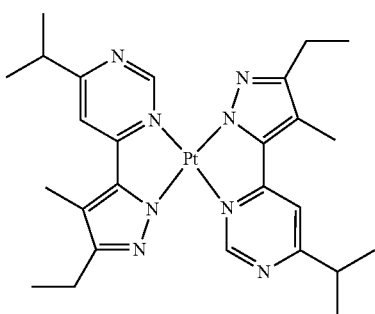
D20
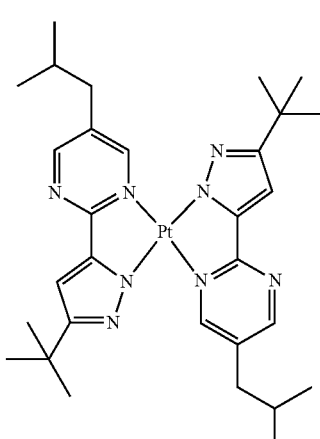
D21
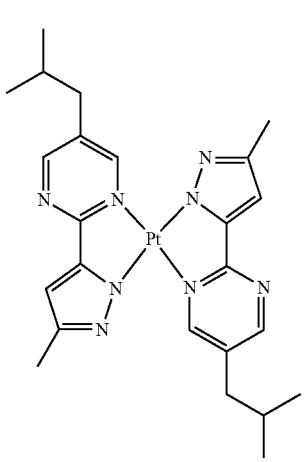
D22
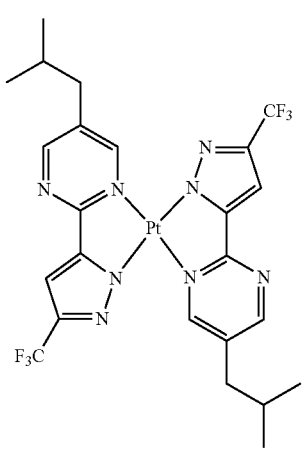

D23
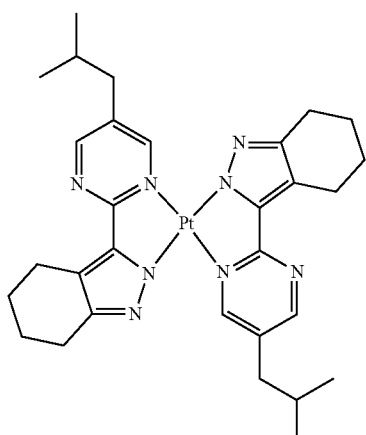
D26
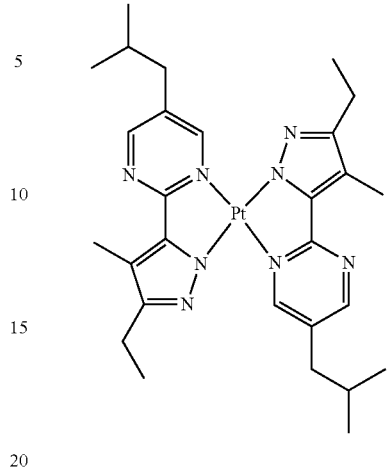
D24
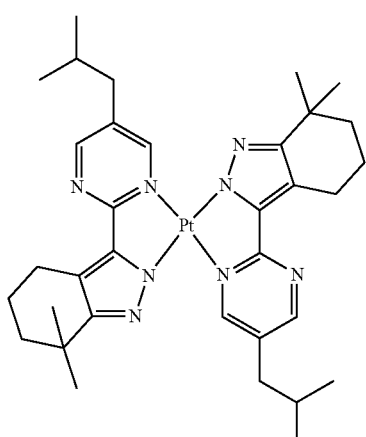
D27
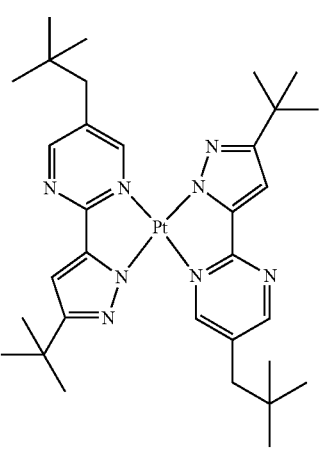
D25
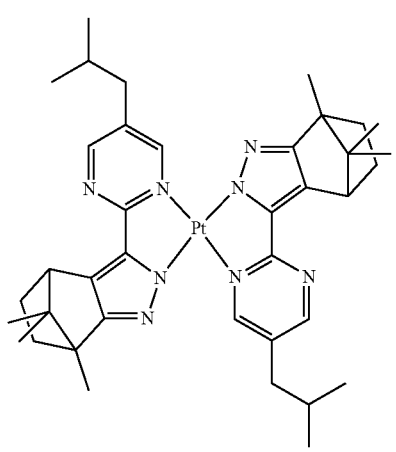
D28
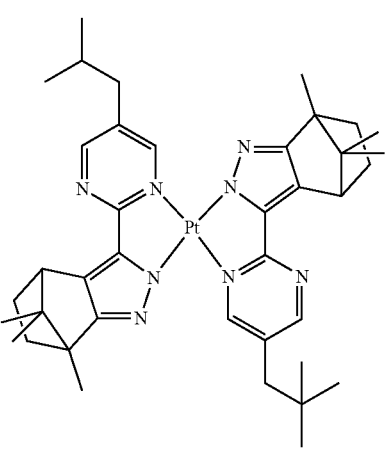

D29 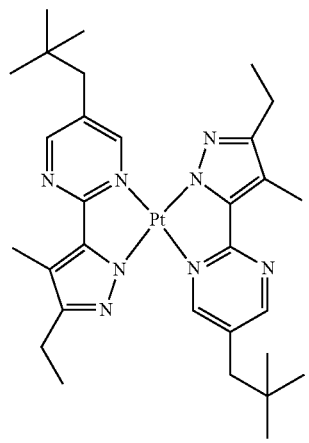
D30 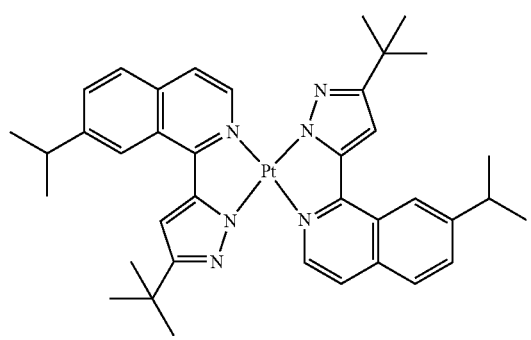
D31 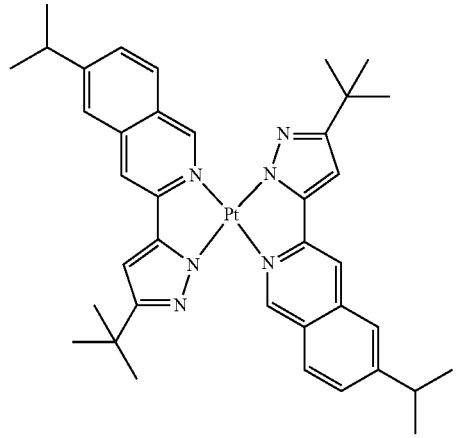
D32 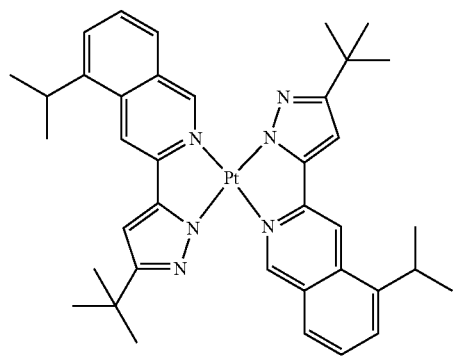
D33 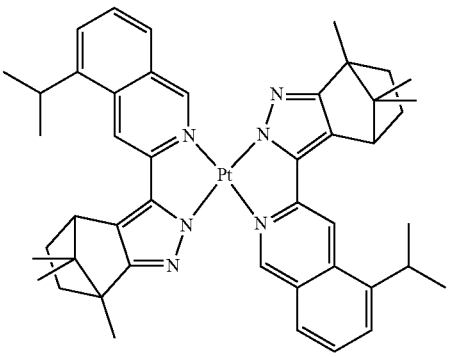
D34 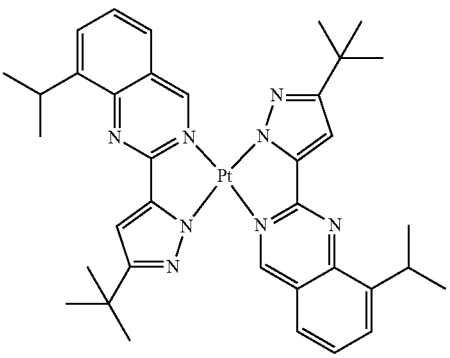
H1 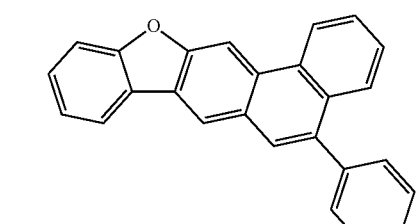
H2 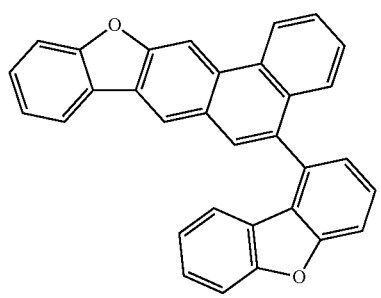
H3 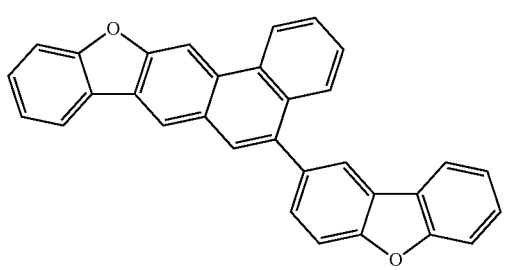

145
-continued
146
-continued
H4
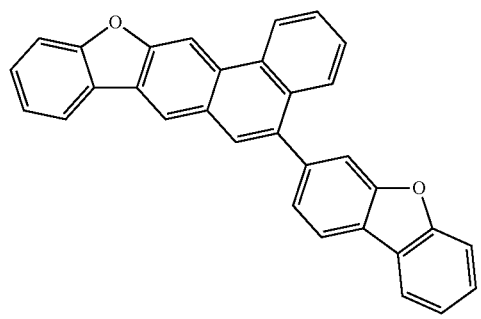
H7
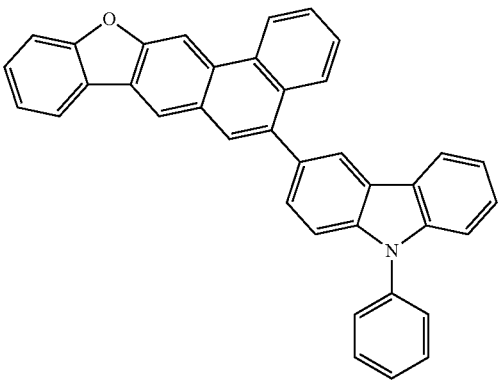
H5
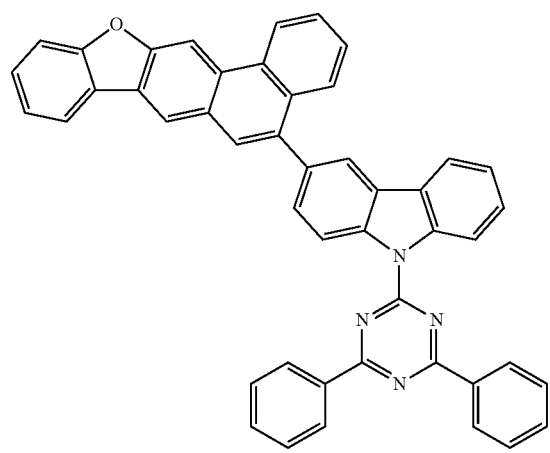
H8
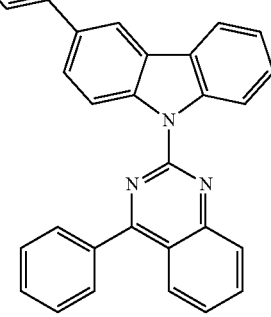
H6
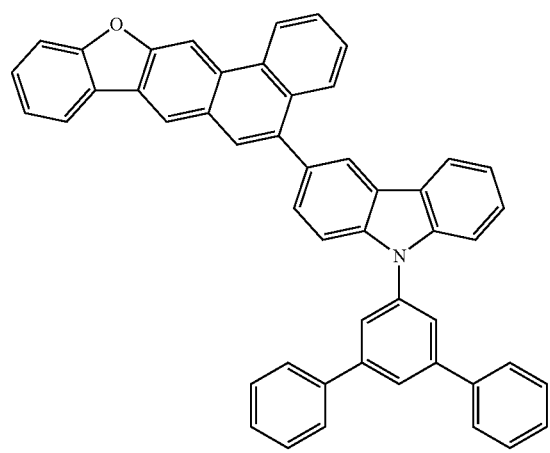
H9
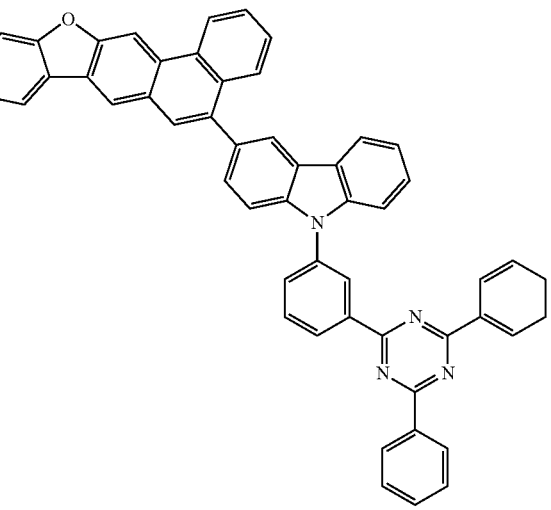

H10
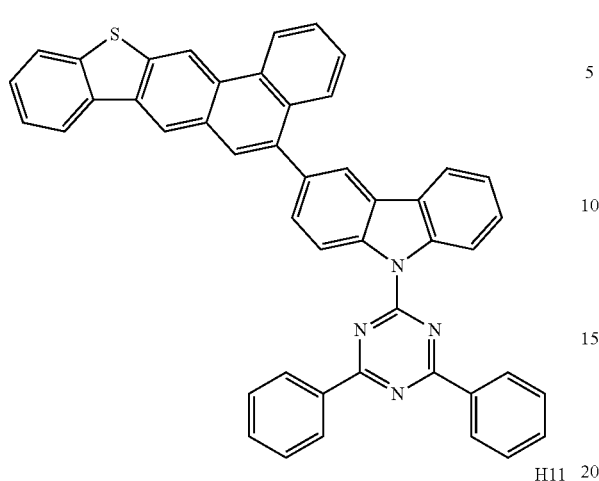
H11
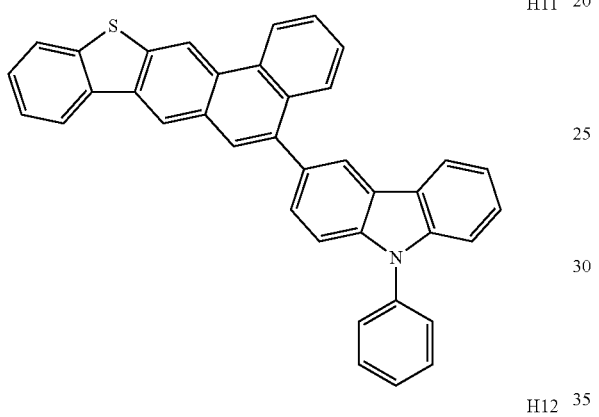
H12
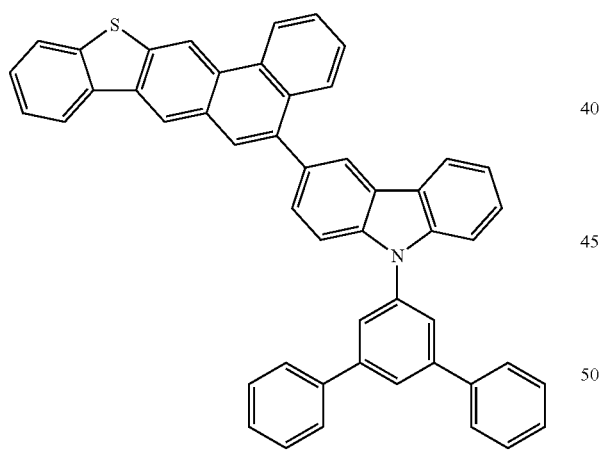
H13
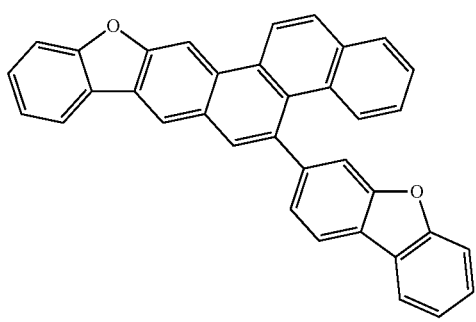
H14
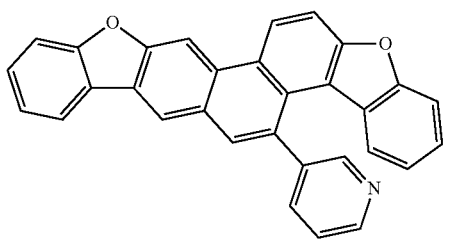
H15
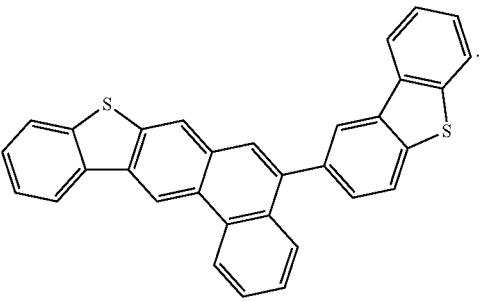
* * * * *